US010784066B2

(12) United States Patent
Koul et al.

(10) Patent No.: US 10,784,066 B2
(45) Date of Patent: Sep. 22, 2020

(54) MICROELECTROMECHANICAL SWITCH WITH METAMATERIAL CONTACTS

(71) Applicant: Synergy Microwave Corporation, Paterson, NJ (US)

(72) Inventors: Shiban K. Koul, New Delhi (IN); Ajay Kumar Poddar, Elmwood Park, NJ (US); Ulrich L. Rohde, Upper Saddle River, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 224 days.

(21) Appl. No.: 15/916,506

(22) Filed: Mar. 9, 2018

(65) Prior Publication Data

US 2018/0261415 A1 Sep. 13, 2018

Related U.S. Application Data

(60) Provisional application No. 62/469,752, filed on Mar. 10, 2017.

(51) Int. Cl.
*H01P 1/12* (2006.01)
*B81B 3/00* (2006.01)
(Continued)

(52) U.S. Cl.
CPC ......... *H01H 59/0009* (2013.01); *H01P 1/127* (2013.01); *H01P 1/2005* (2013.01);
(Continued)

(58) Field of Classification Search
CPC ..................................... H01P 1/12; B81B 3/00
(Continued)

(56) References Cited

U.S. PATENT DOCUMENTS 3,454,906 A 7/1969 Hyltin et al.
3,872,409 A 3/1975 Hatkin
(Continued)

FOREIGN PATENT DOCUMENTS

CN 101090169 A 12/2007
CN 105742124 A 7/2016
(Continued)

OTHER PUBLICATIONS

Chen et al., Distributed MEMS Impedance Matching Network Using a SW-DGS Technique, 2012, IEEE, 4 pages.*
(Continued)

*Primary Examiner* — Dean O Takaoka
(74) *Attorney, Agent, or Firm* — Lerner, David, Littenberg, Krumholz & Mentlik, LLP

(57) ABSTRACT

A microelectromechanical switch having improved isolation and insertion loss characteristics and reduced liability for stiction. The switch includes a signal line having an input port and an output port between first and second ground planes. The switch also includes a beam for controlling activation of the switch. In some embodiments, the switch further includes one or more defected ground structures formed in the first and second ground planes, and a corresponding secondary deflectable beam positioned over each defected ground structure. In some embodiments, the switch includes a metamaterial structure for generating a repulsive Casimir force.

32 Claims, 60 Drawing Sheets

1100

(51) Int. Cl.
*H01H 59/00* (2006.01)
*H01P 1/20* (2006.01)
*H01H 1/00* (2006.01)

(52) U.S. Cl.
CPC ... *H01H 1/0036* (2013.01); *H01H 2001/0052* (2013.01); *H01H 2001/0084* (2013.01); *H01H 2001/0089* (2013.01); *H01H 2059/0027* (2013.01); *H01H 2205/004* (2013.01); *H01H 2239/004* (2013.01); *H01H 2239/018* (2013.01)

(58) Field of Classification Search
USPC .......................................... 333/101, 105, 262
See application file for complete search history.

(56) References Cited

U.S. PATENT DOCUMENTS

| | | | |
|---|---|---|---|
| 4,672,257 A | 6/1987 | Oota et al. | |
| 4,806,888 A | 2/1989 | Salvage et al. | |
| 4,931,753 A | 6/1990 | Nelson et al. | |
| 4,977,382 A | 12/1990 | Podell et al. | |
| 5,093,636 A | 3/1992 | Higgins, Jr. et al. | |
| 5,168,250 A | 12/1992 | Bingham | |
| 5,355,103 A | 10/1994 | Kozak | |
| 5,463,355 A | 10/1995 | Halloran | |
| 5,619,061 A | 4/1997 | Goldsmith et al. | |
| 5,880,921 A * | 3/1999 | Tham ................. | H01H 59/0009 333/262 |
| 6,046,659 A | 4/2000 | Loo et al. | |
| 6,069,540 A | 5/2000 | Berenz et al. | |
| 6,133,807 A | 10/2000 | Akiyama et al. | |
| 6,153,839 A | 11/2000 | Zavracky et al. | |
| 6,281,838 B1 | 8/2001 | Hong | |
| 6,307,452 B1 | 10/2001 | Sun | |
| 6,356,166 B1 | 3/2002 | Goldsmith et al. | |
| 6,509,812 B2 | 1/2003 | Sayyah | |
| 6,531,935 B1 | 3/2003 | Russat et al. | |
| 6,542,051 B1 | 4/2003 | Nakada | |
| 6,621,390 B2 | 9/2003 | Song et al. | |
| 6,657,324 B1 | 12/2003 | Marumoto | |
| 6,740,946 B2 * | 5/2004 | Funaki ................. | B81B 3/0021 200/181 |
| 6,741,207 B1 | 5/2004 | Allison et al. | |
| 6,806,789 B2 | 10/2004 | Bawell et al. | |
| 6,812,814 B2 | 11/2004 | Ma et al. | |
| 6,849,924 B2 | 2/2005 | Allison et al. | |
| 6,853,691 B1 | 2/2005 | Kim | |
| 6,949,985 B2 | 9/2005 | Qiu et al. | |
| 6,958,665 B2 | 10/2005 | Allison et al. | |
| 7,053,736 B2 | 5/2006 | Nelson | |
| 7,068,220 B2 | 6/2006 | DeNatale et al. | |
| 7,157,993 B2 | 1/2007 | DeNatale et al. | |
| 7,259,641 B1 | 8/2007 | Weller et al. | |
| 7,570,133 B1 | 8/2009 | Taft et al. | |
| 7,835,157 B2 | 11/2010 | Tilmans et al. | |
| 7,944,296 B1 | 5/2011 | Lee et al. | |
| 8,194,386 B2 * | 6/2012 | Steeneken ................ | H01G 5/38 361/272 |
| 8,451,078 B2 | 5/2013 | Lai et al. | |
| 8,581,679 B2 | 11/2013 | Min et al. | |
| 2002/0186108 A1 | 12/2002 | Hallbjorner | |
| 2003/0048149 A1 | 3/2003 | Deligianni et al. | |
| 2003/0102936 A1 | 6/2003 | Schaefer | |
| 2004/0061579 A1 | 4/2004 | Nelson | |
| 2005/0099252 A1 | 5/2005 | Isobe et al. | |
| 2006/0109066 A1 | 5/2006 | Borysenko | |
| 2006/0139211 A1 | 6/2006 | Vance et al. | |
| 2008/0272857 A1 | 11/2008 | Singh | |
| 2009/0074109 A1 | 3/2009 | Foo | |
| 2012/0194296 A1 | 8/2012 | Unlu et al. | |
| 2013/0033296 A1 | 2/2013 | Kishimoto | |
| 2017/0187086 A1 | 6/2017 | Koul et al. | |

FOREIGN PATENT DOCUMENTS

| | | | |
|---|---|---|---|
| EP | 2493014 A2 | 8/2012 | |
| JP | 2009231904 A | 10/2009 | |

OTHER PUBLICATIONS

Schlieter DB, Henderson RM. Silicon integrated defected ground structures. InSilicon Monolithic Integrated Circuits in RF Systems (SiRF), 2010 Topical Meeting on Jan. 11, 2010 (pp. 92-95). IEEE.

Partial Search Report including Written Opinion for European Patent Application No. 18160897.7 dated Jul. 18, 2018.

Mercado et al., "A Mechanical Approach to Overcome RF MEMS Switch Stiction Problem", May 2003, Electronic Components and Technology Conference (pp. 377-384), IEEE; 1999.

European Search Report for Application No. EP18189450 dated Nov. 7, 2018, 4 pages.

Al Qun Liu et al, RF MEMS Switches and Integrated Switching Circuits, Springer Science+Business Media, LLC (Aug. 2010), pp. 115-132.

Ashtiani et al., "Direct Multilevel Carrier Modulation Using Millimeter-Wave Balanced Vector Modulators," IEEE Transactions on Microwave Theory and Techniques, vol. 46, No. 12, Dec. 1998, pp. 2611-2619.

B. Pradhan and B. Gupta, "RF MEMS tunable band reject filter using metamaterials," International Conference on Electronics, Communication and Instrumentation (ICECI), Kolkata, Mar. 2014, pp. 1-4.

B. Pradhan and B. Gupta,"Ka-Band Tunable Filter Using Metamaterials and RF MEMS Varactors"; in Journal of Microelectromechanical Systems, vol. 24, No. 5, pp. 1453-1461, Oct. 2015.

Barker et al., "Distributed MEMS True-Time Delay Phase Shifters and Wide-Band Switches," IEEE Transactions on Microwave Theory and Techniques, vol. 46, No. 11, Nov. 19998, pp. 1881-1890.

Barker et al., "Optimization of Distributed MEMS Transmission-Line Phase Shifters—U-Band and W-Band Designs," IEEE Transaction on Microwave Theory and Techniques, vol. 48, No. 11, Nov. 2000, pp. 1957-1966.

C. Yamarthy and S. McNamara, "Design of a MEMS sensor to detect the Casimir force," 2009 4th IEEE International Conference on Nano/Micro Engineered and Molecular Systems, Shenzhen, Jan. 2009, pp. 645-648.

Chang et al., "A Tunable Broadband Photonic RF Phase Shifter Based on a Silicon Microring Resonator," IEEE Photonics Technology Letters, vol. 21, No. 1, pp. 60-62, Jan. 1, 2009.

Chen, Xudong, et al. "Robust method to retrieve the constitutive effective parameters of metamaterials." Physical Review E 70.1 (Jul. 2004): 016608.).

Cho et al., "Design and fabrication of a single membrane push-pull SPDT RF MEMS switch operated by electromagnetic actuation and electrostatic hold," Journal of Micromechanics and Microengineering, vol. 20, pp. 1-7 (plus 1 page), Mar. 2010.

Choi et al., "A 5-20 GHz 5-Bit True Time Delay Circuit in 0.18 mm CMOS Technology," Journal of Semiconductor Technology and Science, vol. 13, No. 3, pp. 193-197, Jun. 2013.

D. Balaraman, S. K. Bhattacharya, F. Ayazi and J. Papapolymerou, "Low-cost low actuation voltage copper RF MEMS switches," 2002 IEEE MTT-S International Microwave Symposium Digest (Cat. No. 02CH37278), Seattle, WA, USA, Aug. 2002, pp. 1225-1228 vol. 2.

De Los Santos et al., "Microwave and Mechanical Considerations in the Design of MEM Switches for Aerospace Applications," Proc. IEEE Aerospace Conf., vol. 3, pp. 235-254, Feb. 1997.

Devlin et al., "A Versatile Vector Modulator Design for MMIC," IEEE International Microwave Symposium Digest, Dallas, TX, USA, pp. 519-522, May 1990.

Dey Sukomal et al., "Reliability Analysis of Ku-Band 5-bit Phase Shifters Using MEMS SP4T and SPDT Switches", IEEE Transactions on Microwave Theory and Techniques, Dec. 2015, pp. 3997-4012, vol. 63, No. 12, IEEE Service Center, Piscataway, NJ, US.

Du Y et al., "A X-band switched-line 5-bit phase shifter with RF MEMS multithrow switches", Nano/Micro Engineered and Molecu-

(56) References Cited

OTHER PUBLICATIONS lar Systems (NEMS), Apr. 2013, pp. 296-299, Apr. 2013 8th IEEE International Conference on IEEE.
E. L. Carter, M. Ward and C. Anthony, "Design and fabrication of novel devices using the Casimir force for non-contact actuation," 2009 IEEE Sensors, Christchurch, Oct. 2009, pp. 229-233.
Erker et al., "Monolithic Ka-Band Phase Shifter Using Voltage Tunable BaSrTiO3 Parallel Plate Capacitors," IEEE Microwave and Guided Wave Letters, vol. 10, No. 1, pp. 10-12, Jan. 2000.
European Search Report for Application No. EP16206586 dated May 12, 2017.
Extended European Search Report for Appln. No. EP16206593.2 dated May 30, 2017.
F.S.S. Rosa, D.A.R Dalvit, P.W. Milonni "Casimir-Lifshitz theory and metamaterials," Phys. Rev. Lett., vol. 100, 183602, Mar. 2008.
V. Yannopapas, N. V. Vitanov "First principles study of Casimir repulsion in metamaterials," Physical Review Letters 103, 120401 1-4 (Sep. 2009).
G.M. Rebeiz et al, RF MEMS—Theory, Design, and Technology, John Wiley & Sons, Inc., Hoboken, NJ, (Feb. 2004) pp. 259-291 and 297-323.
Gil, F. Martin, X. Rottenberg and W. D. Raedt, "Tunable stop-band filter at Q-bandbased on RF-MEMS metamaterials", Electronics Letters, vol. 43, No. 21, pp. 1153-1153, Oct. 11, 2007.
Goldsmith et al., "Characteristics of Micromachined Switches at Microwave Frequencies," IEEE MTT-S Int. Microwave Symposium Digest, pp. 1141-1144, Jun. 1996.
Gong et al., "A 60-GHz 2-bit Switched-Line Phase Shifter Using SP4T RF-MEMS Switches," IEEE Transactions on Microwave Theory and Techniques, vol. 59, No. 4, pp. 894-900 Apr. 2011.
Guan-Leng Tan et al., "Low-Loss 2- and 4-bit TTD MEMS Phase Shifters Based on SP4T Switches", IEEE Transactions on Microwave Theory and Techniques, Jan. 2003, pp. 297-304, vol. 1, No. 51, IEEE Service Center, Piscataway, NJ, US.
H. B. Chan et al., "The Casimir effect between micromechanical components on a silicon chip," 2014 International Conference on Optical MEMS and Nanophotonics, Glasgow, Aug. 2014, pp. 61-62.
H. J. De Los Santos, "Impact of the Casimir force on movable-dielectric RF MEMS varactors," 2003 Third IEEE Conference on Nanotechnology, 2003. IEEE-NANO 2003., Sep. 2003, pp. 900-903 vol. 2.
H. T. Chorsi, M. T. Chorsi and S. D. Gedney, "A Conceptual Study of Microelectromechanical Disk Resonators," in IEEE Journal on Multiscale and Multiphysics Computational Techniques, vol. 2, pp. 29-37, Feb. 2017.
Hacker et al., "A Ka-Band 3-Bit RF MEMS True-Time-Delay Network," IEEE Transactions on Microwave Theory and Techniques, vol. 51, No. 1, pp. 305-308, Jan. 2003.
Hayden et al., "Very Low-Loss Distributed X-Band and Ka-Band MEMS Phase Shifters Using Metal-Air-Metal Capacitors," IEEE Transactions on Microwave Theory and Techniques, vol. 51, No. 1, pp. 309-314, Jan. 2003.
Hord Jr. et al., "A New Type of Fast Switching Dual-Mode Ferrite Phase Shifter," IEEE Trans. Microwave Theory Tech., vol. 35, No. 12, pp. 985-988, Dec. 1987.
Hung et al., "Distributed 2- and 3-Bit-Band MEMS Phase Shifters on Glass Substrates," IEEE Transactions on Microwave Theory and Techniques, vol. 52, No. 2, pp. 600-606, Feb. 2004.
Hyman et al., "Surface-Micromachined RF MEMs Switches on GaAs Substrates," Int. J. RF Micrwave CAE, vol. 9, No. 4, pp. 348-361, Jan. 1999.
I. Gil, F. Martin, X. Rottenberg and W. D. Raedt, "Tunable stop-band filter at Q-band based on RF-MEMS metamaterials", in Electronics Letters, vol. 43, No. 21, pp. 1153-1153, Oct. 11, 2007.
J. Ala-Laurinaho et al., "TUMESA—MEMS tuneablemetamaterials for smart wireless applications," 2012 7th European Microwave Integrated Circuit Conference, Amsterdam, Oct. 2012, pp. 95-98.
J. Sun, X. K. Hua, and L. Gao, "Repulsive and attractive Casimir forces between magnetodielectric slabs," Solid State Commun., vol. 152, No. 17, pp. 1666-1669, Sep. 2012.
Jacomb-Hood et al., "A Three-Bit Monolithic Phase Shifter at V-Band," IEEE Microwave and Millimeter-Wave Monolithic Circuits Symposium Digest, pp. 81-84, Jun. 1987.
Jeremiah P. Turpin, Jeremy A. Bossard, Kenneth L. Morgan, Douglas H. Werner, and Pingjuan L. Werner, "Reconfigurable and Tunable Metamaterials: A Review of the Theory and Applications," International Journal of Antennas and Propagation, vol. 2014, May 2014.
Jing Gao and Lei Zhu, "Guided-wave characteristics of CPW transmission line metamaterials: effective per-unit-length parameters," IWAT 2005. IEEE International Workshop on Antenna Technology: Small Antennas and Novel Metamaterials, Mar. 2005, pp. 175-178.
K. Guha et al., "Static and electromagnetic analysis of RF MEMS shunt capacitive switch," TENCON 2015—2015 IEEE Region 10 Conference, Macao, Nov. 2015, pp. 1-6.
Kang et al., "Ku-Band MMIC Phase Shifter Using a Parallel Resonator With 0.18-"m CMOS Technology," IEEE Transactions on Microwave Theory and Techniques, vol. 54, No. 1, pp. 294-301, Jan. 2006.
Kim et al., "Linear Tunable Phase Shifter Using a Left-Handed Transmission Line," IEEE Microwave and Wireless Components Letters, vol. 15, No. 5, pp. 366-368, May 2005.
Koh et al., "0.13-mm CMOS Phase Shifters for X-, Ku-, and K-Band Phased Arrays," IEEE Journal of Solid-State Circuits, vol. 42, No. 11, pp. 2535-2546 (plus 2 pages), Nov. 2007.
Koh et al., "A 6-18 GHz 5-Bit Active Phase Shifter," IEEE MTT-S Int. Microw. Symp. Dig., Montreal, Anaheim, CA, pp. 792-795, May 2010.
L. Cong, P. Pitchappa, C. Lee, R. Singh, "Active Phase Transition via Loss Engineering in a Terahertz MEMS Metamaterial," Advanced Materials, May 2017, 1700733.
Larson et al., "Microactuators for GaAs-Based Microwave Integrated Circuits," Transducers '91 Int. Conf., pp. 743-746, Jun. 1991.
Lee et al., "Low-Loss Analog and Digital Reflection-Type MEMS Phase Shifters With 1:3 Bandwidth," IEEE Transactions on Microwave Theory and Techniques, vol. 52, No. 1, pp. 211-219, Jan. 2004.
Liu A. et al., "Single-Pole-Four-Throw Switch Using High-Aspect-Ratio Lateral Switches", Electronics Letters, IEE Stevenage, GB, vol. 40, No. 18, Sep. 2, 2004, pp. 1125-1126, XP006022539, ISSN: 0013-5194, DOI: 10.1049/EL: 20045718.
Intravaia et al., "Can Surface Plasmons Tune the Casimir Forces Between Metamaterials?" "New Frontiers in Casimir Force Control", Santa Fe NM, Sep. 27-29, 2009, 1 page.
Leonhardt et al., "Quantum levitation by left-handed metamaterials," New Journal of Physics, vol. 9, 254; Aug. 10, 2007, 12 pages.
India Search Report for Application No. 201614044450 dated Oct. 25, 2019, 1 page.
Search Report for Indian Patent Application No. 201814008725 dated Dec. 24, 2019, 2 pages.
M. Fernandez-Bolanos, C. Dehollain, P. Nicole and A. M. Ionescu, "Tunable band-stop filter based on single RF MEMS capacitive shunt switch with meander arm inductance," 2009 Proceedings of the European Solid State Device Research Conference, Athens, May 2010, pp. 331-334.
M. L. Ya, N. Soin and A. N. Nordin, "Novel low-voltage RF-MEMS switch: Design and simulation," 2014 IEEE International Conference on Semiconductor Electronics (IEEE-ICSE2014), Aug. 2014, pp. 142-145.
M. Sterner, D. Chicherin, A. V. Raisenen, G. Stemme and J. Oberhammer, "RF MEMS High-Impedance Tuneable Metamaterials for Millimeter-Wave Beam Steering"; 2009IEEE 22nd International Conference on Micro Electro Mechanical Systems, Jan. 2009, pp. 896-899.
Majumder et al., "Measurement and Modeling of Surface Micromachined, Electrostatically Actuated Microswitches," Tech. Digest, 1997 Int. Conf. on Solid-State Sensors and Actuators, pp. 1145-1148, Jun. 1997.
Malczewski et al., "X-Band RF MEMS Phase Shifters for Phased Array Applications," IEEE Microwave and Guided Wave Letters, vol. 9, No. 12, pp. 517-519, Dec. 1999.

(56) References Cited

OTHER PUBLICATIONS

Min et al., "Single-Ended and Differential Ka-Band BiCMOS Phased Array Front-Ends," IEEE Journal of Solid-State Circuits, vol. 43, No. 10, pp. 2239-2250, Oct. 2008.
Müller et al., "Tunable Passive Phase Shifter for Microwave Applications Using Highly Anisotropic Liquid Crystals," IEEE MTT-S Int. Microw. Symp. Dig., Fort Worth, TX, USA, pp. 1153-1156, Jun. 2004.
Norris et al., "A Fully Monolithic 4-18 GHZ Digital Vector Modulator," IEEE International Microwave Symposium Digest, Dallas, TZ, USA, pp. 789-792, May 1990.
P.J. Van Zwol, G. Palasantzas, "Repulsive Casimir force between solid materials with high-refractive-index intervening liquids," Physical Review A, vol. 81, 062502, Jun. 2010.
Pacheco et al., "MEMS Single-Pole Double-Throw (SPDT) X and K-Band Switching Circuits," IEEE MTT-S Int. Microwave Symposium Digest, vol. 1, pp. 321-324, May 2001.
Park et al., "A 35-60 GHz Single-Pole Double-Throw (SPDT) Switching Circuit Using Direct Contact MEMS Swithces and Double Resonance Technique," 12th Int. Conf. Transducers, Solid-State Sensors, Actuators and Microsystems, vol. 2, pp. 1796-1799, Jun. 2003.
Park et al., "Electroplated RF MEMS Capacitive Switches," 13th Annual Int. Conf. on Micro Electro Mechanical Systems, pp. 639-644, Jan. 2000.
Pillans et al., "Advances in RF MEMS Phase Shifters from 15 GHz to 35 GHz," IEEE MTTT-S Int. Microw. Symp. Dig., Montreal, QC, Canada, pp. 1-3, Jun. 2012.
Pyndiah et al., "GaAs Monolithic Direct Linear (1-2.8) GHz Q.P. S.K. Modulator," 19th European Microwave Conf. Dig., London, UK, pp. 597-602, Sep. 1989.
R. Ardito, A. Corigliano, B. De Masi and A. Frangi, "An experimental assessment of Casimir force effect in micro-electromechanical systems," 2008 IEEE Sensors, Lecce, Oct. 2008, pp. 90-93.
Rebeiz et al., "RF MEMS Switches and Switch Circuits," Microwave Magazine, University of Michigan, Ann Arbor, USA, pp. 59-71, Dec. 2001.
Repulsive Casimir Force? T. V. Prevenslik Consultant, Discovery Bay, Hong Kong, China, 2009, available at http://www.nanoqed.org/resources/CasimirX.pdf.
Robert V. Garver, "Broad-Band Diode Phase Shifters," IEEE Transactions on Microwave Theory and Techniques, vol. MTT-20, No. 5, pp. 314-323, May 1972.
Scardelletti et al., "MEMS, Ka-Band Single-Pole Double-Throw (SPDT) Switch for Switched Line Phase Shifters," IEEE Antennas & Propagation Society Int. Symp., vol. 2, pp. 2-5, Jun. 2002.
Schauwecker et al., "Single-Pole-Double-Throw Switch Based on Toggle Switch," Electronic Letters, vol. 39, No. 8, pp. 668-670, Apr. 2003.
Schindler et al., "A 3 Bit K/Ka Band MMIC Phase Shifter," IEEE Microwave and Millimeter-Wave Monolithic Circuits Symposium Digest, New York, NY, USA, pp. 95-98, May 1988.
Shen et al., "Low Actuation Voltage RF MEMS Switches With Signal Frequencies From 0.25GHz to 40GHz," Proc. Int. Electron Devices Meeting, pp. 689-692, Dec. 1999.
Tan et al., "Low-Loss 2- and 4-bit TTD MEMS Phase Shifters Based on SP4T Switches," IEEE Transactions on Microwave Theory and Techniques, vol. 51, No. 1, pp. 297-304, Jan. 2003.
Tang M. et al., "A Low-Loss Single-Pole-Double-Throw (SPDT) Switch Circuit", Solid-State Sensors, Actuators and Microsystems Conference, 2007. Transducers 2007. International, IEEE, Piscataway, NJ, USA,Jun. 10, 2007, pp. 679-682, XP031216121, ISBN: 978-1-4244-0841-2.
Telliez, et al., "A Compact, Monolithic Microwave Demodulator-Modulator for 64-QAM Digital Radio Links," IEEE Transactions on Microwave Theory and Techniques, vol. 39, No. 12, pp. 1947-1954, Dec. 1991.
Tomislav Debogovic and Julien Perruisseau-Carrier, "MEMS-Reconfigurable Metamaterials and Antenna Applications," International Journal of Antennas and Propagation, vol. 2014, Apr. 2014.
Unlu et al., "A 15-40-GHz Frequency Reconfigurable RF MEMS Phase Shifter," IEEE Transactions on Microwave Theory and Techniques, vol. 61, No. 8, pp. 2865-2877, Aug. 2013.
V. Yannopapas and N. V. Vitanov, "First-Principles Study of Casimir Repulsion in Metamaterials," Physical Review Letters, vol. 103, No. 12, p. 120401, Sep. 2009.
Vaha-Heikkila and M. Ylonen, "CMOS Compatible Switched MEMS Capacitors Up to 220 GHz Applications," 2006 European Microwave Conference, Manchester, Sep. 2006, pp. 1060-1063.
Vähä-Heikkilä, et al., "RF MEMS Impedance Tuners for 6-4 GHz Applications," Int. J. RF Microw. Comput.-Aided Eng., vol. 17, No. 3, pp. 265-278, May 2007.
X. W. Lia, Z. X. Huang and X. L. Wu, "The restoring Casimir force between doped silicon slab and metamaterials," 2013 Proceedings of the International Symposium on Antennas & Propagation, Nanjing, Oct. 2013, pp. 1264-1267.
Yamane et al., "A Ku-band Dual-SPDT RF-MEMS Switch by Double-Side SOI Bulk Micromachining," Journal of Microelectromechanical Systems, vol. 20, No. 5, pp. 1211-1221 , Oct. 2011.
Yao et al., "Micromachined Low-Loss Microwave Switches," IEEE Journal of Microelectromechanical Systems, vol. 8, No. 2, pp. 129-134, Jun. 1999.
Dai C-L, Dai, Ching-Liang, and Ying-Liang Chen. "Modeling and Manufacturing of Micromechanical RF Switch with Inductors." Sensors (Basel, Switzerland) 7.11 (Nov. 2007): 2660-2670.
T. Jang et al., "Switchable Composite Right/Left-Handed (S-CRLH) Transmission Line Using MEMS Switches," in IEEE Microwave and Wireless Components Letters, vol. 19, No. 12, pp. 804-806, Dec. 2009.

* cited by examiner

PRIOR ART

PRIOR ART

200

1100

MICROELECTROMECHANICAL SWITCH WITH METAMATERIAL CONTACTS

CROSS-REFERENCE TO RELATED APPLICATIONS

This application claims the benefit of the filing date of U.S. Provisional Patent Application No. 62/469,752 filed Mar. 10, 2017, the disclosure of which is hereby incorporated herein by reference.

FIELD OF TECHNOLOGY

The present disclosure relates to radio frequency (RF) switches, or more particularly RF micro electromechanical system (MEMS) switches.

BACKGROUND OF THE INVENTION

RF MEMS switches have previously been employed in microwave and millimeter-wave communication systems, such as in signal routing for transmit and receive applications, switched-line phase shifters for phased array antennas, and wide-band tuning networks for modern communication systems. MEMS is typically a silicon-based integrated circuit technology with moving mechanical parts that are released by means of etching sacrificial silicon dioxide layers.

FIGS. 1A-1C illustrate an example circuit design of a cantilevered out-of-plane RF MEMS switch 100. FIG. 1A is a top view of the switch, FIG. 1B is a cross-sectional view of the switch along axis X, and FIG. 1C is another cross-sectional view of the switch along axis Y.

The example switch 100 is formed over a coplanar waveguide 101 in which a signal line 110 is formed between ground planes 102, 104 of a substrate 105. The signal line 110 includes an input port 112 and an output port 114 formed on opposing ends of the substrate 105. The cantilever switch includes a post 120 or anchor affixed to the substrate 105 and includes an extension extending over the substrate in a direction perpendicular to the signal line 110. The extension of the cantilever includes a bottom layer 125 of dielectric material, such as silicate, and a top layer 130 of conductive material 130, such as gold. The cantilever further includes a contact bump or dimple 135 positioned underneath the bottom dielectric layer 120 and in alignment with the signal line ports 112, 114. Thus, when the cantilever is bent downward, the dimple 135 contacts the signal line 110, thereby connecting the input and output ports 112, 114.

The switch 100 also includes an electrostatic actuator (not shown) for actuating the cantilever by applying or removing a DC bias voltage between the cantilever and the ground 102, 104 of the coplanar waveguide 101. The cantilever bends downward and upward, in a direction towards and away from the signal line respectively, in response to the applied voltage from the actuator. Other RF MEMS switches may rely on a lateral movement in order to bring the moveable part of a cantilevered switch towards or away from a contact. Each of the moving part and contact may be metal (resistive switch), or one may be metal while the other is dielectric (capacitive switch).

RF MEMS switches, compared to their solid state semiconductor counterparts, exhibit several important advantages such as: superior linearity; low insertion loss; and high isolation. In particular, RF MEMS switches at millimeter wave frequencies are suitable for use in modern telecommunication systems, especially for automotive radar systems, 5G wireless communication, short range indoor microwave links, wide-band transceivers, phased array systems and high precision instrumentation applications.

Compared with PIN diodes and field-effect transistor (FET) switches, RF MEMS switches have been found to offer lower power consumption, higher isolation, lower insertion loss and higher linearity at a lower cost.

RF MEMS switches can encounter several drawbacks, including high actuation voltages, high insertion loss, and poor return loss. These drawbacks are a challenge to designing MEMS switches for operation in the millimeter wave frequency range.

Another problem with RF MEMS switch performance is that it is prone to electromechanical failure after several switching cycles, especially under hot switching conditions. For instance, the switch may fail due to static friction (or stiction) buildup. When the moveable part of the switch is pulled into contact with another component of the system (e.g., a signal line), the static friction can cause the switch to become stuck. It may require a high voltage to overcome the stiction force. But at low voltage, the switch can remain "welded" to the component.

BRIEF SUMMARY OF THE INVENTION

An aspect of the present disclosure is directed to a microelectromechanical switch including: a signal line having each of an input port and an output port, the signal line formed on a substrate between a first ground plane and a second ground plane formed on the substrate; a primary deflectable beam having a first end, a second end, and a deflectable middle portion between the first and second ends, the first end supported by a first post formed over the first ground plane, the second end supported by a second post formed over the second ground plane, and the middle portion of the primary deflectable beam positioned over at least a portion of the input port and at least a portion of the output port, whereby the deflectable middle portion contacts each of the input port and output port when deflected downward; one or more defected ground structures formed in each of the first ground plane and the second ground plane; and for each defected ground structure, a corresponding secondary deflectable beam positioned over the defected ground structure. The switch may further include a first actuator coupled to the primary deflectable beam and configured to apply a first bias voltage to the primary deflectable beam, whereby the first bias voltage causes the primary deflectable beam to deflect downward toward the signal line, and a second actuator coupled to each of the one or more secondary deflectable beams and configured to apply a second bias voltage to each of the secondary deflectable beams, whereby the second bias voltage causes each secondary deflectable beam to deflect downward toward its corresponding defected ground structure.

In some examples, each of the defected ground structures may include a plurality of slots etched into the ground plane and forming a spiral. Also, in some examples, each ground plane may include a first defected ground structure and a second defected ground structure, the length and width of the second defected ground structure being shorter than the length and width of the first defected ground structure. Also, in some examples, the input and output ports may be formed along a first axis of the switch, with the primary deflectable beam extending from the first post to the second post along a second axis perpendicular to the first axis, and the secondary deflectable beams extending in a direction parallel to the first axis.

In some examples, each of the secondary deflectable beams may have a first end supported by a first secondary post and a second end supported by a second secondary post. A bottom surface of each secondary deflectable beam may be suspended over the ground plane and corresponding defected ground structure by its first and second secondary posts. An upper surface of the primary deflectable beam may be less than 4 microns higher than the surface of the signal line. An upper surface of each secondary deflectable beam may be less than 2.5 microns higher than the surface of the ground plane.

In some examples, the middle portion of the primary deflectable beam may have a plurality of perforations forming a lattice structure. The perforations may increase the flexibility of primary deflectable beam. Each corner of the middle portion may extend outward toward the first or second end in a serpentine pattern. The extended corners of one side of the middle portion may meet at the first end, while the extended corners of the other side of the middle portion meet at the second end. In this regard, the primary deflectable beam may be less than 150 μm long and yet sufficiently flexible for the middle portion to deflect 1 μm or more downward. The downward deflection may be in response to application of a bias voltage, such as a voltage of about 17 volts or less. Additionally or alternatively, each secondary deflectable beam may include a plurality of perforations forming a lattice structure. The perforations may increase flexibility of secondary deflectable beam.

In some examples, the switch may achieve insertion loss of less than −2 dB and isolation of greater than −20 dB between 75 GHz and 130 GHz. Also, in some examples, actuation of the primary deflectable beam and non-actuation of the secondary deflectable beams may result in isolation between the input and output ports of about −24 dB or better between 75 GHz and 130 GHz. Similarly, actuation of the secondary deflectable beams and non-actuation of the primary deflectable beam may result in insertion loss of −1.5 dB or better between 75 GHz and 130 GHz.

Another aspect of the present disclosure is directed to a microelectromechanical switch including: a signal line comprising each of an input port and an output port, the signal line formed on a substrate between a first ground plane and a second ground plane formed on the substrate; a beam positioned above the signal line, the beam being configured to move in an out-of plane direction relative to the signal line and ground planes, and including an upper contact configured to contact the signal line; and a metamaterial structure included in one of the upper contact and the signal line. In some examples, the metamaterial structure may include concentric split rings. Also, in some examples, the metamaterial structure has an effective permittivity of 0.05 or less over a bandwidth of at least 50 GHz. Further, in some examples, the metamaterial structure exhibits each of a primarily-reflective property and a primarily-transmissive property within a bandwidth of less than 100 GHz. Yet further, in some examples, the metamaterial structure may generate a repulsive Casimir force for separating the beam and signal line In some examples, the switch may be a resistive switch. In such examples, the metamaterial structure may be included in the upper contact. An upper surface of the input and output ports of the signal line may be conductive. The beam further may include a bottom conductive layer to contact each of the input and output ports when the beam is actuated. The metamaterial structure may be embedded in the bottom conductive layer. Also, in some examples, the beam may further include a dielectric layer formed above the bottom conductive layer, and a top conductive layer formed above the dielectric layer. The bottom conductive layer may have a permittivity less than that of the dielectric layer. The top conductive layer may have a permittivity greater than that of the dielectric layer. Each of the top and bottom conductive layers may be made of gold. The dielectric layer may be made of one of silicon nitride or silicon mononitride. Also, in some examples, the switch may further include one or a combination of a second metamaterial structure embedded in the top conductive layer, and a top dielectric layer over the top conductive layer having a common composition as the dielectric layer between the top and bottom conductive layers. Each of the top dielectric layer, the top conductive layer, and the dielectric layer may have a length equal to a length of the beam, while the bottom conductive layer has a length equal to a width of the signal line. In some examples, the switch may have an isolation of greater than about −15 dB between 80 GHz and 100 GHz when the switch is off, and an insertion loss of less than about −1 dB between 80 GHz and 100 GHz when the switch is on.

In other examples, the switch may be a capacitive shunt switch. The metamaterial structure may be included in the signal line. The switch may further include a deflectable beam having a first end, a second end, and a deflectable middle portion between the first and second ends, the first end supported by a first post formed over the first ground plane. The second end may be supported by a second post formed over the second ground plane, and the middle portion of the deflectable beam may be positioned over the metamaterial structure in the signal line. The deflectable middle portion may contact the signal line when deflected downward.

In some examples, the switch may further include a conductive strip extending from the first ground plane towards the signal line. The conductive strip may extend to the opposing end of the signal line such that it is positioned at least partially on top of the metamaterial structure. In some instances, the first conductive strip may extend from the first ground plane to the second ground plane.

In some examples, the signal line may include a first metamaterial structure adjacent to the input port and a second metamaterial structure adjacent to the output port. The switch may further include a first conductive strip extending from the first ground plane towards the second ground plane and positioned at least partially on top of the first metamaterial structure, and a second conductive strip extending from the first ground plane towards the second ground plane and positioned at least partially on top of the second metamaterial structure.

In some examples, the switch may include each of a bottom dielectric layer formed on the substrate, each of the ground planes and signal line being formed on the bottom dielectric layer, a conductive post extending downward from one of the ground planes into the bottom dielectric layer, and a conductive beam extending outward from the conductive post towards the signal line. The conductive beam may extend to the opposing end of the signal line such that it is positioned at least partially underneath the metamaterial structure. Additionally, in some examples, the switch may have an isolation of greater than about −15 dB between 30 GHz and 100 GHz when the switch is off, and an insertion loss of less than about −1 dB between 30 GHz and 100 GHz when the switch is on.

DETAILED DESCRIPTION

The present disclosure provides for RF MEMS switches having improved signal characteristics and reduced vulnerability to stiction.

Figure 1A:
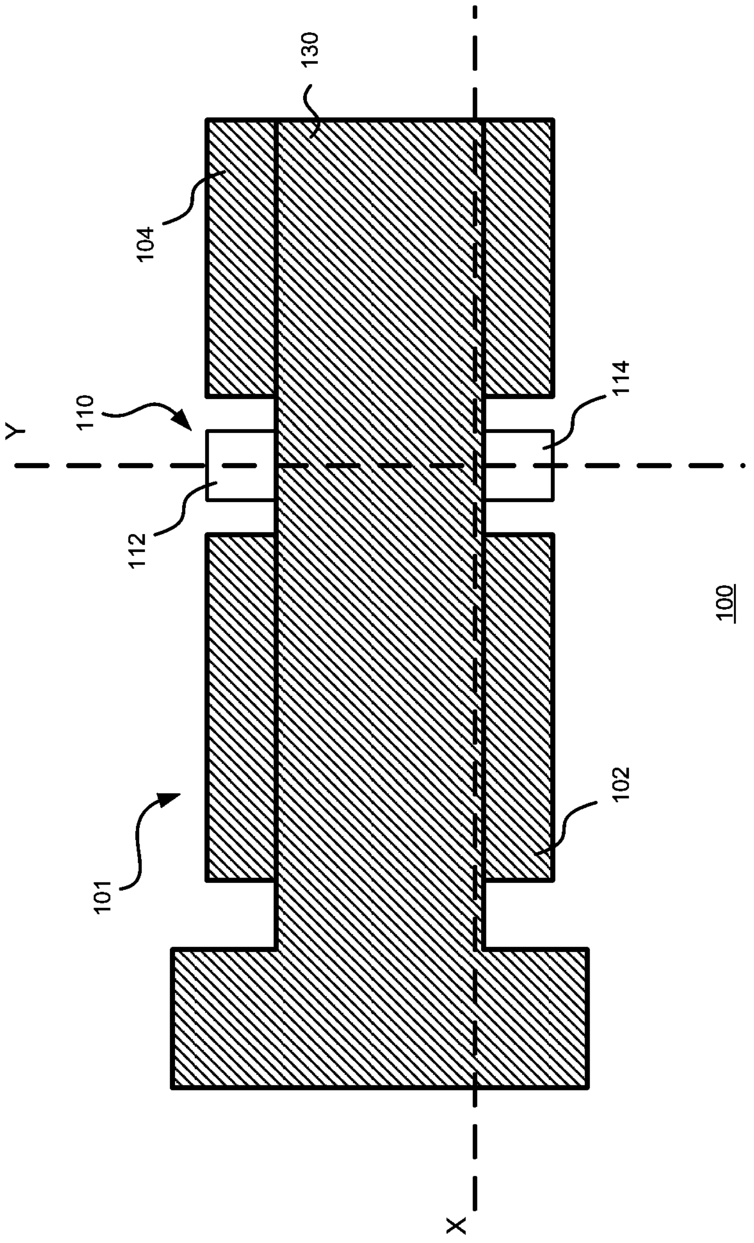
FIG. 1A is a top-down view of a prior art RF MEMS switch.
Figure 1B:
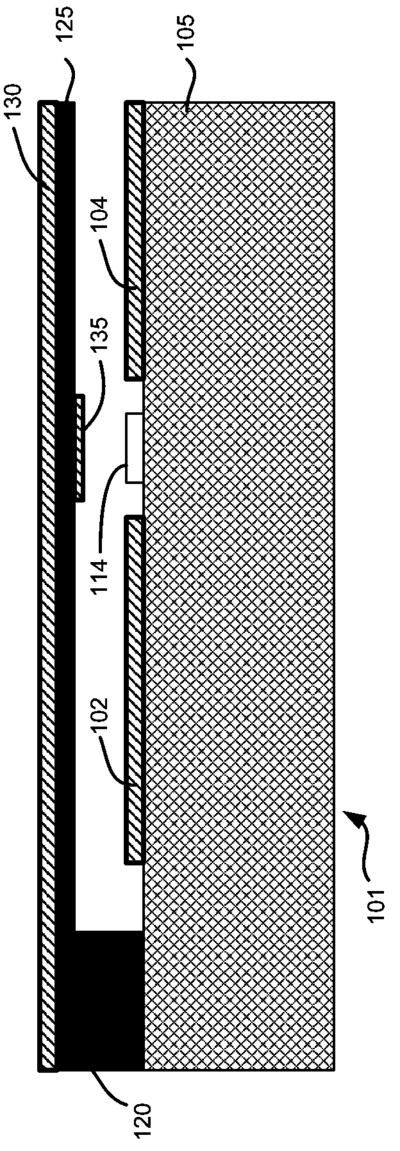
FIG. 1B is a side view of the switch of FIG. 1A.
Figure 1C:
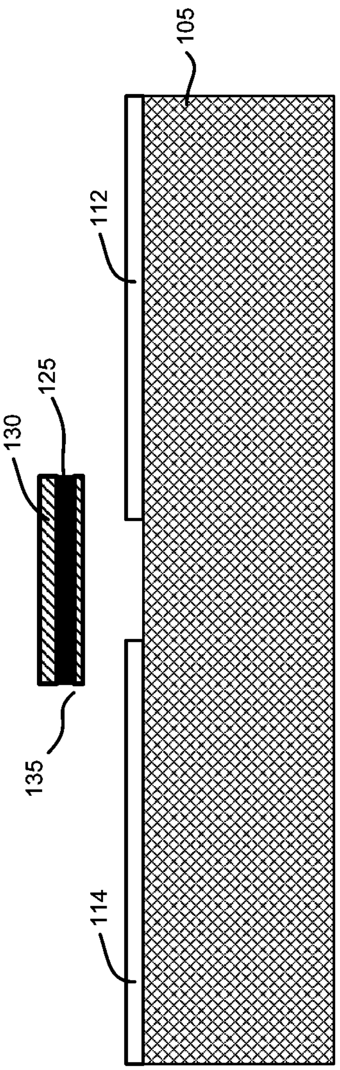
FIGURE 1C PRIOR ART
FIG. 1C is a front view of the switch of FIG. 1A.
Figure 2:
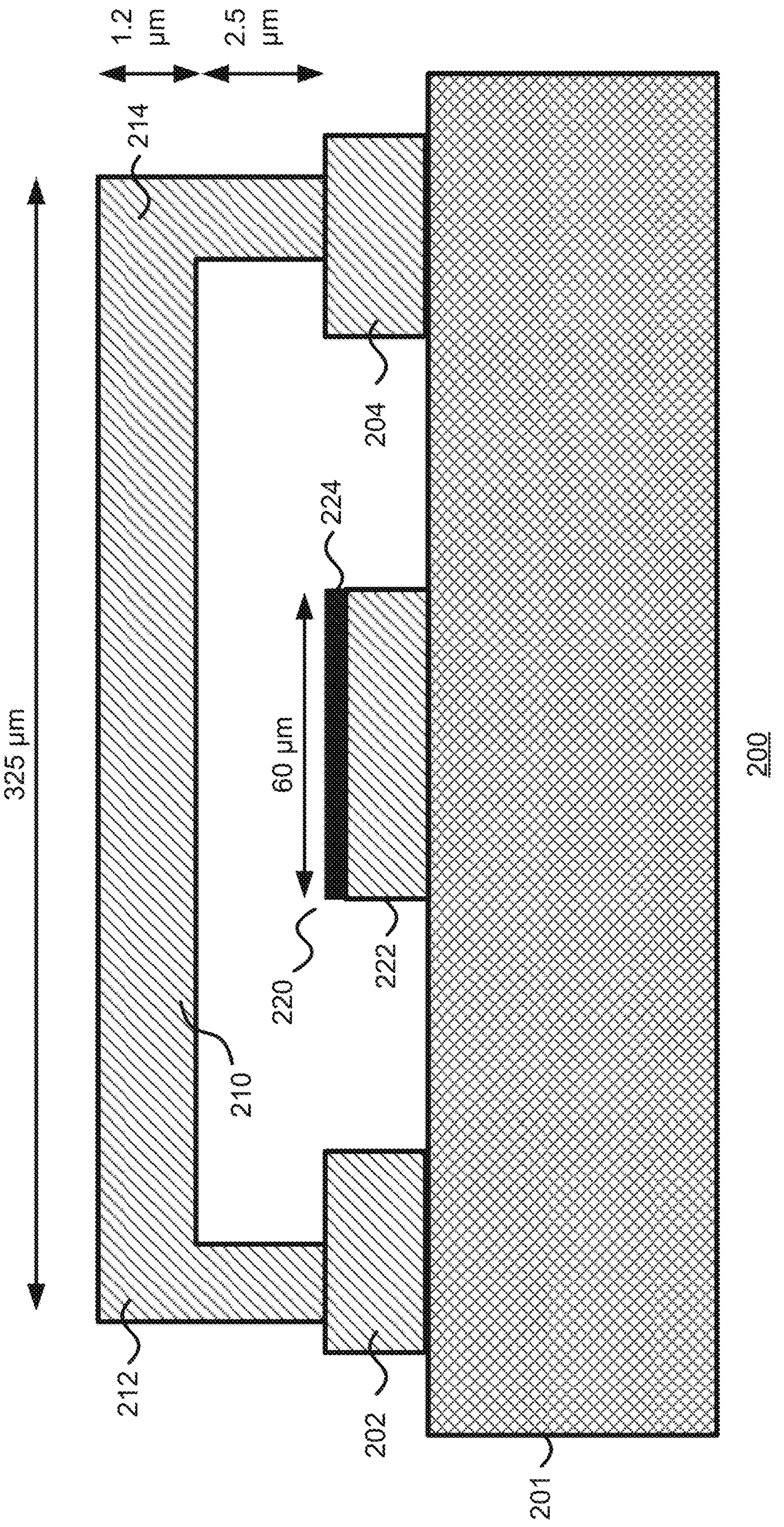
FIG. 2 is a side view of an RF MEMS shunt switch in accordance with an aspect of the present disclosure.

FIG. 2 shows an RF shunt switch 200 with a doubly-supported cantilever beam 210 formed above a coplanar waveguide formed on a substrate 201. A first end 212 and second end 214 of the beam 210 are supported by respective ground planes 202 and 204 formed in the coplanar waveguide. The middle of the beam 210 is suspended over a signal line 220 formed in the coplanar waveguide. The beam 210 is connected to an actuator (not shown) configured to apply a direct current (DC) bias voltage across the beam 210 the ground planes 202, 204. The DC bias voltage causes the beam 210 to deflect downward.

In the example of FIG. 2, the signal line 220 includes a conductive layer 222 covered by a thin dielectric layer 224, such as silicon nitride. The dielectric layer may be about 0.2 μm thick. When the beam 210 deflects downward and contacts the signal line 220, a large shunt capacitance is obtained. The large shunt capacitance blocks RF signals from propagating along the signal line 220 of the coplanar waveguide (ON-state). When the DC bias is removed, the beam 220 deflects upward and returns to its original position, the shunt capacitance drops, and the RF signal resumes propagating in un-attenuated form (OFF-state).

In the example of FIG. 2, the beam 210 is made of molybdenum, and has a length of about 325 μm, a width of about 60 μm, and a thickness of about 1.2 μm. The signal line 220 extends through the coplanar waveguide, and has a width (in the direction of the beam length) of about 60 μm. The beam 210 is suspended about 2.5 μm above the signal line 220, thereby forming a 2.5 μm air gap. The dielectric layer has a thickness of about 0.2 μm.

Figure 3:
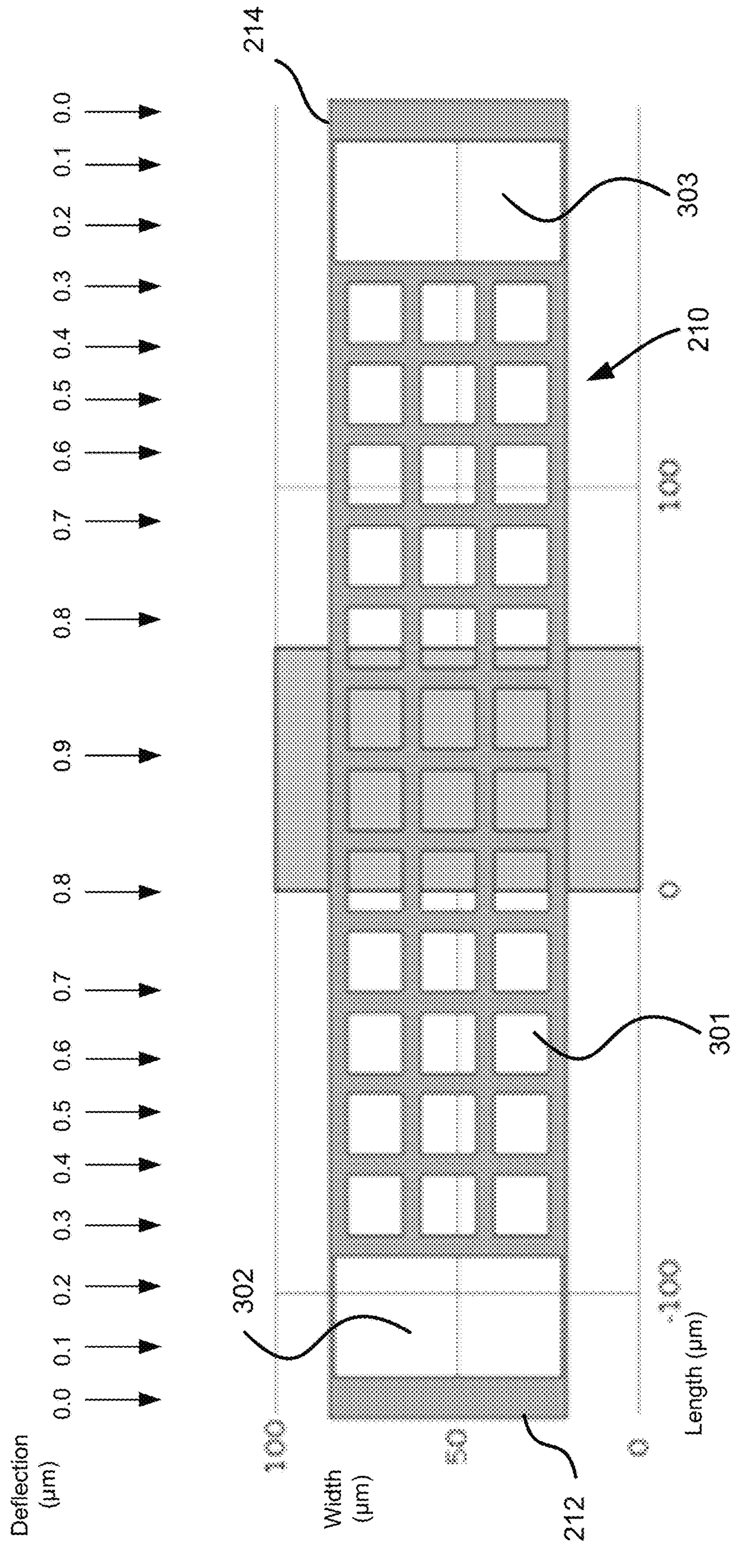
FIG. 3 is a plan view of an example RF MEMS shunt switch in accordance with an aspect of the present disclosure.

FIG. 3 shows a top view of the switch 200 of FIG. 2. The beam 210 is perforated, having a grid of small perforations 301 in the middle and a large perforation 302, 303 at each end. The perforations yield improved downward deflection of the beam 210. FIG. 3 further illustrates the vertical displacement of the beam 210 when the DC bias voltage is applied, which is extends from no displacement at the respective ends 212, 214 of the beam, to about 0.91 μm in the middle of the beam 210. The DC bias for the switch of FIG. 2 has been observed to be about 37 V.

Figure 4:
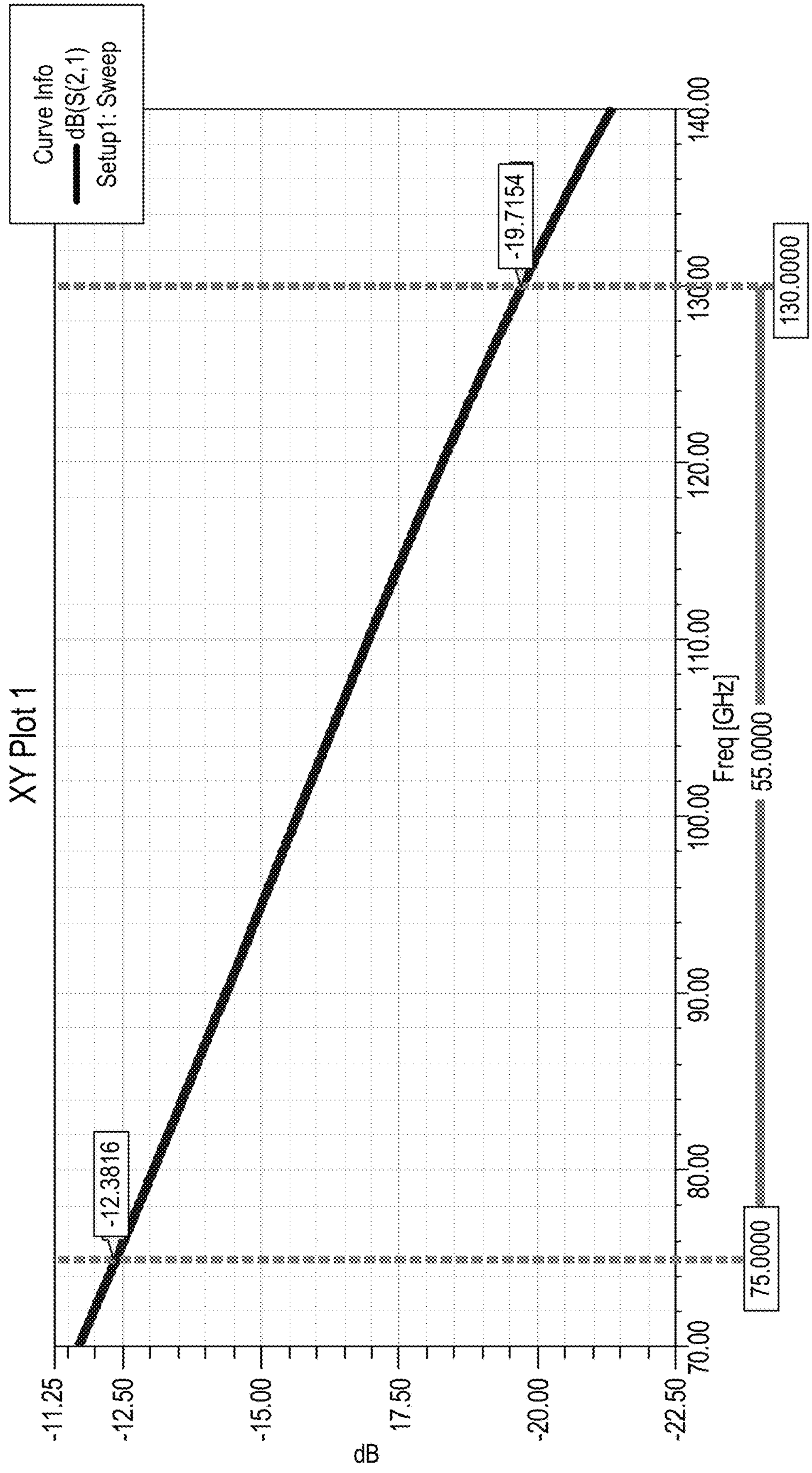
FIG. 4 is a graphical representation of isolation of the switch of FIG. 3.

FIG. 4 shows isolation characteristics of the switch of FIG. 2 when the switch is open, across a band of millimeter wave signals from 75 GHz to 130 GHz. Isolation is about −12.4 dB at 75 GHz, and about −19.7 dB at 130 GHz. Insertion loss of the switch when closed is about 0.74 dB, and return loss is about 10.04 dB.

Figure 5:
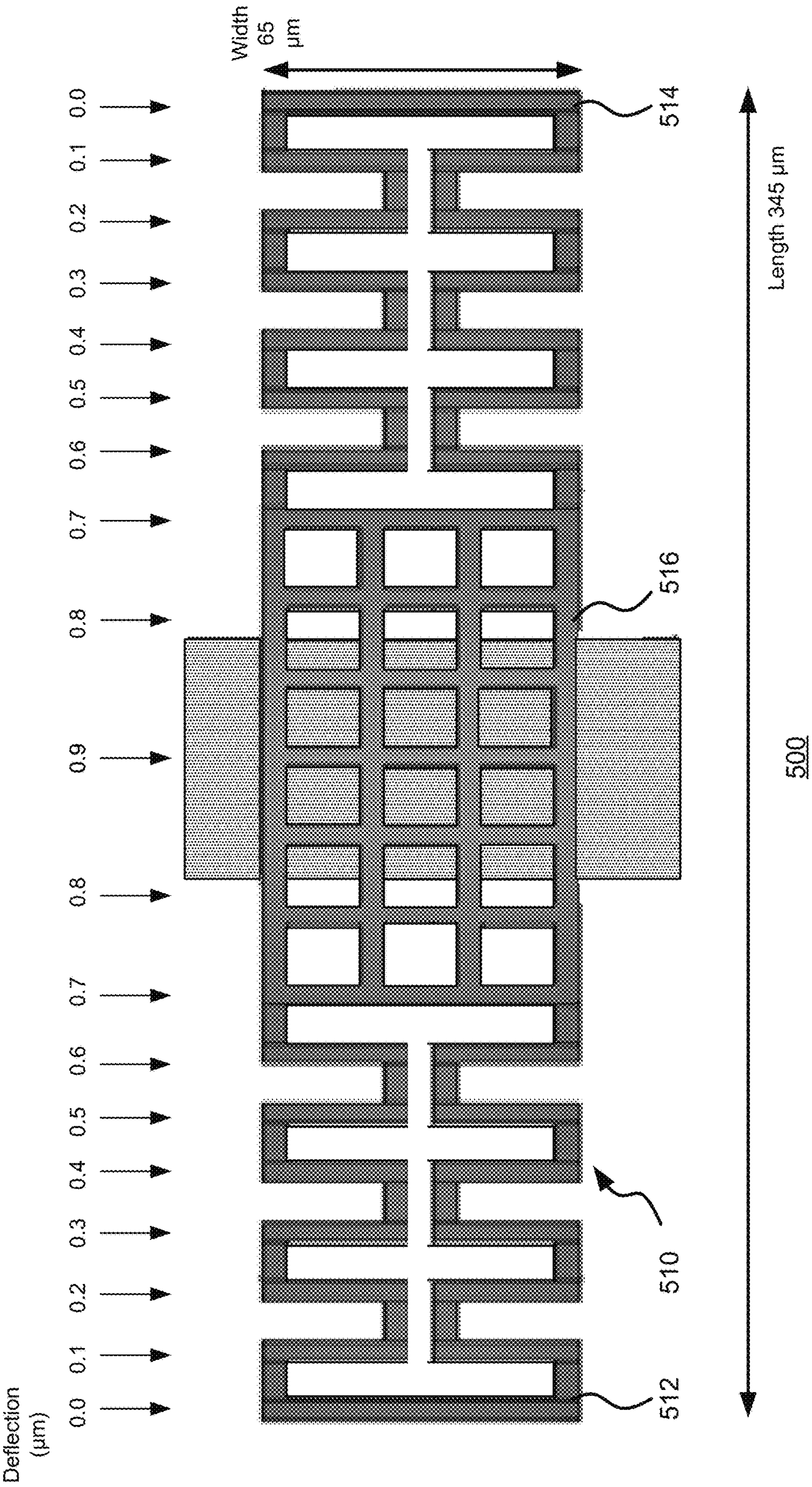
FIG. 5 is a plan view of another example RF MEMS shunt switch in accordance with an aspect of the present disclosure.

The actuation voltage can be further reduced to less than 37V by providing a different perforation arrangement. In the example of FIG. 5, switch 500 includes a rectangular beam 510 made of gold and having a perforated structure. The middle portion 516 of the beam 510 forms a perforated grid or lattice. Each corner of the lattice structure then extends in a serpentine pattern toward the first and second ends 512, 514 of the beam 510. The serpentine patterns on either end are then connected to one another, thereby forming first and second serpentine structures on either end of the beam 510. The serpentine structure permits for deflection of the beam with a lower bias voltage.

The dimensions of the switch shown in FIG. 5 is largely comparable to that of FIG. 2, except that the beam of FIG. 5 is slightly longer (about 345 μm), and slightly wider (about 65 μm). The beam still deflects downward up to 0.9 μm with only a 17 V bias voltage.

Figure 6:
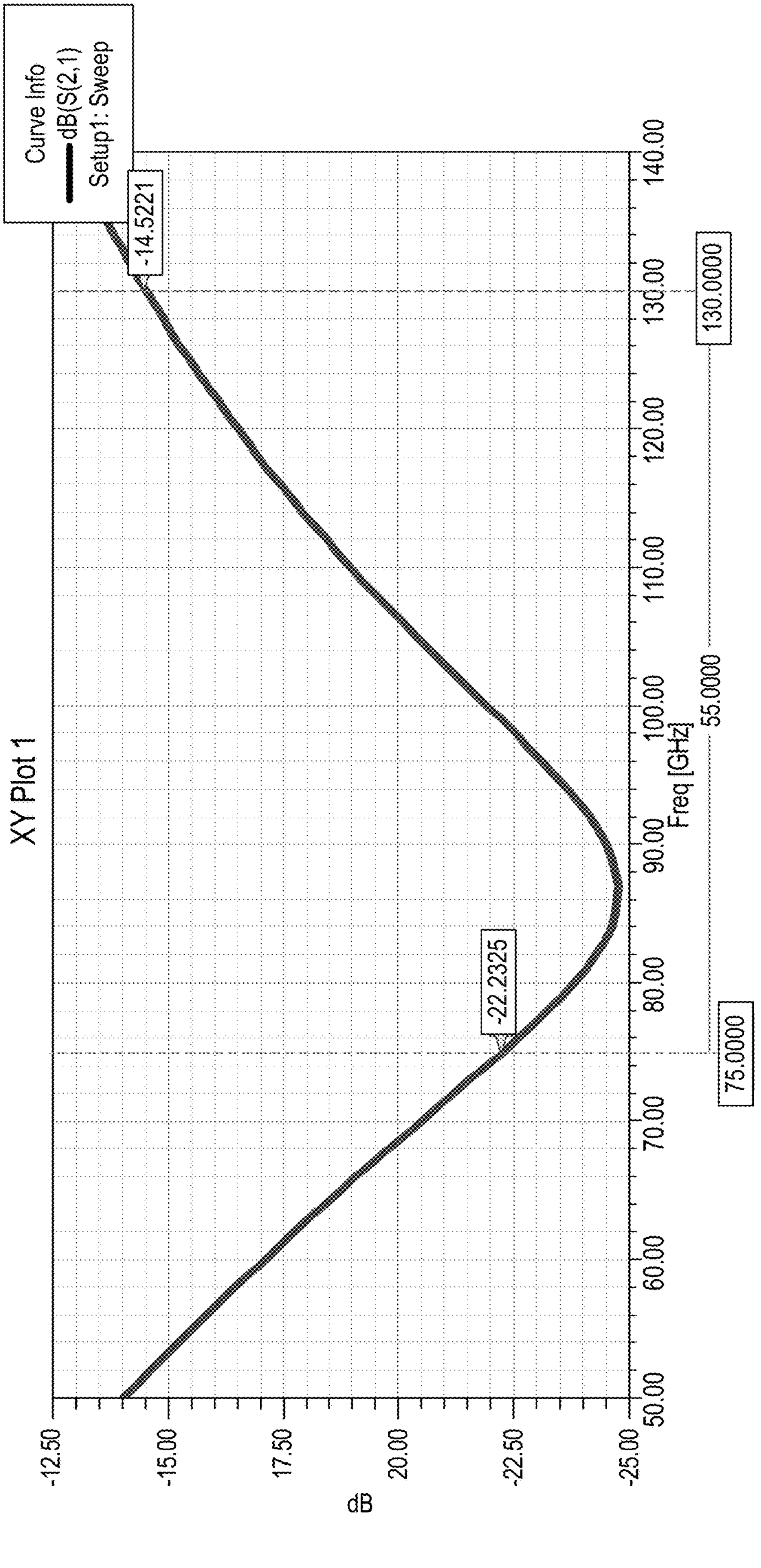
FIG. 6 is a graphical representation of isolation of the switch of FIG. 5.

The switch of FIG. 5 also has improved isolation characteristics. FIG. 6 shows isolation characteristics of the switch of FIG. 5 when the switch is open, across the 75 GHz to 130 GHz band. Isolation is about −22.0 dB at 75 GHz, and about −14.7 dB at 130 GHz, and drops to as little as about −24.8 dB at 86 GHz. Additionally, insertion loss of the switch when closed is only about 0.6 dB, and return loss is only about 15.15 dB.

Figure 7:
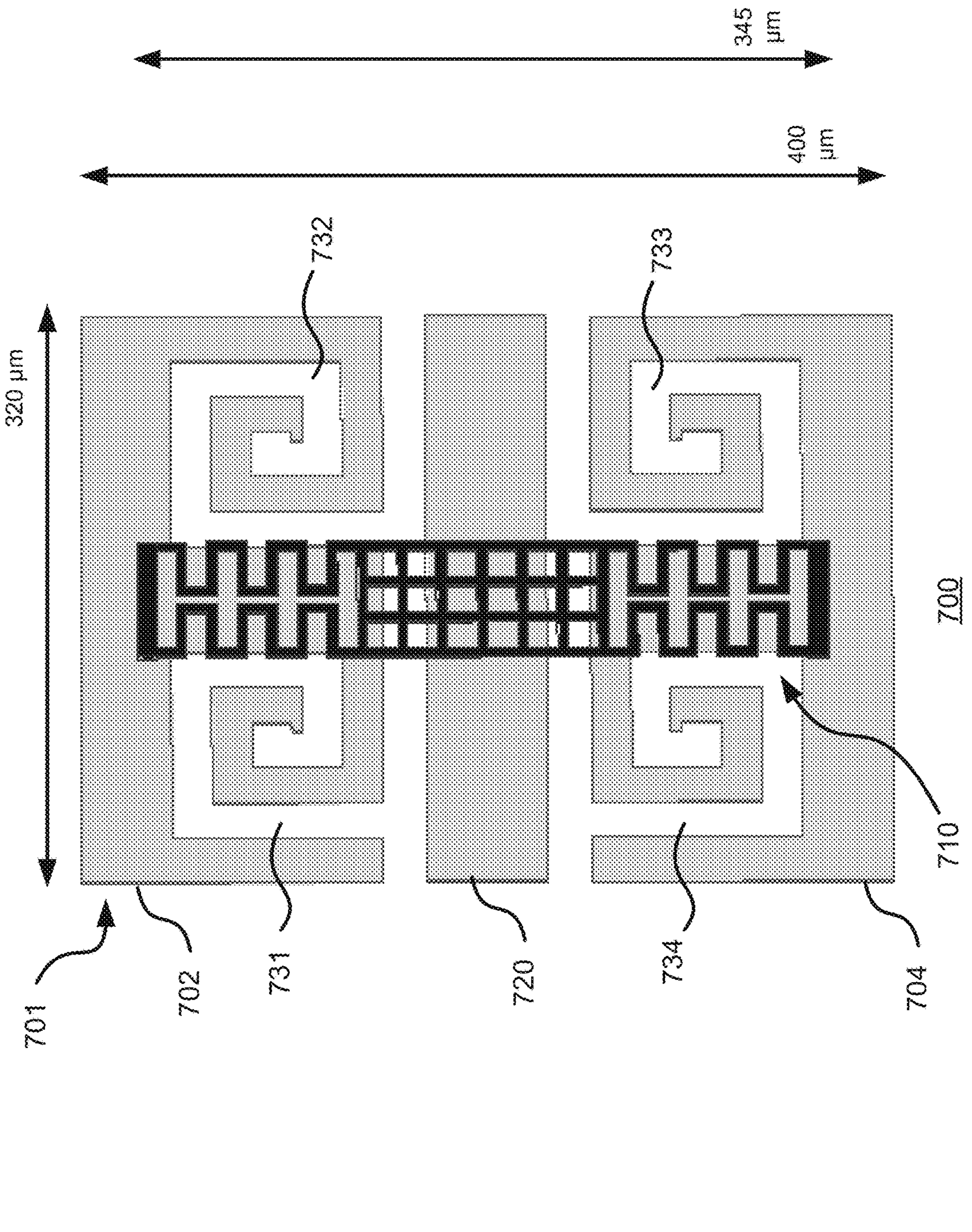
FIG. 7 is a plan view of a switch having a defected ground plane structure in accordance with an aspect of the present disclosure.

Nonetheless, the isolation characteristics of the shunt switches of FIGS. 2 and 5 can be further improved upon, particularly in the millimeter wave frequency band of 75 GHz to 130 GHz. The example switch 700 of FIG. 7 includes a beam 710 having the same structural arrangement as the beam 510 of FIG. 5 and formed on a ground plane structure 701 measuring about 320 μm long by about 400 μm wide. The ground plane structure 701 includes a signal line 720 between two ground planes 702, 704. A two-dimensional defected ground structure (DGS) is formed in each of the ground planes 702 and 704 of the switch 700. The DGS essentially behaves as a band stop filter, thereby affecting the transmission characteristics of the switch 700. In the example of FIG. 7, the DGS forms four spiral shaped slots 731, 732, 733, 734 in a two-by-two grid and having mirror symmetry along the lengthwise axis of the signal line 720.

Figure 8:
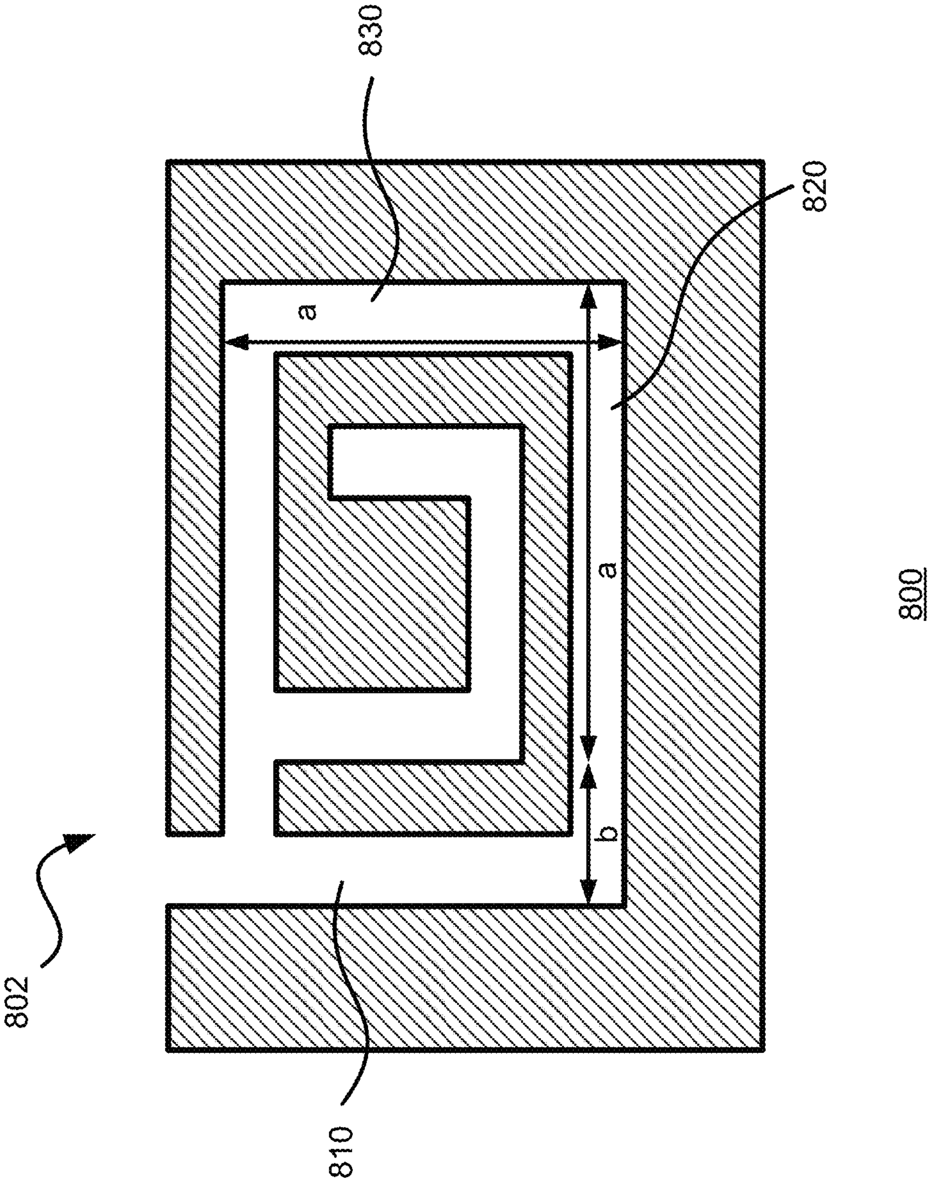
FIG. 8 is a zoomed image of a portion of the plan view of FIG. 7.

Characteristics of the spiral shaped slots are shown in greater detail in FIG. 8. In the example DGS 800 of FIG. 8, each of the spiral shaped slots have a common, uniform width W. A first slot 810 extends from the channel 802 separating the signal line from the ground plane. Each subsequent slot connects to the previous slot at a right angle. Hence, in FIG. 8, the second slot 820 connects to the first slot 810 at a right angle, and the third slot 830 connects to the second slot at a right angle turning in the same angular direction, thereby forming a spiral. The DGS of FIG. 8 includes a total of seven slots formed using the above described spiral pattern.

The DGS structure also includes an opening connecting the beginning of the first slot to the end of the fourth slot. Thus, the first four slots of the DGS structure of FIG. 8 also form a rectangular box having a length defined by the second slot and a width defined by the third slot. The length and width of the rectangular box may be defined in terms of distances “a” and “b” in which “a” is the length of the third slot, and “b” is the difference in length between the second slot and third slot (hence the length of the second slot is equal to a+b).

Figure 9:
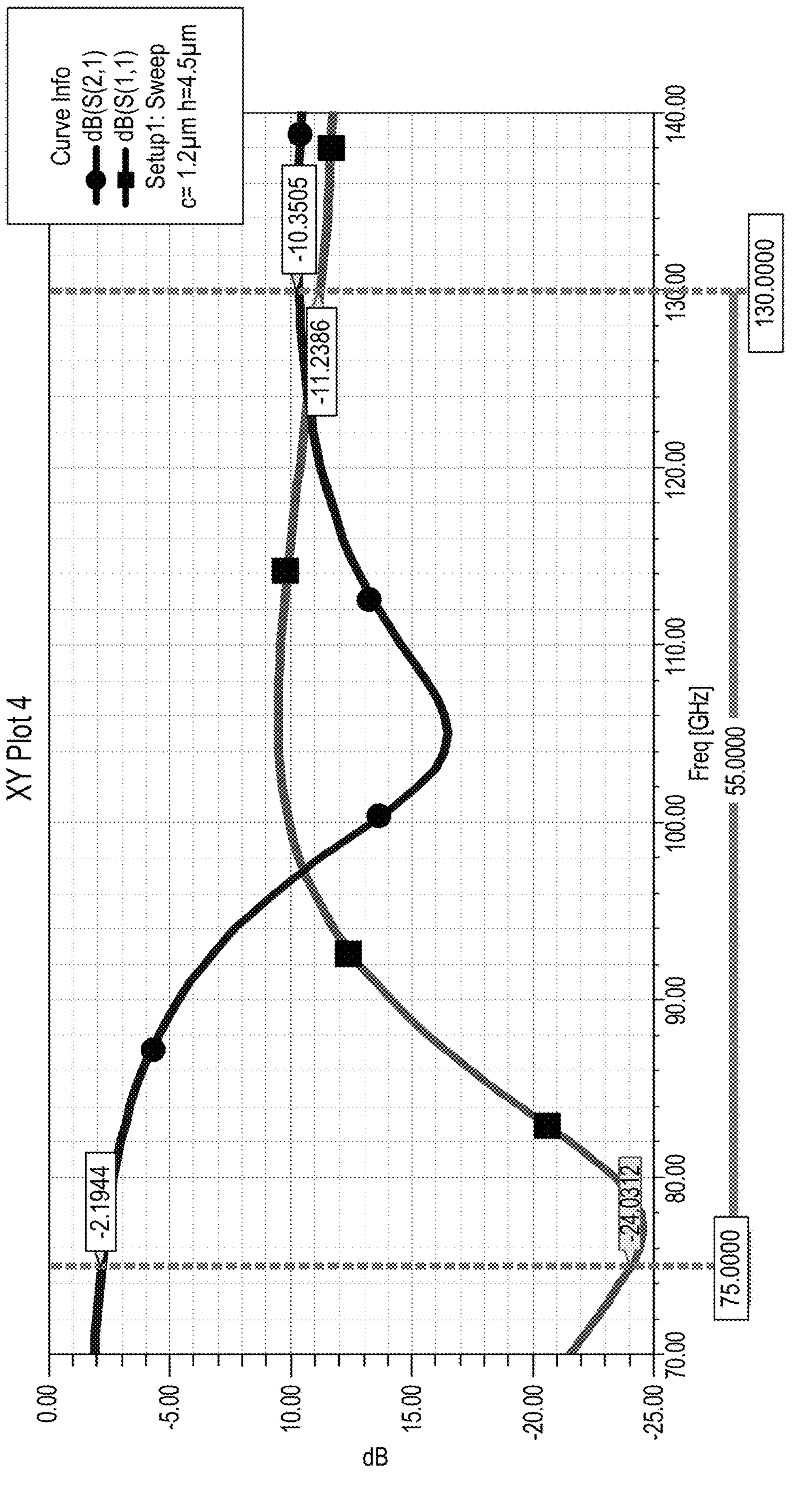
FIG. 9 is a graphical representation of return loss and insertion loss of the switch of FIG. 7.

The switch of FIG. 7 has yet further improved attenuation characteristics. FIG. 9 shows insertion loss and return loss of the switch 700 when the switch is closed. Insertion loss is about −2.2 dB at 75 GHz, about −10.4 dB at 130 GHz, but drops as low as −16.6 dB at 105 GHz. Return loss is about −24.0 dB at 75 GHz, and about −11.2 dB at 130 GHz, but increases to as much as about −9.5 dB at 105 GHz.

Figure 10:
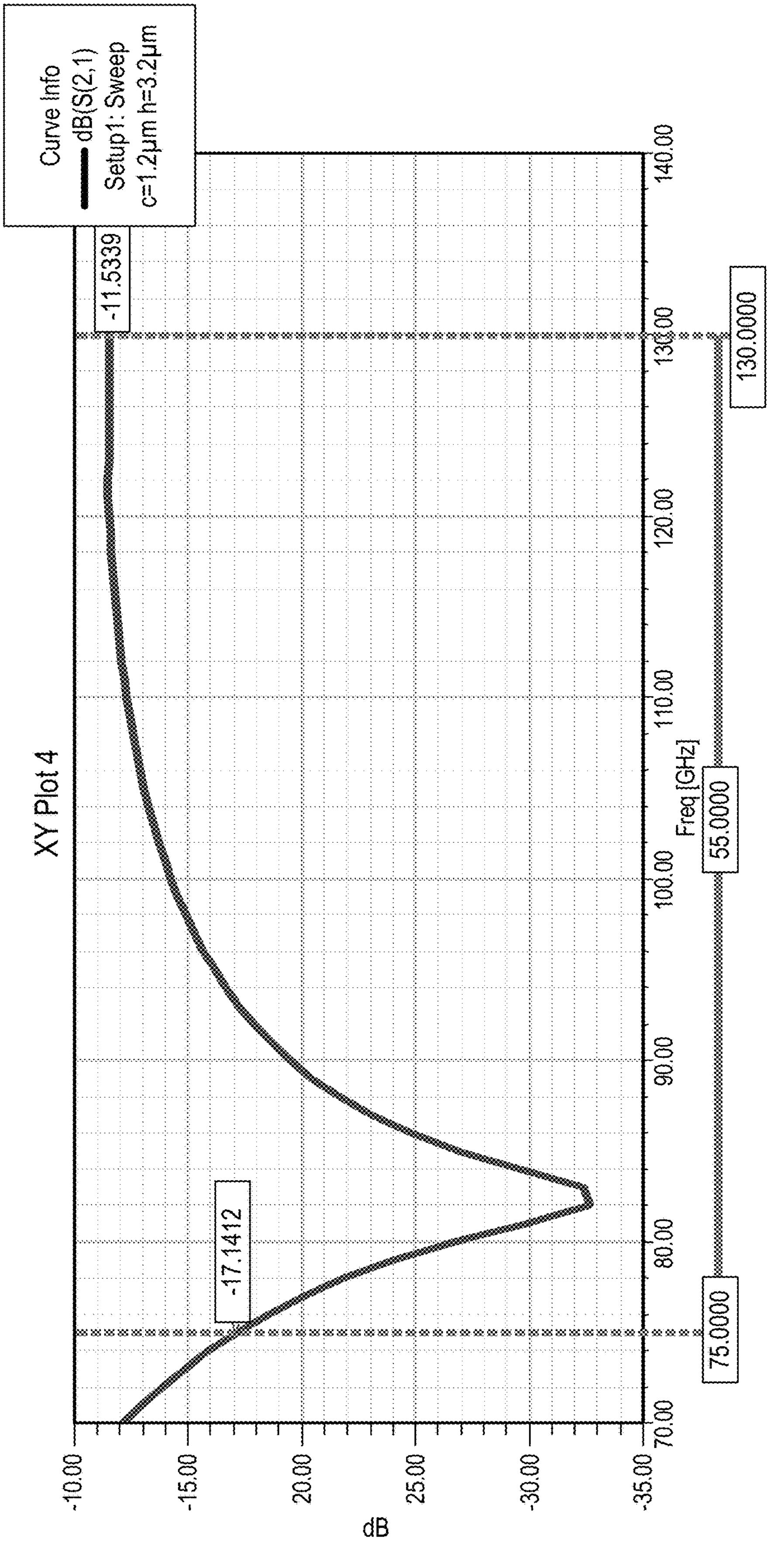
FIG. 10 is a graphical representation of isolation of the switch of FIG. 7.

FIG. 10 shows isolation for the switch 700 when the switch is open. Isolation is about −17.1 dB at 75 GHz and about −11.5 at 130 GHz, and drops as far as about −32.5 dB at 82 GHz.

Despite the improved isolation characteristics of the switch of FIG. 7, FIG. 9 shows that including the DGS in the ground plane of the switch results in higher insertion loss. To overcome the insertion loss, an improvement to the DGS structures of the FIG. 7 switch is shown in FIG. 11.

Figure 11:
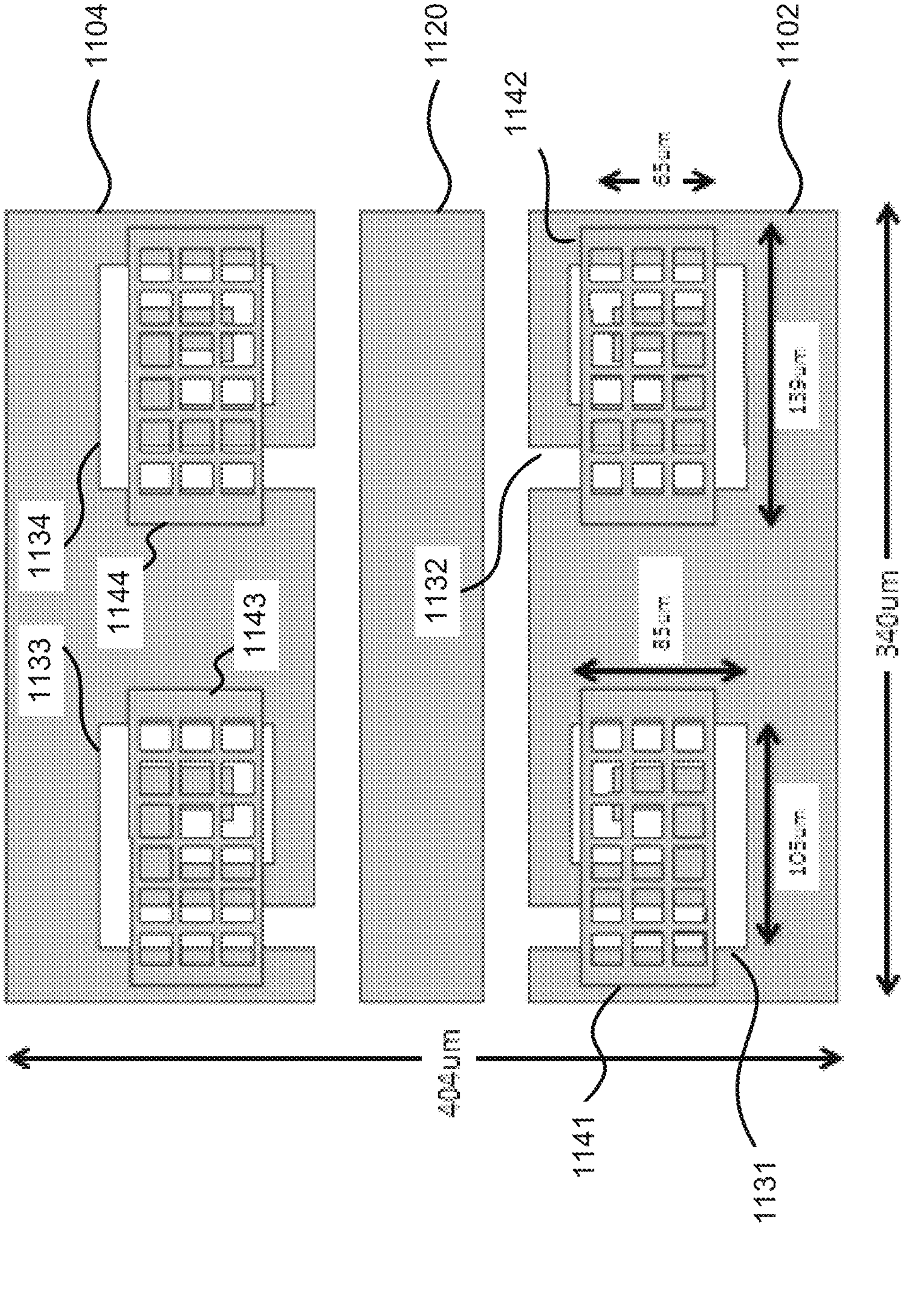
FIG. 11 is a partial plan view of a switch having a defected ground plane structure and secondary switches in accordance with an aspect of the present disclosure.

The switch 1100 of FIG. 11 is largely similar in structure to that of FIG. 7. The switch 1100 has two ground planes 1102, 1104 bisected by a signal line 1120 and has four DGS structures 1131, 1132, 1133, 1134 formed in the ground planes. The length of the ground planes and signal line are about 340 μm, and the cumulative width of the switch is about 404 μm. Switch 1100 differs from FIG. 7 in that each of the DGS structures includes a secondary MEMS switch 1141, 1142, 1143, 144 positioned above the DGS structure. The shape of both the secondary switch and DGS may be rectangular, but the secondary switch may be longer while the DGS structure may be wider. In the example of FIG. 11, each DGS structure is a perforated lattice, and is about 105 μm in length and about 85 μm in width, and overlaid by a secondary switch that is about 139 μm in length and 65 μm in width.

Figure 12:
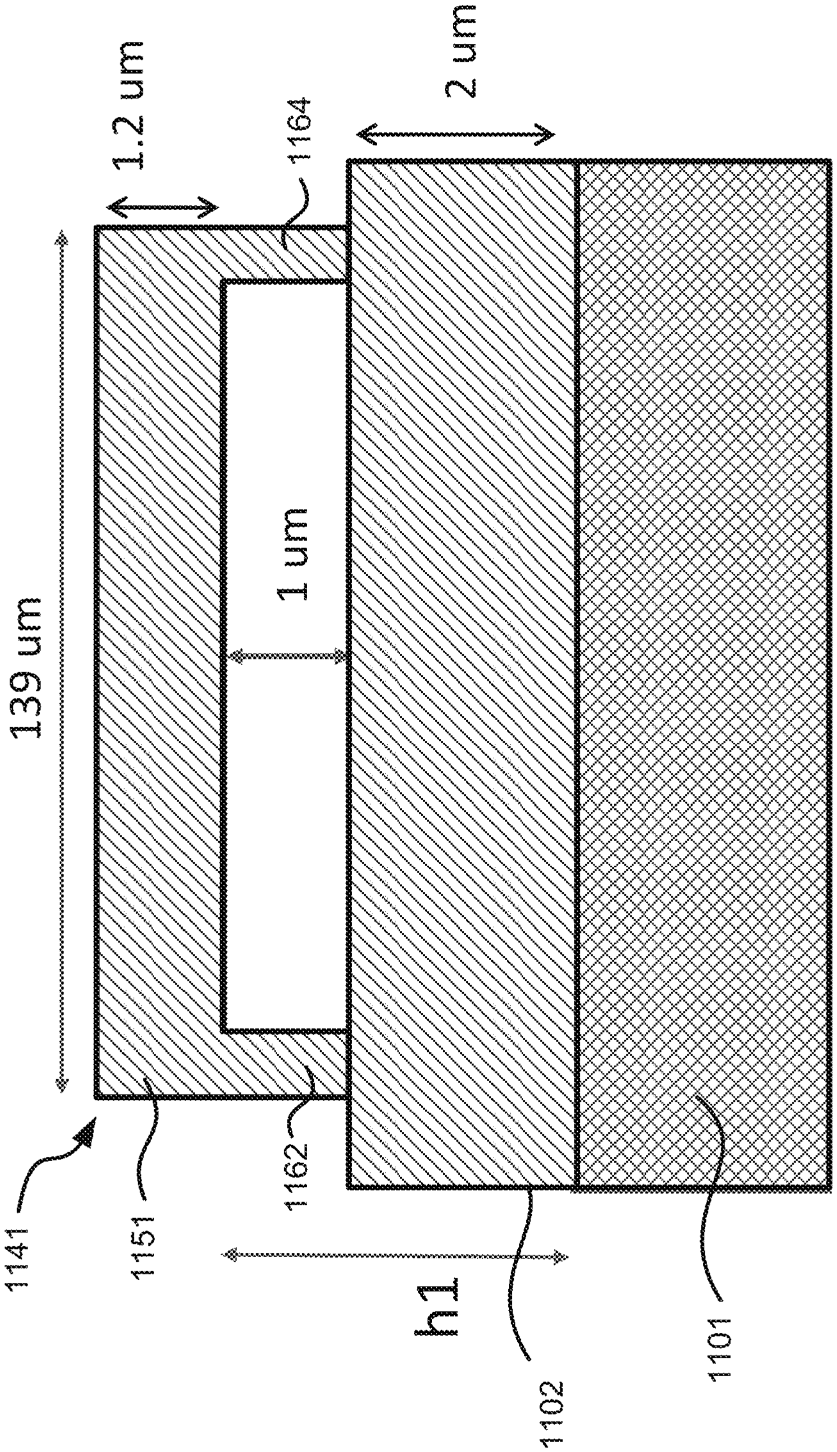
FIG. 12 is a side view of the switch of FIG. 11.

A side view of a single DGS structure of the switch 1100 is shown in FIG. 12, although the DGS structure itself is not shown. The switch 1100 includes a substrate 1101 on which the ground plane 1102 is formed. The ground plane 1102 has a thickness or height of about 2 μm. Although not seen, the slots of the DGS structure 1131 are formed in the ground plane, and may have a depth equal to the height of the ground plane 1102. A secondary switch 1141 is formed above the DGS structure 1131. The secondary switch 1141 includes a beam 1151 supported by two feet 1162, 1164. The supporting feet have a height of about 1 μm, thereby raising the beam 1151 about 1 μm above the DGS and ground plane. Thus, there is an air gap of about 1 μm between the non-deflected beam and the DGS positioned below. The beam thickness or height of the beam 1151 may be about 1.2 μm.

The beam 1151 is connected to an actuator (not shown) to supply a bias voltage, which runs from the beam 1151 to the ground plane 1102 via the feet 1162, 1164. Applying the bias voltage causes the beam 1151 to deflect downward towards the ground plane 1102, thereby affecting the capacitive characteristics of the DGS structure 1131. The amount of voltage applied to the switch 1101 may be continuously variable, and thus the capacitive characteristics of the DGS structure (and its effect on the main MEMS switch of the device) can be varied or tuned.

It has been found that the switch arrangement of FIG. 11 behaves like a metamaterial. This can be seen by first analyzing the transmission and reflection phases of a signal line formed in a coplanar waveguide without the DGS structure of FIG. 11, and then analyzing the transmission and reflection phases of the same signal line with the DGS structure of FIG. 11.

Figure 13:
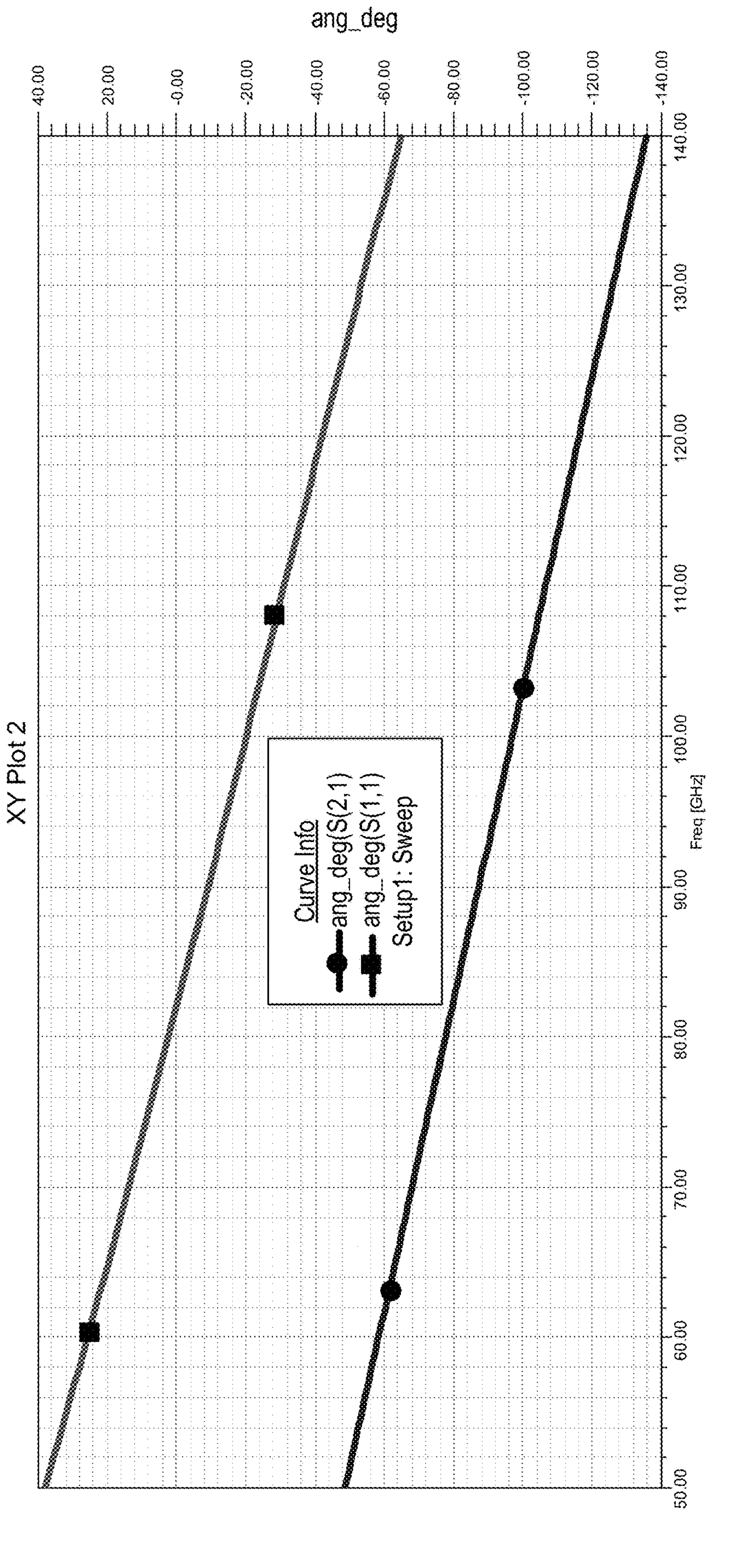
FIG. 13 is a graphical representation of the transmission and reflection phase for the coplanar line of a switch without a defected ground plane structure.

FIG. 13 shows transmission and reflection phases of a signal transmitted across a coplanar waveguide without the DGS structure over a band of millimeter wave frequencies from 50 GHz to 140 GHz. As seen in FIG. 13, any shift in the transmission phase of the signal is met with a substantially equal (within about 20 degrees) shift in the reflection phase.

Figure 14:
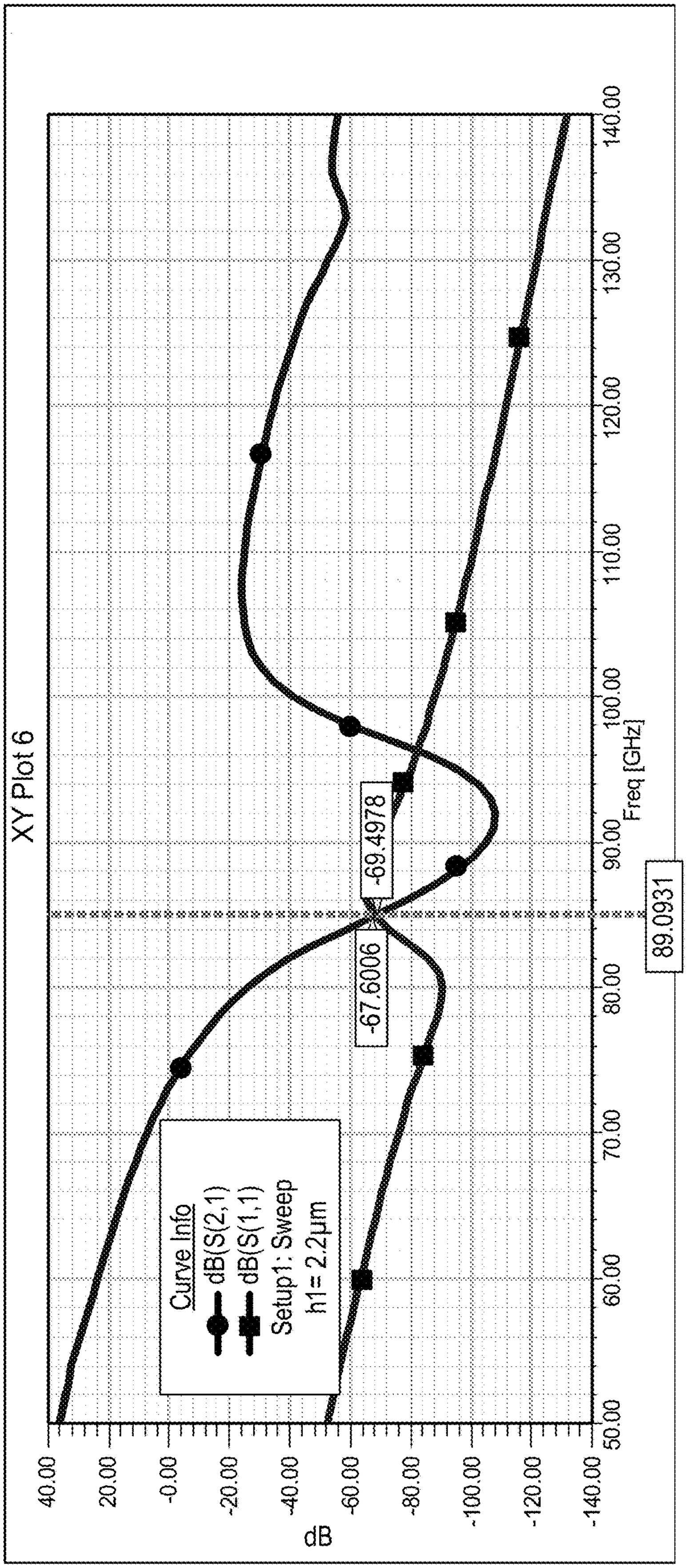
FIGS. 14 and 15 are graphical representations of the transmission and reflection phase for coplanar lines of switches with a defected ground plane structure.

FIG. 14 shows transmission and reflection phases of a signal over the same band of frequencies for the same coplanar waveguide but with the DGS structure incorporated into the waveguide at a height of 2.2 μm, which is the distance from the top surface of the substrate (the basin of the slots of the DGS structure) to the bottom surface of the secondary switch positioned above the DGS structure. As can be seen in FIG. 14, the transmission and reflection phases do not shift equally across the band of frequencies, and even shift in opposite directions, eventually crossing one another at 85 GHz and then crossing back at 96 GHz.

Figure 15:
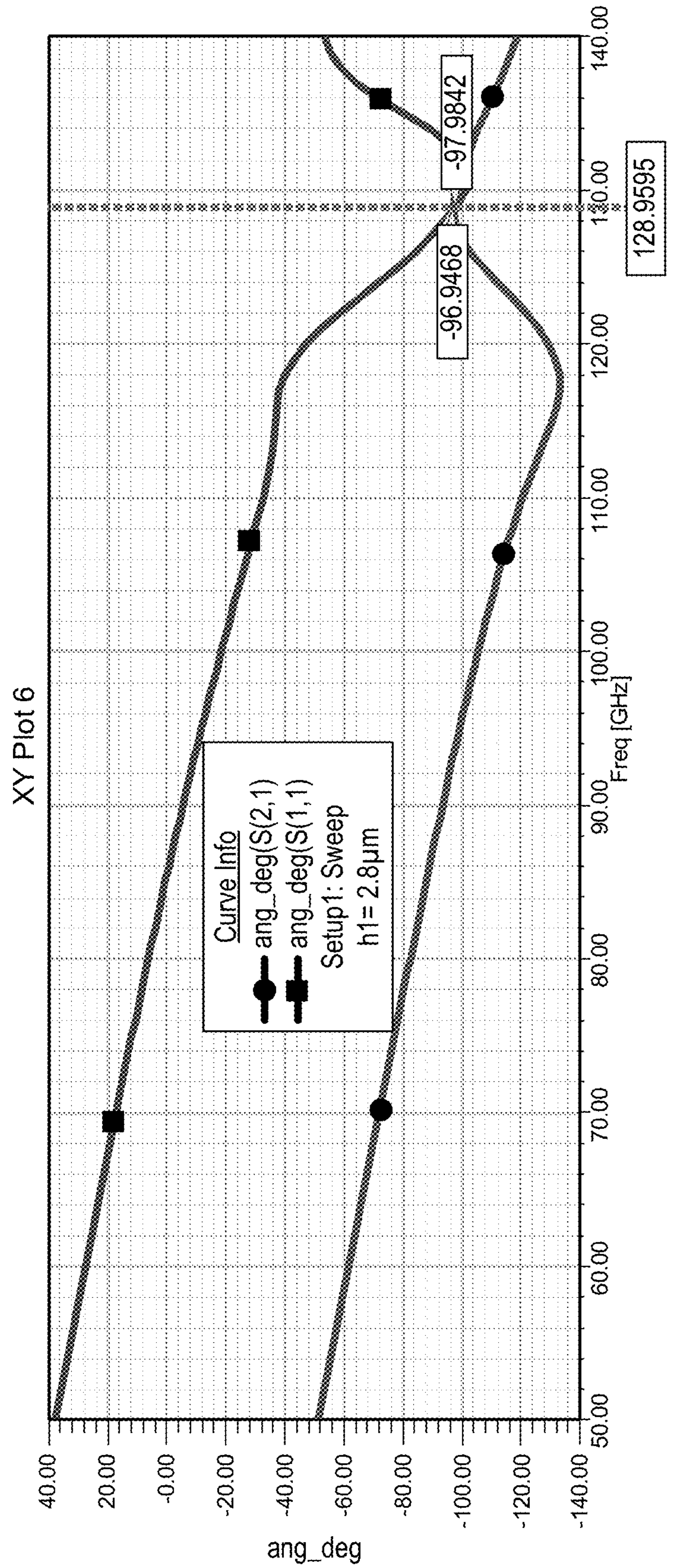

FIG. 15 shows transmission and reflection phases for the same coplanar waveguide but with the DGS structure at a height of 2.6 μm. In FIG. 15, the transmission and reflection phases shift substantially equally until about 110 GHz, but then begin shifting in opposite directions at frequencies above 115 GHz and even cross one another at about 128 GHz.

Figure 16:
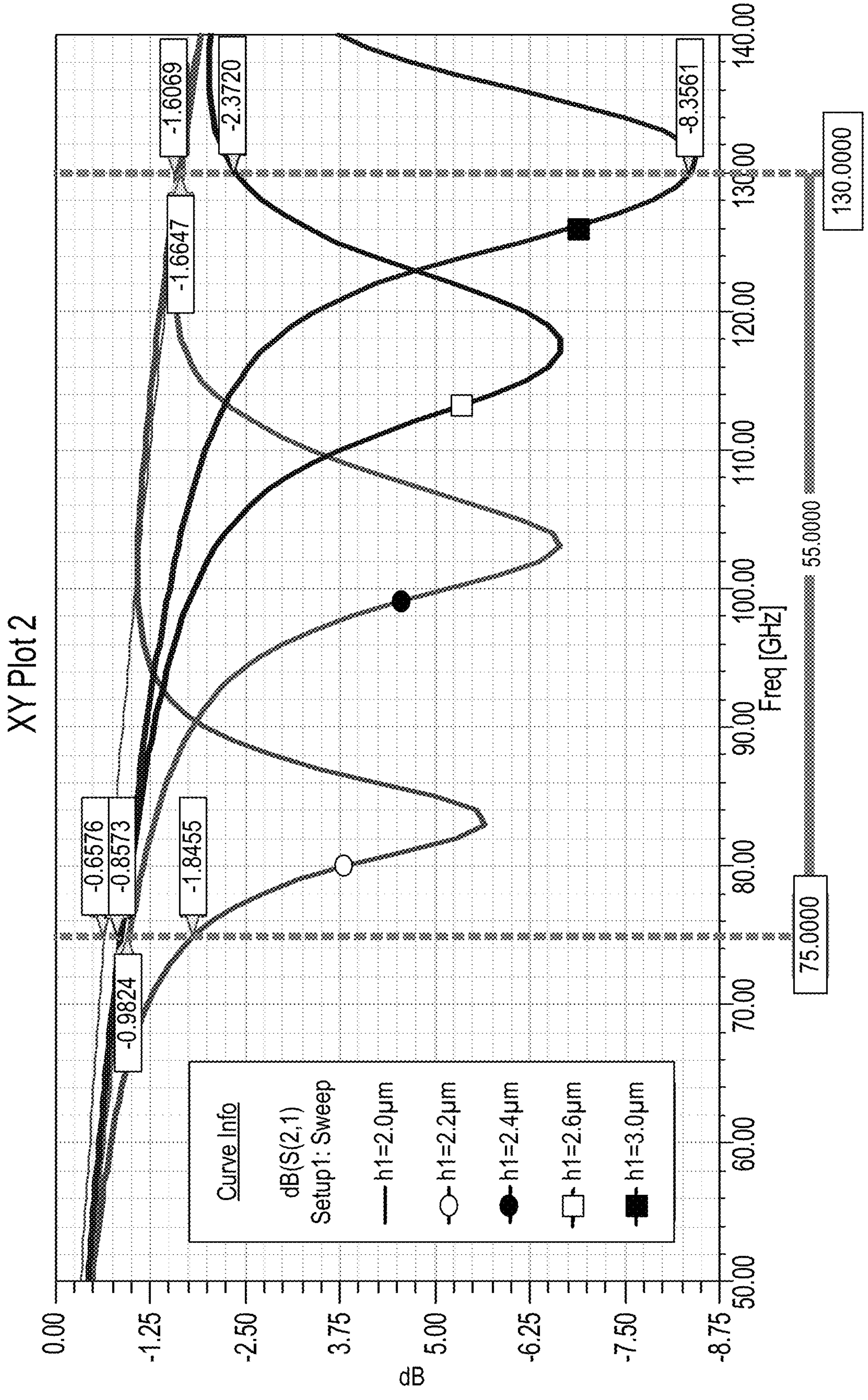
FIG. 16 is a graphical representation of isolation characteristics of the switch of FIG. 10 having varying air gap heights.

The particular resonance frequency of the DGS structure can vary depending on the height of the air gap between the ground plane and the beam. FIG. 16 shows a plot of isolation characteristics for five secondary switches positioned over DGS structures at varying heights. The resonant frequency of the structure is shown to shift to higher frequency as the air gap between the ground plane and beam increases.

Figure 17:
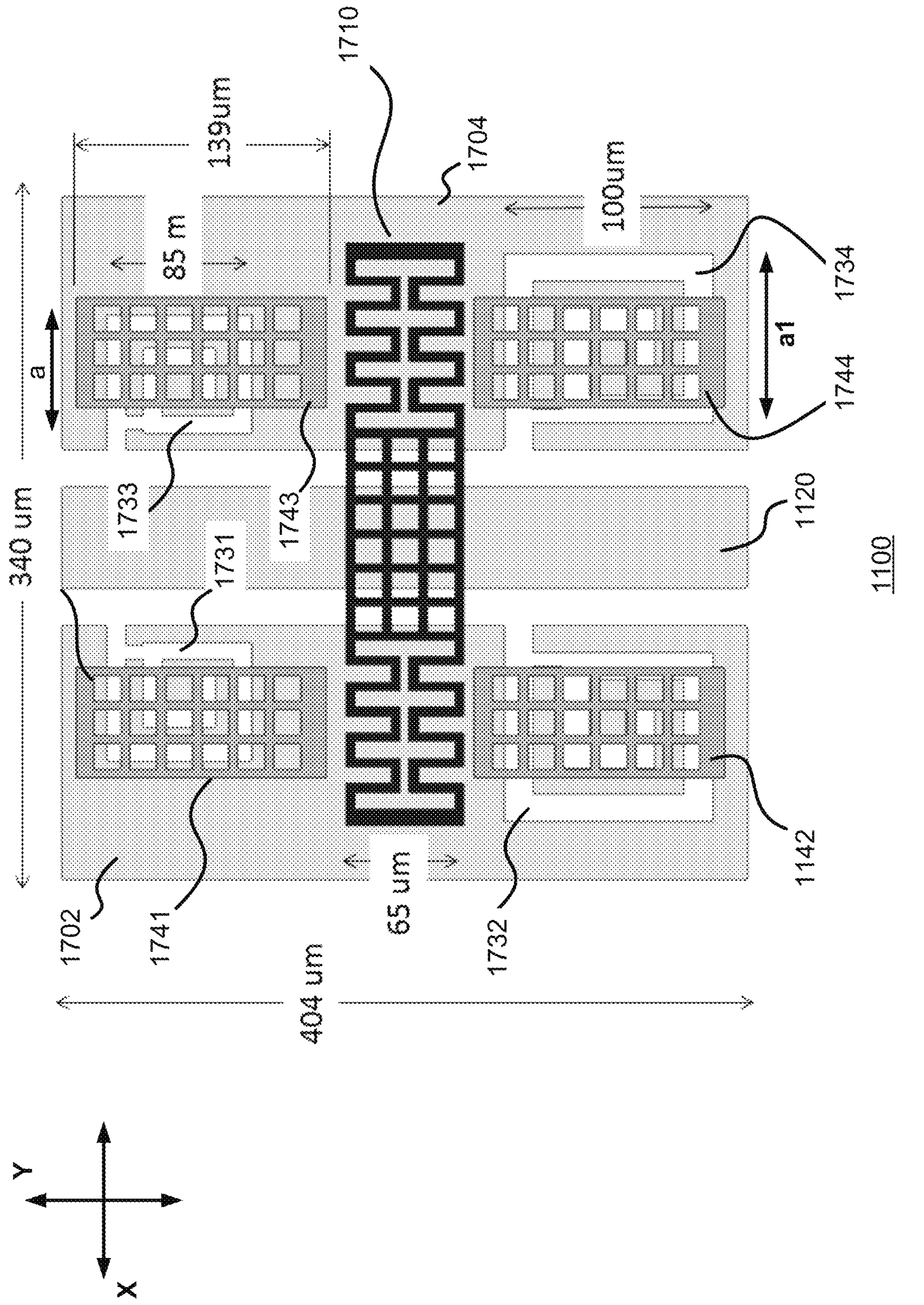
FIG. 17 is a plan view of a switch having a defected ground plane structure and secondary switches in accordance with an aspect of the present disclosure.

An example MEMS shunt switch with DGS structures and overlaid secondary switches is shown in more complete form in FIG. 17. The switch 1700 includes a signal line 1720 positioned between a first ground plane 1702 and a second ground plane 1704, the signal line separated from each ground plane by first and second spaces 1703, 1705, respectively. A primary shunt switch 1710 is positioned on top of, is connected to, and bridges the first and second ground planes 1702, 1704. The primary shunt switch 1710 runs perpendicular to, and is suspended over, the signal line 1720. When a bias voltage is applied to the primary shunt switch 1710, the switch 1710 deflects downward toward the signal line 1720. When the bias voltage is not applied, the switch 1710 deflects back upward to its original position.

A first DGS structure 1731 and a second DGS structure 1732 are formed in the first ground plane 1702. A third DGS structure 1733 and a fourth DGS structure 1734 are formed in the second ground plane 1704. The first and third DGS structures 1731, 1733 have mirror symmetry along a lengthwise axis X of the primary switch 1710, and are a similar shape. The second and fourth DGS structures 1732, 1734 also have mirror symmetry along a lengthwise axis X of the primary switch 1710, and are a similar shape.

In the example of FIG. 17, the first and third DGS structures 1731, 1733 are a different size from the second and fourth DGS structures 1732, 1734. In particular, the second slots of the first and third DGS structures 1731, 1733 are about 85 μm long, whereas the second slots of the second and fourth DGS structures 1732, 1734 are about 100 μm long. The third slots of the first and third DGS structures 1731, 1733 are also shorter than those of the second and fourth DGS structures 1732, 1734. This is in contrast to the four DGS structures shown in each of FIGS. 7 and 11, which all have the same dimensions In some examples, the dimensions of the different DGS structures can be characterized in terms of lengths "a," "a1," and "b," whereby a is the length of the third slot in one DGS structure, a1 is the length of the third slot in the other DGS structure, and b is the difference in length between the second and third slots in one or both size DGS structures. In some examples, the differently sized DGS structures may be designed to have the same value "b," such that the difference between the second and third slot lengths is the same for each structure even when the structures are of different sizes.

Each DGS structure is overlaid by a respective secondary shunt switch 1741, 1742, 1743, 1744. Each secondary shunt switch is connected to its respective ground line, and is suspended over its respective DGS structure with an air gap in between. The secondary shunt switches are rectangular, each of the secondary switches positioned lengthwise parallel to the signal line 1720 and perpendicular to the primary shunt switch 1710. The secondary switches positioned above the first DGS structure 1731 and the third DGS structure 1733 have a mirror symmetry with the secondary switches positioned above the second DGS structure 1732 and the fourth DGS structure 1734 along a lengthwise axis X of the primary switch 1710. Additionally, the secondary switches positioned above the first DGS structure 1731 and the second DGS structure 1732 have a mirror symmetry with the secondary switches positioned above the third DGS structure 1733 and the fourth DGS structure 1734 along a lengthwise axis Y of the signal line 1720. The secondary shunt switches 1741, 1742, 1743, 1744 are also perforated. In the example of FIG. 17, the switches have a grid-like lattice perforation.

Figure 18:
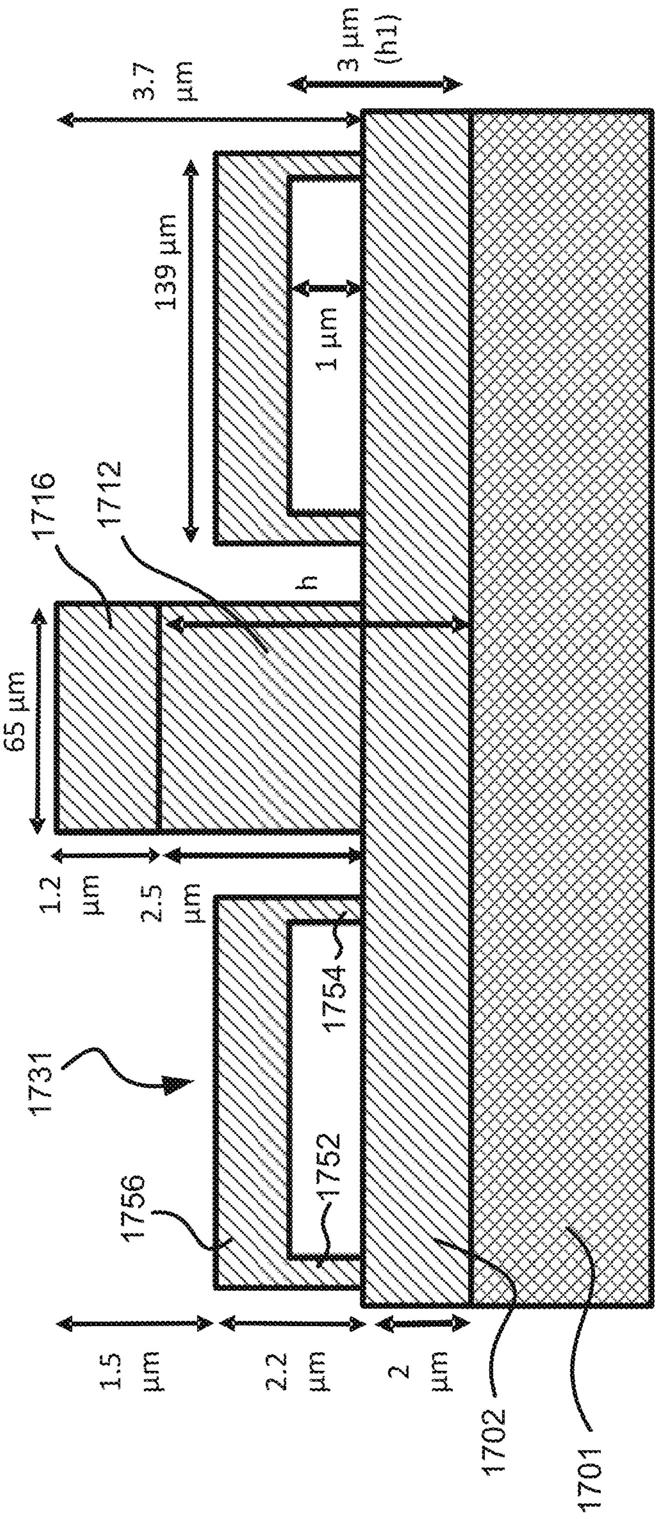
FIG. 18 is a side view of the switch of FIG. 17.

FIG. 18 shows a side view of the switch of FIG. 17 from the viewpoint along either side of FIG. 17. The switch 1700 is formed on a substrate 1701. A ground plane 1702 is formed over the substrate 1701, and the primary switch 1710 is formed on top of the ground plane 1702. The primary switch 1710 has two feet 1712 (the second foot is obstructed by foot 1712 in FIG. 18) supporting a beam 1716. Two secondary switches 1731, 1732 are positioned on either side of the primary switch 1710. Each of the secondary switches also includes two feet 1752, 1754 supporting a beam 1756. DGS structures (not shown) are formed in the ground plane 1702 at respective positions underneath the secondary switches 1731, 1732.

In the example of FIGS. 17 and 18, the substrate and ground planes have a length of about 404 μm, and a width of about 340 μm. The ground planes have a thickness of about 2 μm. The primary switch 1710 extends the length of the substrate, and the primary switch feet 1712 and beam 1716 have a width of about 65 μm. The feet 1712 have a height of about 2.5 μm, and the beam 1716 has a thickness of about 1.2 μm. The secondary switches 1731 have a length of about 139 μm, and the secondary switch feet 1752, 1754 and beam 1756 have a width of about 65 μm. The feet 1752 have a height of about 1 μm, and the beam 1756 has a thickness of about 1.2 μm. Thus, the entire switch 1700 can be formed on top of the substrate 1701 within a 5.7 μm space.

Figure 19:
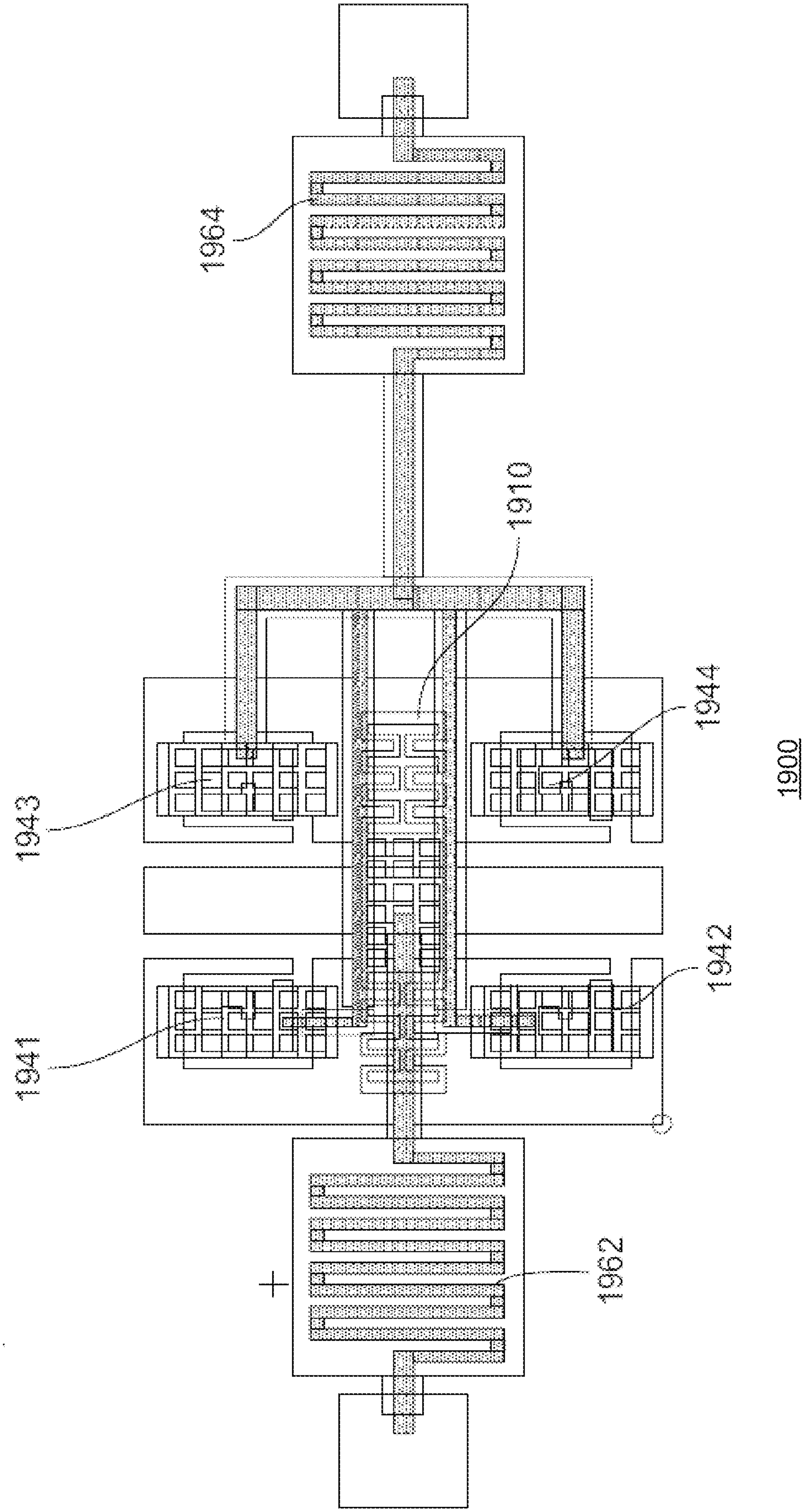
FIG. 19 is a schematic diagram of the switch of FIG. 17.

FIG. 19 shows an example layout of a switch 1900, showing the connections between the primary switch 1910 and secondary switches 1941-1944, a first actuator 1962, and a second actuator 1964. The first actuator 1962 is connected to the primary switch 1910 and configured to provide a bias voltage to the primary switch. The second actuator 1964 is connected to each of the secondary switches 1941-1944 and is configured to provide a bias voltage to the secondary switches.

In operation, the primary switch 1910 may be either ON (bias voltage provided from the first actuator 1962) or OFF (no bias voltage provided by the first actuator 1964). When the primary switch is ON, the primary switch beam deflects downward, resulting in a large shunt capacitance that blocks RF signals from propagating along the signal line 1920. When the primary switch is OFF, the primary switch beam deflects back upward (at rest), reducing the shunt capacitance and permitting RF signals to propagate along the signal line 1920.

Figure 20:
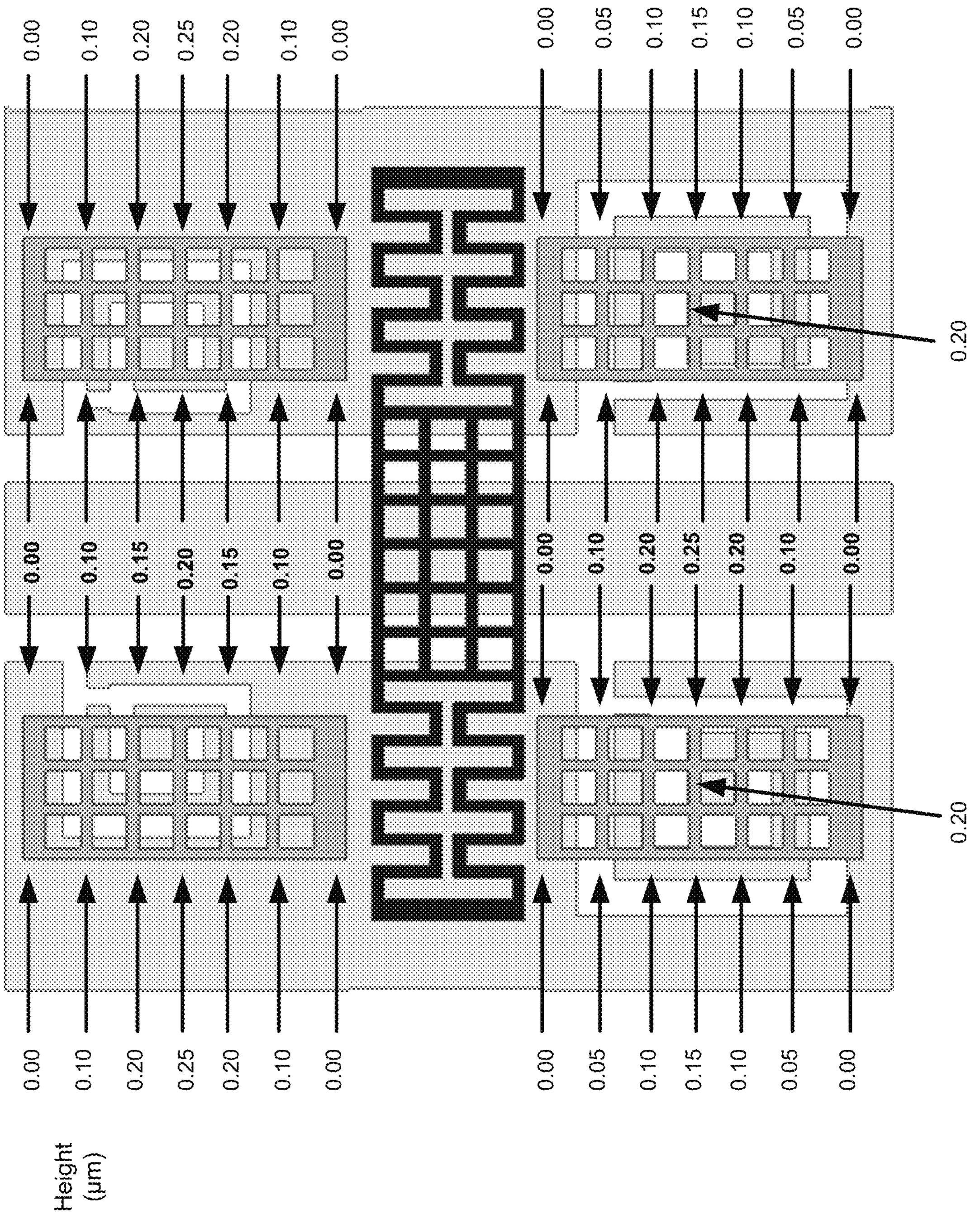
FIG. 20 is another plan view of the switch of FIG. 17.

When the primary switch 1910 is OFF, the secondary switches 1941-1944 may be turned ON in order to negate the effects of the DGS structures towards insertion and return loss. A bias voltage is applied from the second actuator 1964 to each of the secondary switches 1941-1944, thereby causing the switches to deflect downward toward the DGS structures and create a shunt capacitance blocking the effects of the DGS structure. FIG. 20 shows the amount of downward deflection at several points of the secondary switches (measured in μm) when the secondary switches are actuated.

Figure 21:
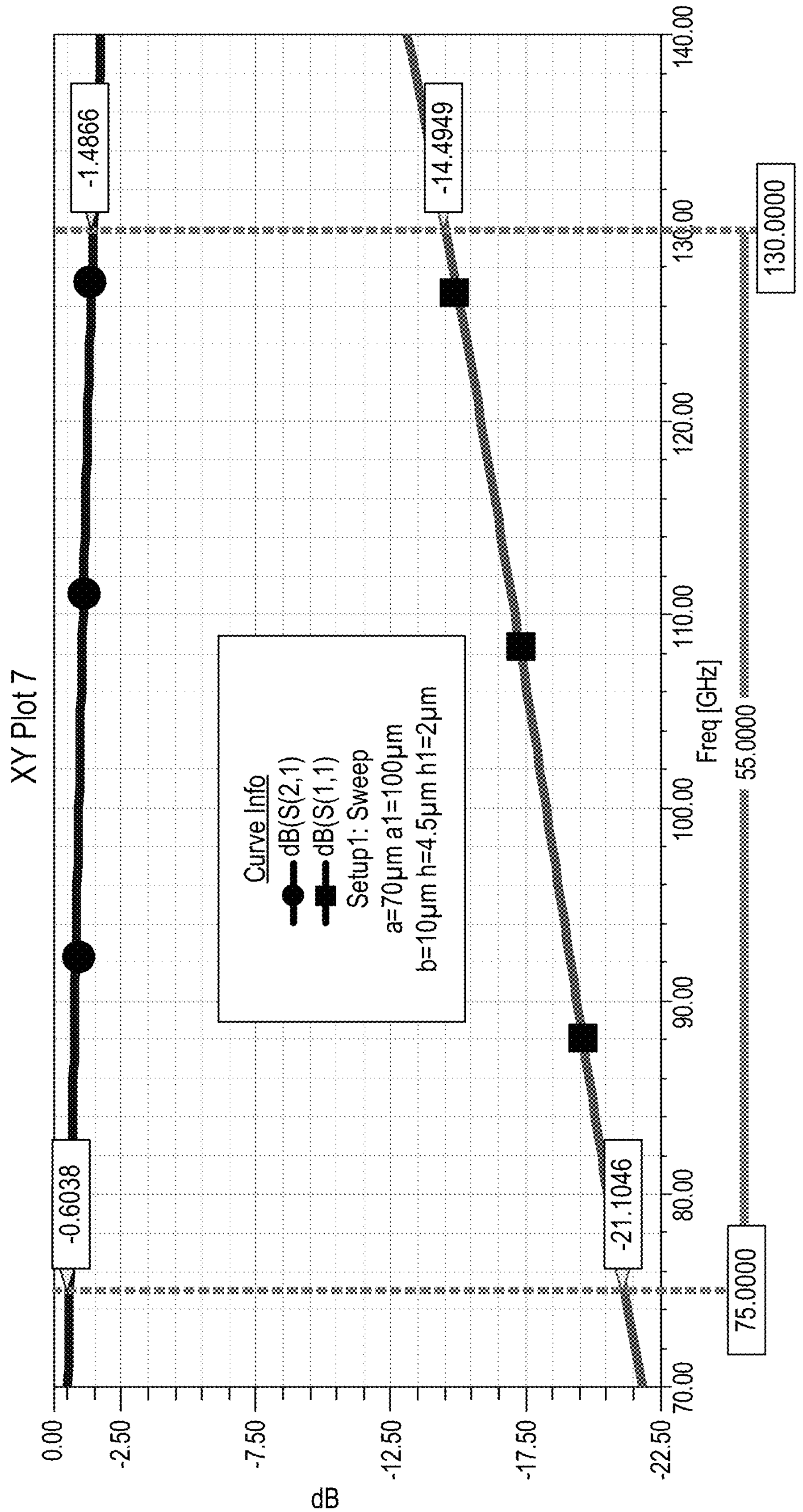
FIG. 21 is a graphical representation of return loss and insertion loss of the switch of FIG. 17 with the secondary switches activated.

FIG. 21 shows return loss and insertion loss characteristics for the switch 1900 when the primary switch is OFF and the secondary switches are ON. At 75 GHz, insertion loss is as low as about −0.6 dB and return loss is as low as about −21.1 dB. At 130 GHz, insertion loss is still relatively low at about −1.5 dB, and return loss is also relatively low at −14.5 dB.

Figure 22:
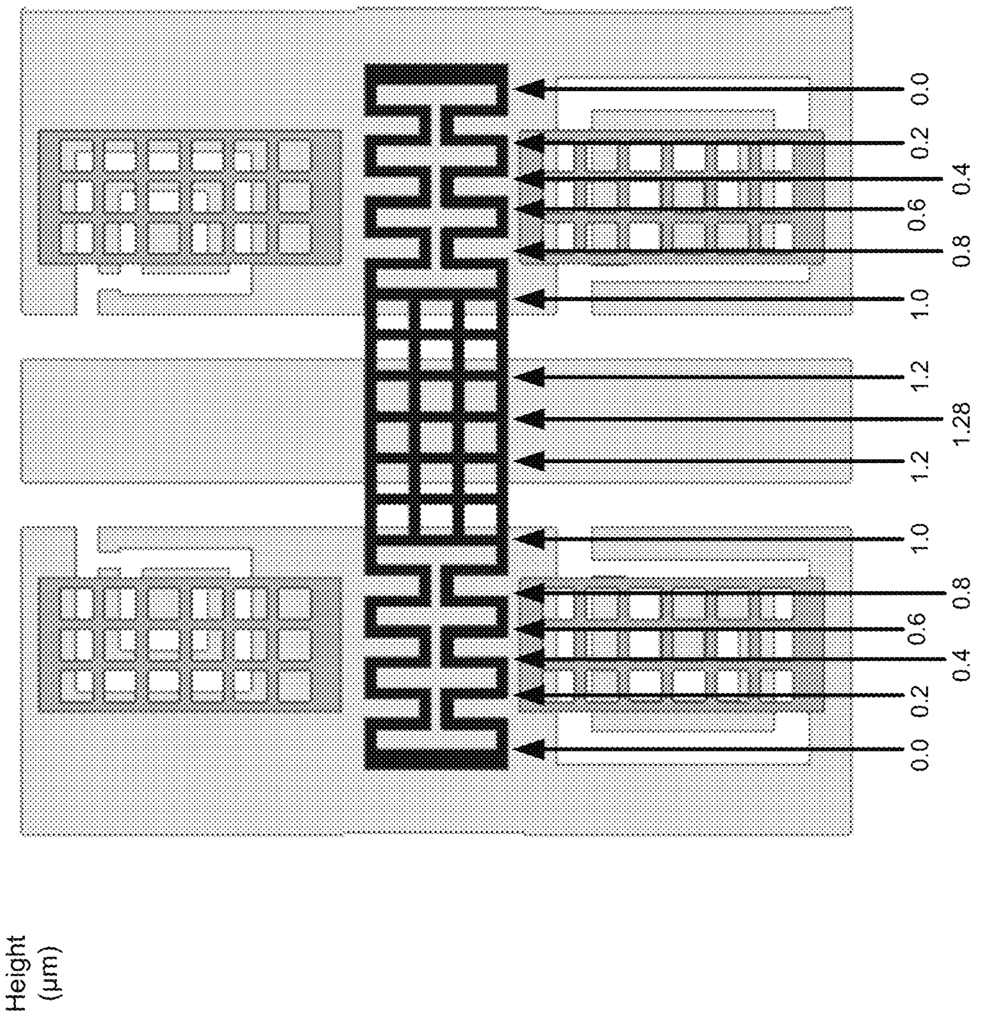
FIG. 22 is yet another plan view of the switch of FIG. 17.

Returning to FIG. 19, when the primary switch 1910 is ON, the secondary switches 1941-1944 may be turned OFF in order to get the benefit of the DGS structures towards isolation. No bias voltage is applied from the second actuator to the secondary switches 1941-1944, so the switches remain separated from the DGS structures underneath by the air gap. FIG. 22 shows the amount of downward deflection at several cross-sections of the primary switches (measured in μm) when the primary switch is actuated. Deflection along the entire width of the primary switch is uniform for any given point along the length of the switch.

Figure 23:
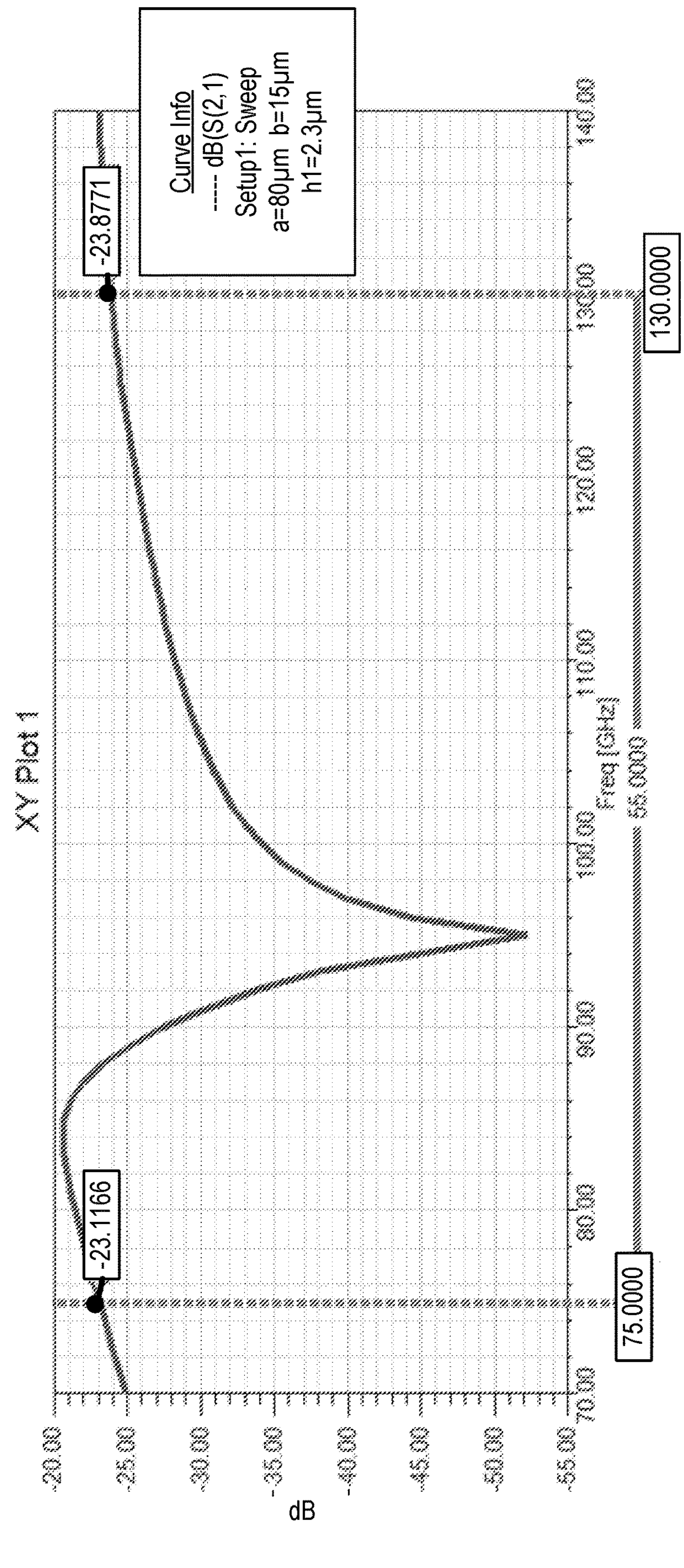
FIGS. 23-25 are graphical representations of isolation characteristics of the switch of FIG. 17 with the secondary switches not activated and having different defected ground plane structures.
Figure 24:
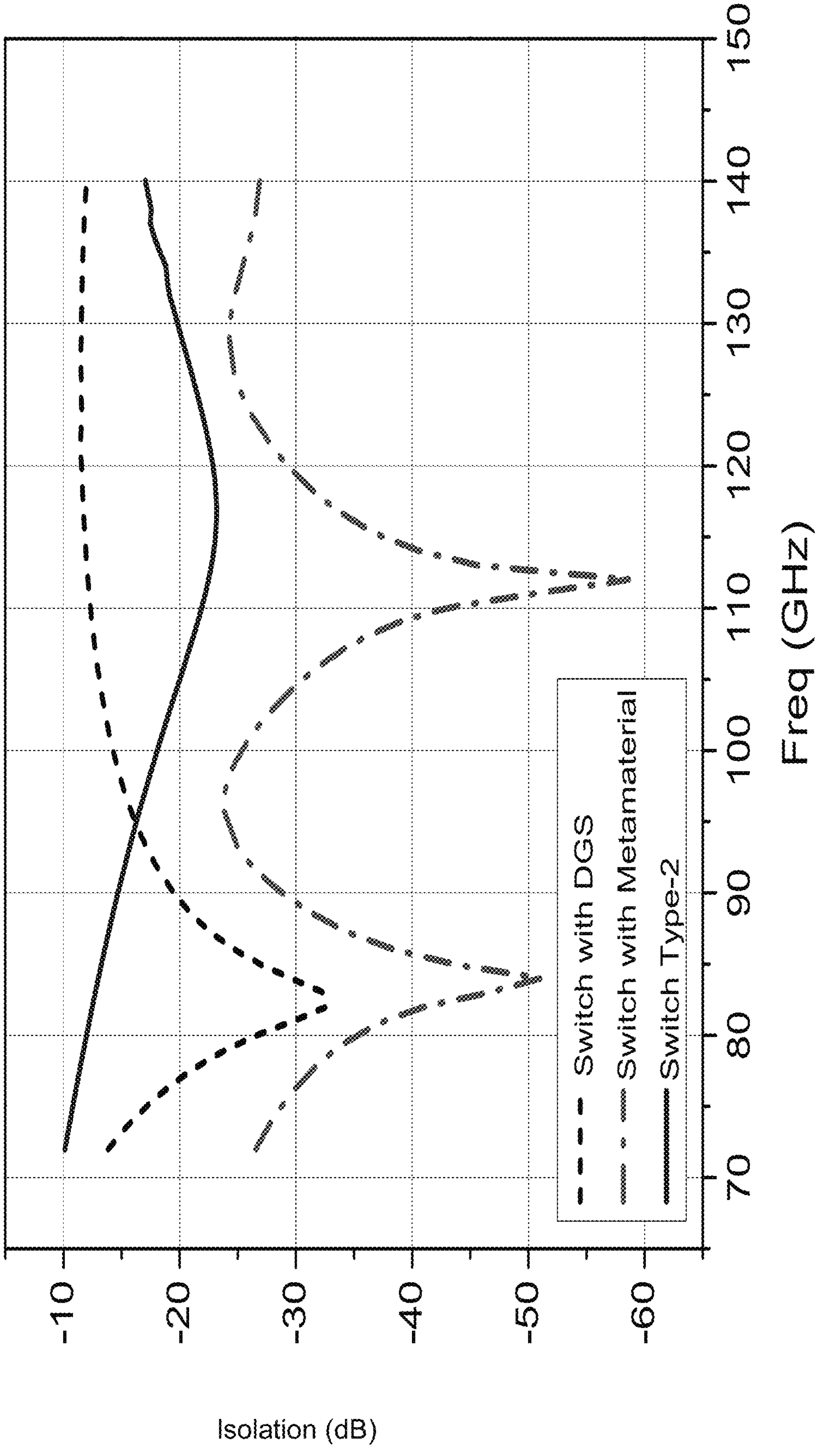
Figure 25:
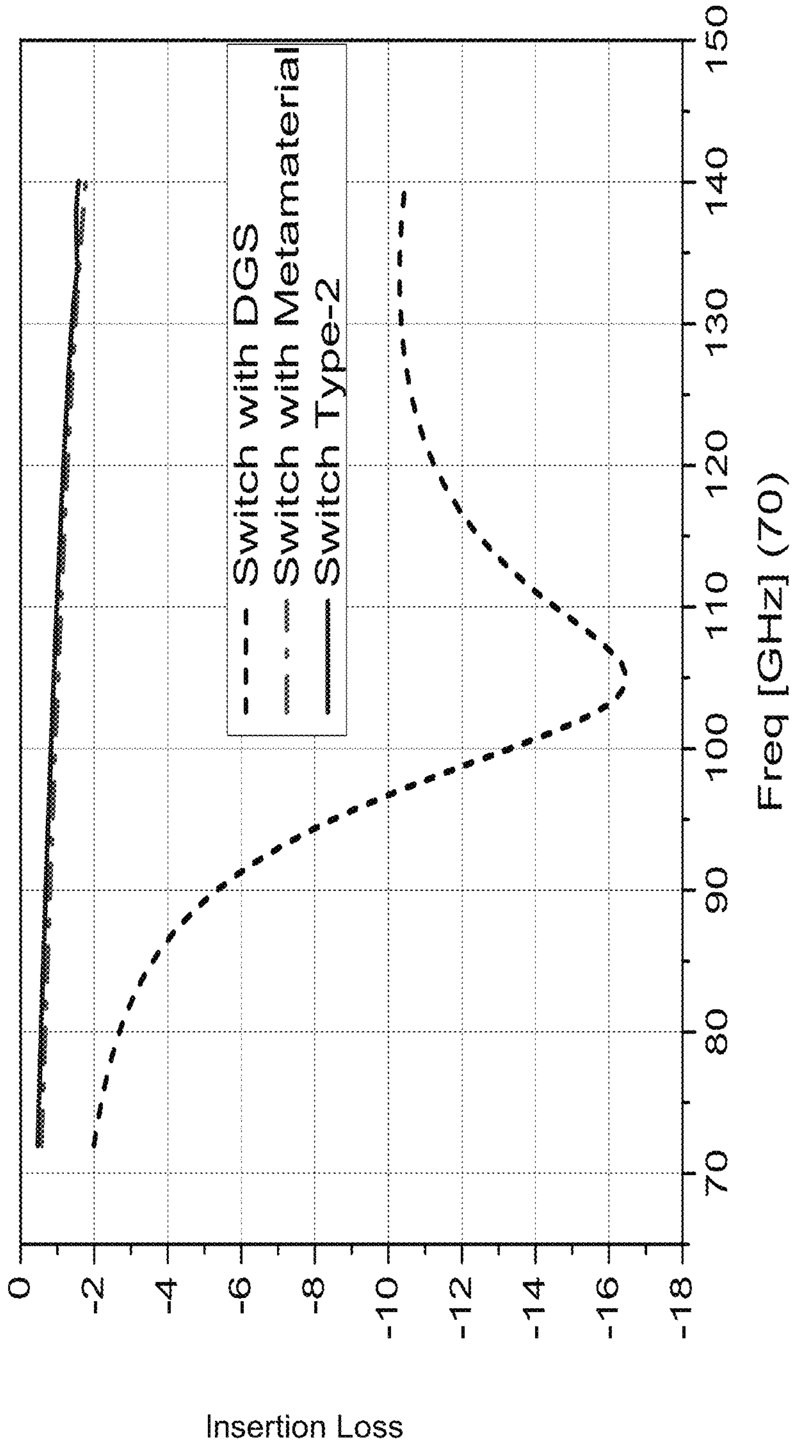

FIGS. 23-25 show isolation characteristics for the switch 1900 when the primary switch is ON and the secondary switches are OFF. In the example of FIG. 23, the same DGS structure is used. This leads to a significant improvement of isolation at a relatively narrow band (e.g., less than about 10 GHz, between 90 GHz and 100 GHz). At 75 GHz, isolation is about −23.1 dB, and at 130 GHz, isolation is about −23.9 dB. But at about 95 GHz, isolation is improved to about −52 dB.

In the examples of FIGS. 24 and 25, different DGS structures are used. This leads to an overall improvement of isolation over a wider band of frequencies. The structure represented in FIG. 24 yields improved isolation at about 84 GHz (about −51 dB) and at about 112 GHz (about −59 dB), and is not worse than about −24 dB between 75 and 130 GHz. The structure represented in FIG. 25 achieves its best isolation at about 98 GHz (about −41.5 dB), but the improved isolation characteristics do not sharply drop off. In this regard, isolation of −30 dB or better can be achieved across a wide band of frequencies, from about 85 GHz to about 110 GHz.

As seen from the attenuation characteristics of FIGS. 21 and 23, providing DGS structures with capacitive shunt switches above the DGS structures is an effective way of incorporating the benefits of DGS for improved isolation when RF signals are blocked, while at the same time negating the detriments caused by the DGS to insertion loss and return loss when RF signals are propagating. In this respect, incorporation of DGS structures and corresponding shunt switches is an improvement to RF MEMS design and operation.

Table 1 below provides a summary of the actuation voltage, isolation and insertion loss characteristics for the above-described switch designs with air gaps (and cantilever beam heights) of about 2.5 μm:

TABLE 1

| Parameters | Shunt Switch (FIGS. 2-3) | Shunt Switch (FIG. 5) | Shunt Switch + DGS w/o Switches (FIG. 7) | Shunt Switch + DGS w/ Switches (FIG. 17) |
|---|---|---|---|---|
| Shunt Switch Actuation | 37 V | 17 V | 17 V | 17 V |

TABLE 1-continued

| Parameters | Shunt Switch (FIGS. 2-3) | Shunt Switch (FIG. 5) | Shunt Switch + DGS w/o Switches (FIG. 7) | Shunt Switch + DGS w/ Switches (FIG. 17) |
|---|---|---|---|---|
| Voltage Isolation (75-130 GHz) | −12 dB to −19 dB | −15 dB to −24 dB | −11 dB to −32 dB | −24 dB to −59 dB |
| Insertion Loss | 0.74 dB | 0.6 dB | −2 dB to −11 dB | 0.6 dB |
| Material | Molybdenum | Gold | Gold | Gold |
| Cantilever Height | 2.5 um | 2.5 um | 2.5 um | 2.5 um |

Measurements are provided for the above example switches and designs. However, it will be readily appreciated that the particular dimensions of the RF MEMS switches, structures, and waveguide components may be altered without deviating from the core concepts of the present disclosure. For instance, the substrate, ground plane and signal line may be made longer or shorter, wider or narrower, and thicker or thinner Additionally, the primary and secondary switches may be designed in different shapes having different lengths, different widths, or different patterns, such as to enable a desired amount of deflection. Similarly, the air gap between switches and the components positioned underneath may be altered. And the shape and size of the DGS structures may also be altered.

Figure 26:
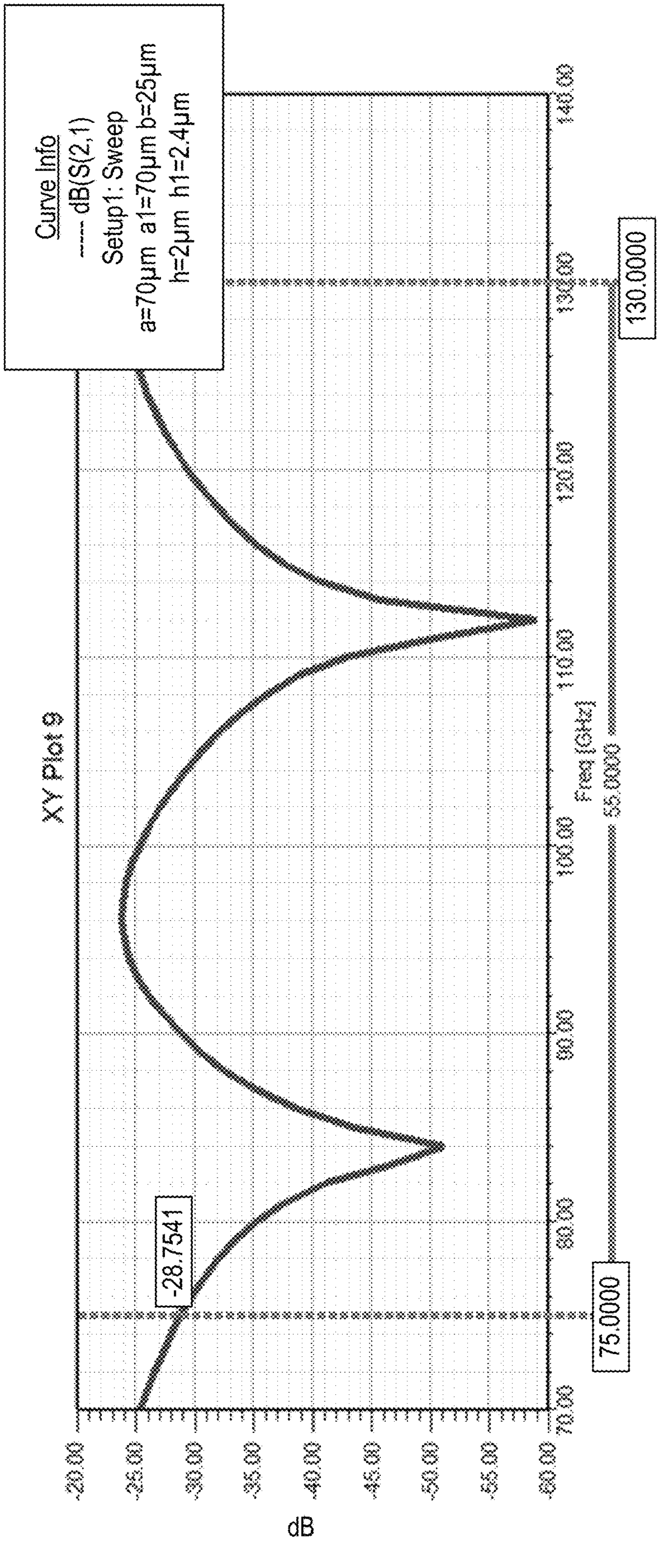
FIG. 26 is a graphical representation of isolation characteristics of the switch of FIG. 17 having varying air gap heights.

The switch operations described above contemplate actuating either the primary switch but not the secondary switches, or actuating the secondary switches but not the primary switch. However, it will be readily appreciated that other forms of operation are possible. For example, in some cases, improved isolation characteristics may be achieved by providing a bias voltage to all of the primary and secondary switches. FIG. 26 shows isolation characteristics for several switches having different DGS and secondary switch arrangements, in which both switches are actuated. Actuating the secondary switch results in improved isolation characteristics over a narrow band of frequencies. The particular band at which the improved isolation occurs varies depending on the air gap height between the switches and DGS structures. As the air gap increases, the frequency band at which the best isolation for the switch occurs shifts upward. In particular, for an air gap of 2.2 μm isolation of about −52 dB is achieved at about 85 GHz, for an air gap of 2.3 μm isolation of about −52 dB is achieved at about 85 GHz, for an air gap of 2.4 μm isolation of about −52 dB is achieved at about 85 GHz, for an air gap of 2.5 μm isolation of about −52 dB is achieved at about 85 GHz, for an air gap of 2.6 μm isolation of about −52 dB is achieved at about 85 GHz, for an air gap of 2.7 μm isolation of about −52 dB is achieved at about 85 GHz, for an air gap of 3.0 μm isolation of about −52 dB is achieved at about 85 GHz. This demonstrates the relative flexibility of the proposed combination of DGS structures with secondary switches for providing improved isolation across a wide range of high frequencies.

Figure 27:
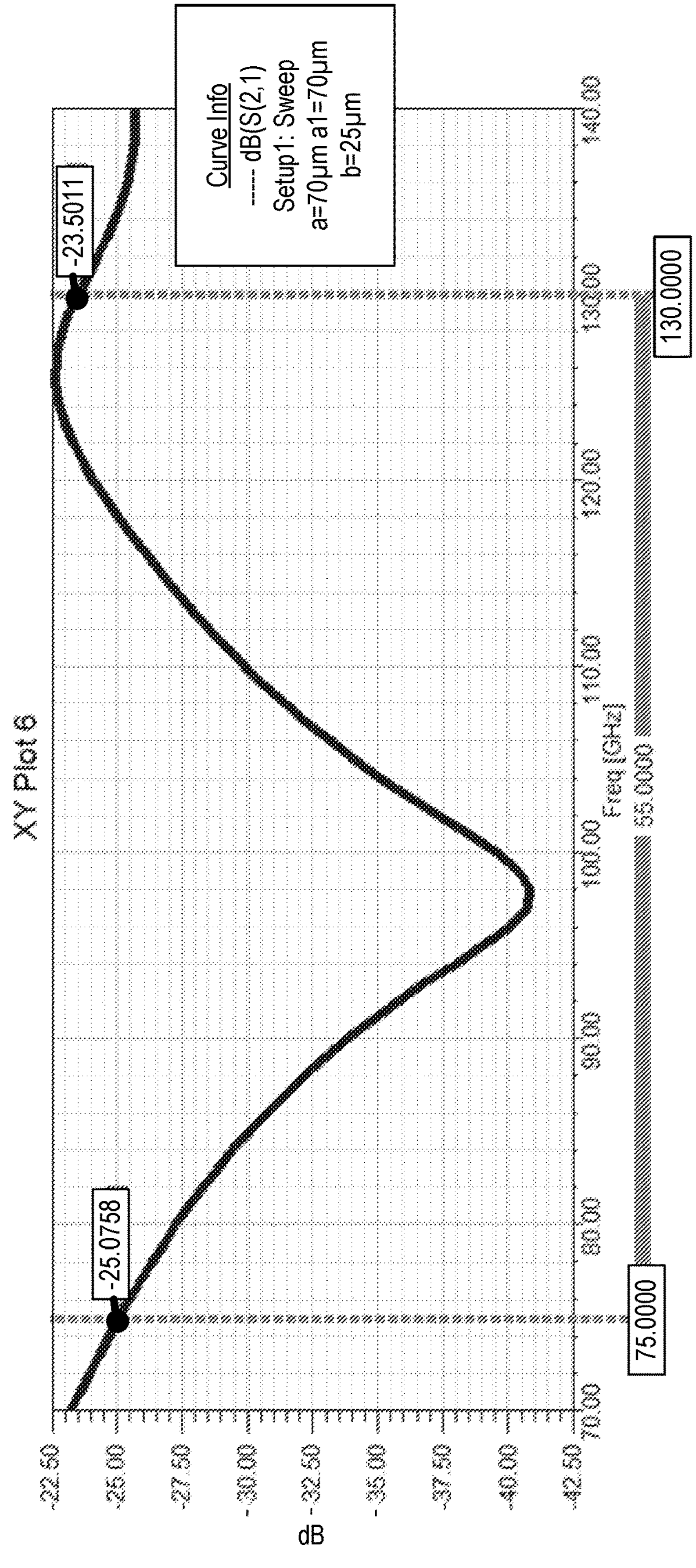
FIG. 27 is a graphical representation of isolation for switches in accordance with the present disclosure.
Figure 28:
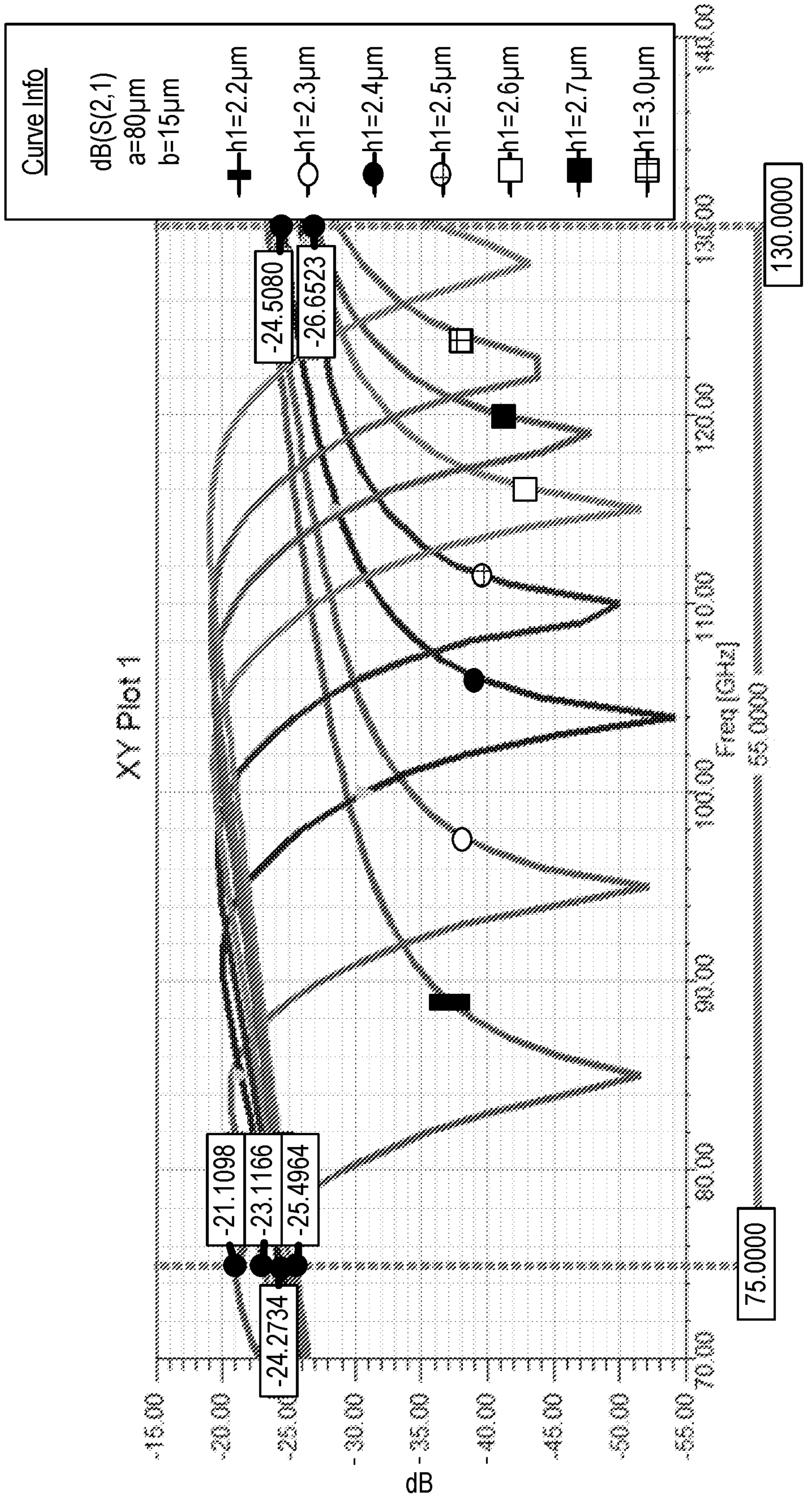
FIG. 28 is a graphical representation of insertion loss for switches in accordance with the present disclosure.

Overall, it is shown that providing both the DGS structures and secondary switches can achieve improvements in both insertion loss and isolation. These dual improvements are in contrast to the tradeoffs conventionally seen when using either only a shunt switch (good insertion loss, poor isolation) or only a DGS structure (improved isolation, but worse insertion loss). These findings are further summarized in the charts of FIGS. 27 and 28, which show the isolation and insertion loss characteristics of the respective structures discussed above.

As noted above, the proposed combination of a primary shunt switch, DGS structures and secondary shunt switches, is shown to behave like a metamaterial. In addition to this solution, it is also proposed to improve stiction of the MEMS switch using metamaterial layers within the design of the switch contacts, as described in greater detail herein.

It is possible to reduce the likelihood of stiction by increasing the bias voltage applied to the switch. Alternatively, instead of increasing bias voltage, the electric field of the switch can be increased by distancing the top electrode from ground. This can be accomplished, for example, by sandwiching the conductive layer (e.g., gold) between two dielectric layers (e.g., silicon oxynitride).

As a further alternative, the beam can be modified to maximize its restoring force without having to increase the bias voltage. Improved restoring force is influenced by such parameters as increased plate size, shortened beam length, or increased dielectric thickness.

In addition to controlling the distance between the electrode and ground and controlling the structural parameters of the switch contacts, it is also contemplated in the present disclosure to weaken or reverse the forces applied to the switch contacts due to their proximity. These forces are described in greater detail using the arrangements illustrated in FIGS. 29 and 30.

Figure 29:
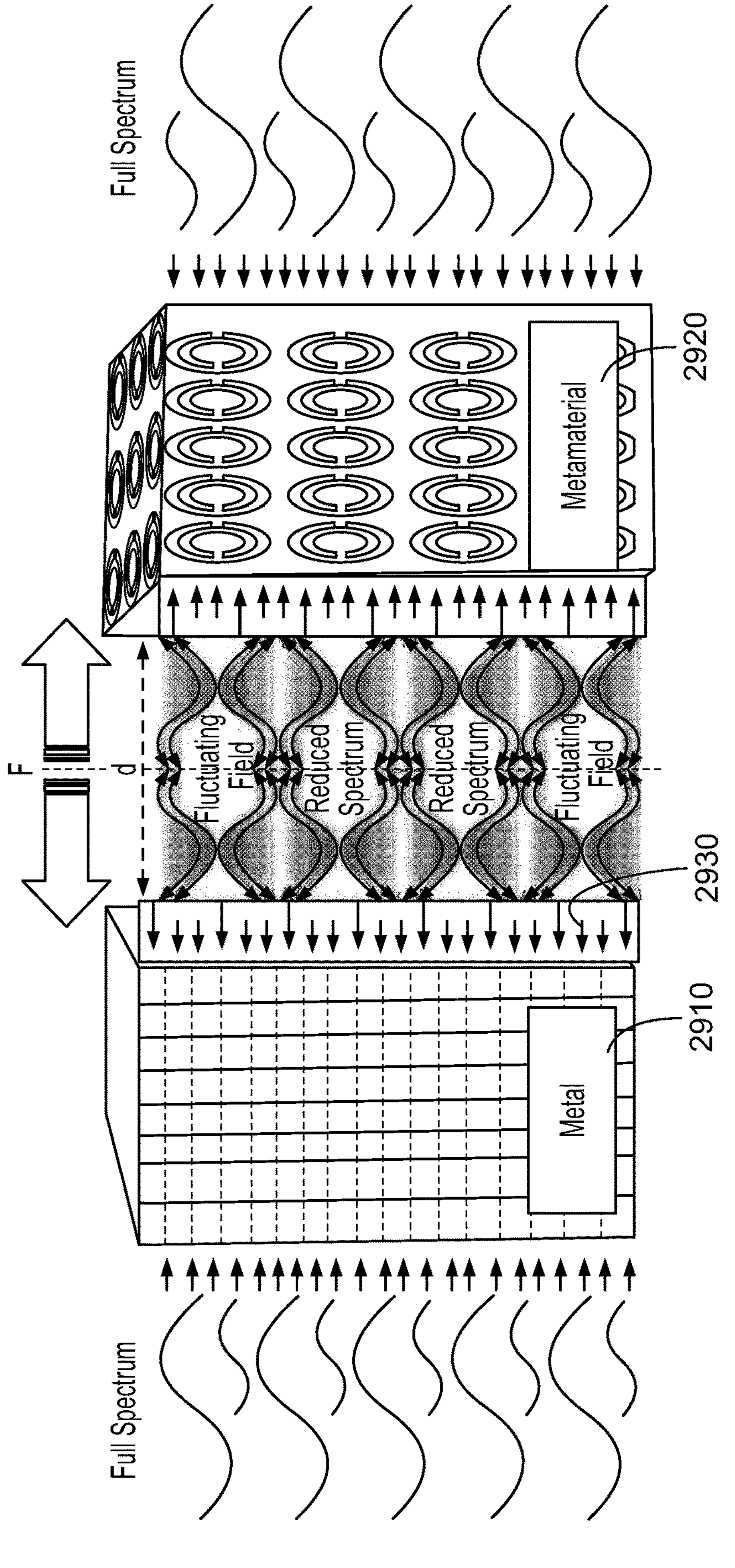
FIG. 29 is a perspective view of a metal-metamaterial interface.

FIG. 29 is a force diagram illustration of an experimental setup 2900, in which a plane of metal 2910 is positioned in parallel to a metamaterial 2920. The metal and metamaterial are positioned apart from one another at a distance “d.” The forces illustrated in the setup 2900 are shown using arrows 2930. A first force applied to the metal 2910 and metamaterial 2920 brings the two planes closer to one another. However, application of this first force has been observed under the specific conditions of the experimental setup 2900 to result in a second and opposite force “F” that causes the two planes to separate from one another.

In the case of two uncharged metal plates positioned closely to one another and in parallel, a force causing the two plates to move towards one another has been observed. This force is referred to as the Casimir force. The Casimir force originates from the interaction of the surfaces with the surrounding electromagnetic spectrum, and exhibits a dependence on the dielectric properties of the surfaces and the medium between the surfaces. Casimir forces between macroscopic surfaces have the same physical origin as atom-surface interactions and those between two atoms or molecules (van de Waals forces), because they originate from quantum fluctuations.

The Casimir force is known to be proportional to the effective permittivity of metal plates. Therefore, by decreasing the effective permittivity on the metal planes, the Casimir force too can be decreased. This can result in reduced forces preventing the plates from separating from one another, thus at least partially mitigating the stiction problem observed in MEMS switches.

However, aside from reducing the Casimir force by reducing permittivity between plates, a repulsive force can actually be generated between the planes if the effective permittivity is sufficiently decreased, such as by using metamaterials. This repulsive force is sometimes referred to as the “repulsive Casimir force,” and in the present application can further be used to resolve the stiction issue by repelling the contacts from one another. Thus, generating a repulsive Casimir force can result in even less of a liability for the contacts to effectively become "welded" together due to stiction.

Casimir interactions (both attractive and repulsive forces) may be realized in engineered materials such as silicon crystals, which can be used for levitation, microwave switches, MEMS oscillators and gyroscopes. Casimir interaction is attractive in magnetic Metamaterials made of nonmagnetic meta-atoms. In contrast, intrinsically magnetic meta-atoms could potentially lead to Casimir repulsion. Chiral Metamaterials made of metallic and dielectric metaatoms are good candidates for Casimir repulsion. One approach is to engineer the material combinations that give rise to Casimir repulsive forces. For example, Casimir repulsive forces have been observed between multilayer walls made of alternating layers of a topological insulator (TI) and a normal insulator. The Casimir repulsion under the influence of the magnetization orientation in the magnetic coatings on TI layer surfaces, the layer thicknesses, and the topological magnetoelectric polarizability, has been demonstrated. For the multilayer structures with parallel magnetization on the TI layer surfaces, it is feasible to enhance the repulsion by increasing the TI layer number, which is due to the accumulation of the contribution to the repulsion from the polarization rotation effect occurring on each TI layer surface. Generally, in the distance region where there is Casimir attraction between semi-infinite TIs, the force may turn into repulsion in the TI multilayer structure, and in the region of repulsion for semi-infinite TI, the repulsive force can be enhanced in magnitude, the enhancement tends to a maximum while the structure contains sufficiently many layers.

In general, Casimir forces between macroscopic surfaces entail separations typically >0.1 um where retardation plays an essential role, while van der Waals forces refer to separations <0.01 um where retardation is insignificant. Advances in theoretical studies and experimental techniques have enabled examination of the Casimir force beyond the configuration of two parallel perfect metal plates. Novel materials and shapes of the interacting bodies enable new opportunities for applications and, at the same time, pose new open questions. On the theoretical side, MTM-Inspired structures can produce a powerful Casimir Effect, which will allow transportation of matter; this implies, in principle, that the effect can be used to attract or push away physical matter. A further complexity of the Casimir force potentially allows greater opportunity for neutralization or for use of Casimir forces to partially cancel Van Der Waals forces. It is to note that polaritonic involvement causes a repulsive Casimir force between Metal and MTM structures. For example, binding TM polaritons govern at shorter distance, inundated by joint repulsion due to anti-binding TM and TE polaritons. Thus, in the case of a hybrid arrangement, surface plasmons can be indicative of the strength and sign of the Casimir force.

Figure 30A:
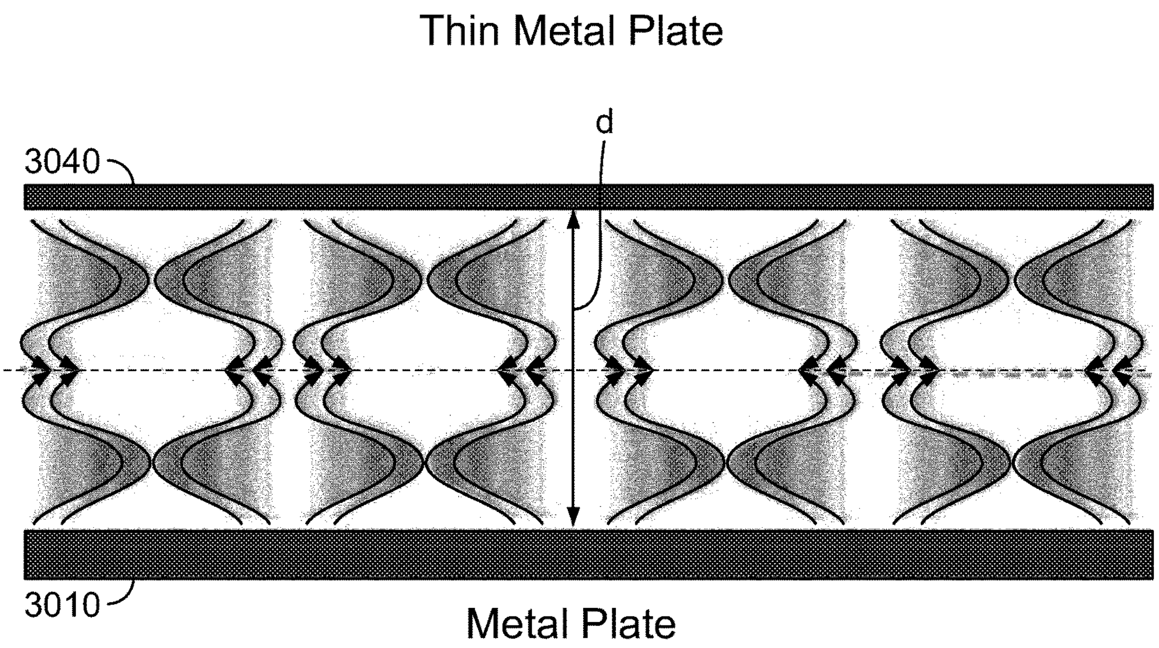
FIG. 30A is a side view of a metal-metal contact.
Figure 30B:
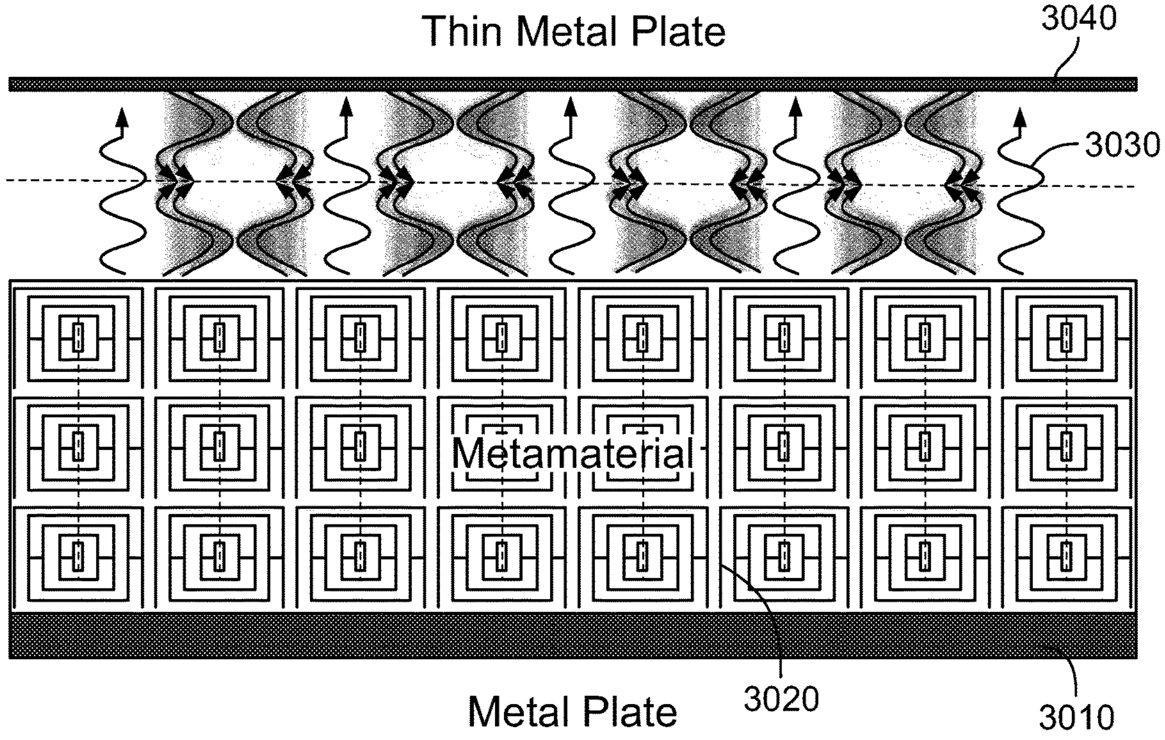
FIG. 30B is a side view of a metal-metamaterial contact.

FIGS. 30A and 30B show a typical example of a levitating mirror. The repulsive Casimir force of the metamaterial may balance the weight of one of the mirrors, letting it levitate on zero-point fluctuation.

FIG. 30A shows a first metal plate 3010 or mirror separated from a second metal plate 3040 or mirror by a distance d. The two metal plates may be thought of as opposing contacts in a MEMS switch, and may be liable to become permanently stuck to one another at distances "d" that are sufficiently small. By contrast, FIG. 30B shows a thin layer of metamaterial 3020 affixed to a surface of the first metal plate 3010 and positioned in between the metal plates 3010, 3040. A Casimir force 3030 is produced at the boundary between the metamaterial 3020 and the second metal plate 3040, thereby causing the second metal plate to further separate from the first metal plate 3010 by a distance d'. This additional separation may even counteract gravitational forces, and thus cause the second metal plate 3040 to levitate. In some cases, the metamaterial may be made from gold foil.

In the application of an RF MEMS switch structure, the switch may include a deflectable beam having a shorting bar positioned on a surface of the beam and aligned with the contact of the signal line. The shorting bar may be made of metal, such as a thin layer of gold foil located. When the shorting bar touches the signal line, the metal-to-metal contact surfaces may stick to one another in the form of strong adhesion. This adhesion causes undesirable stiction problems, which in turn may cause the switch to be electrically shorted, and it may take a considerable amount of force to separate the shorting bar from the signal line. The RF MEMS switch generally relies on stresses accumulating in the beam as a result of the beam's deflection in order to counteract the adhesive forces and to return the beam back to its at-rest or equilibrium position. This counteractive force, which is the sum of the stresses in the beam, is referred to as the restoring force that "restores" the beam to its at-rest position. However, this force is not always sufficient to counteract adhesive forces between the metal contacts. By providing a metamaterial structure between the metal contacts, the restoring force of the beam can be supplemented using the repulsive Casimir force generated when the shortening bar touches or comes within proximity to the signal line.

Figure 31:
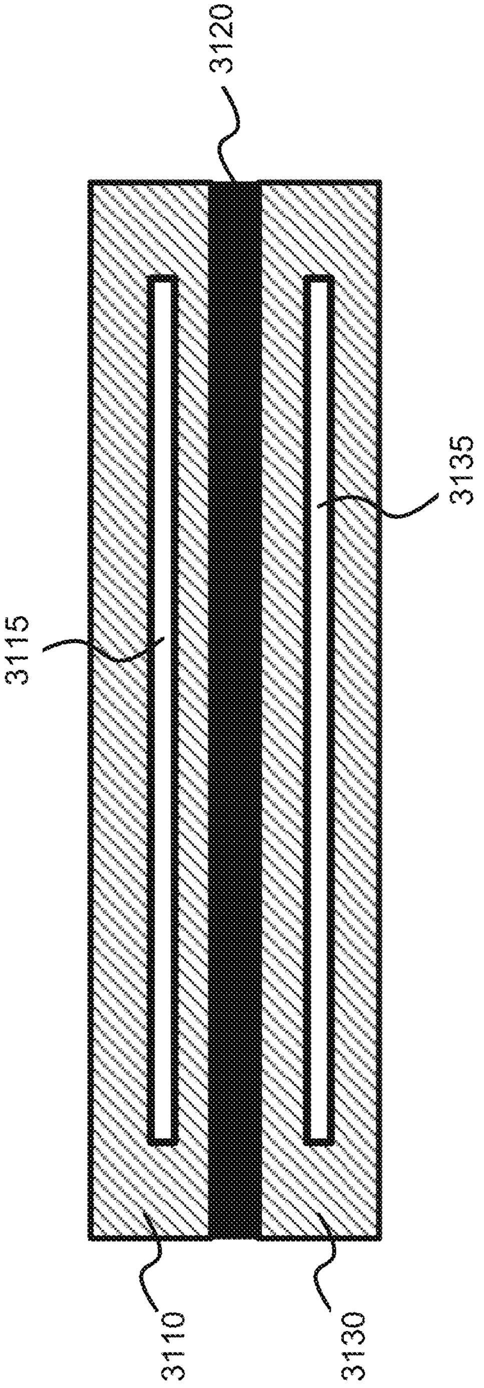
FIG. 31 is a side view of a metal-metamaterial contact in accordance with an aspect of the disclosure.

The Casimir force can be controlled by providing a permittivity gradient in the contact of the deflectable beam. The permittivity gradient can be provided by interfacing three layers of media in either decreasing or increasing order of permittivity. In FIG. 31, three layers of media are provided: a first layer 3110 having permittivity $\varepsilon_1$, a second layer 3120 having permittivity $\varepsilon_2$, and a third layer 3130 having permittivity $\varepsilon_3$. The first and third layers may be metal layers, and the second layer may be a dielectric layer. The layers may be interfaced such that either $\varepsilon_1<\varepsilon_2<\varepsilon_3$ or $\varepsilon_1>\varepsilon_2>\varepsilon_3$. This may be possible by providing one metal layer with positive permittivity, and another metal layer with negative permittivity. For instance, the first layer 3110 may be made of gold and have an infinite permittivity, the second layer 3120 may be made of a dielectric (e.g., silicon mononitride (SiN)) and have a small but positive permittivity (e.g., 7) and the third layer 3130 may include a metamaterial unit cell 3135 and may have a zero or even negative permittivity. In other examples, the first layer 3110 can also include a metamaterial unit cell 3115 in order to acquire the desired permittivity.

Figure 32A:
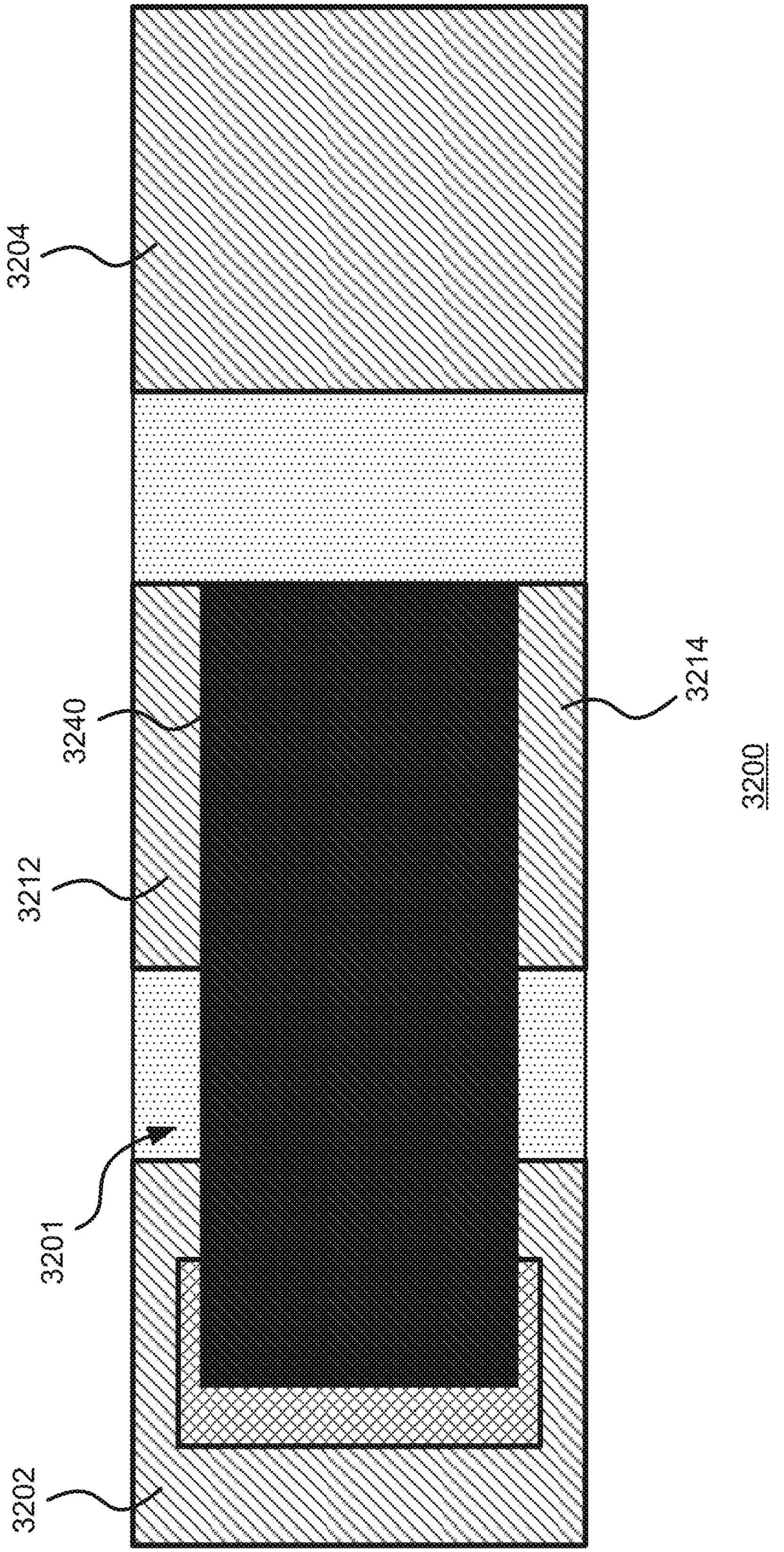
FIG. 32A is a top down view of an RF MEMS resistive switch having a metamaterial structure in accordance with an aspect of the disclosure
Figure 32B:
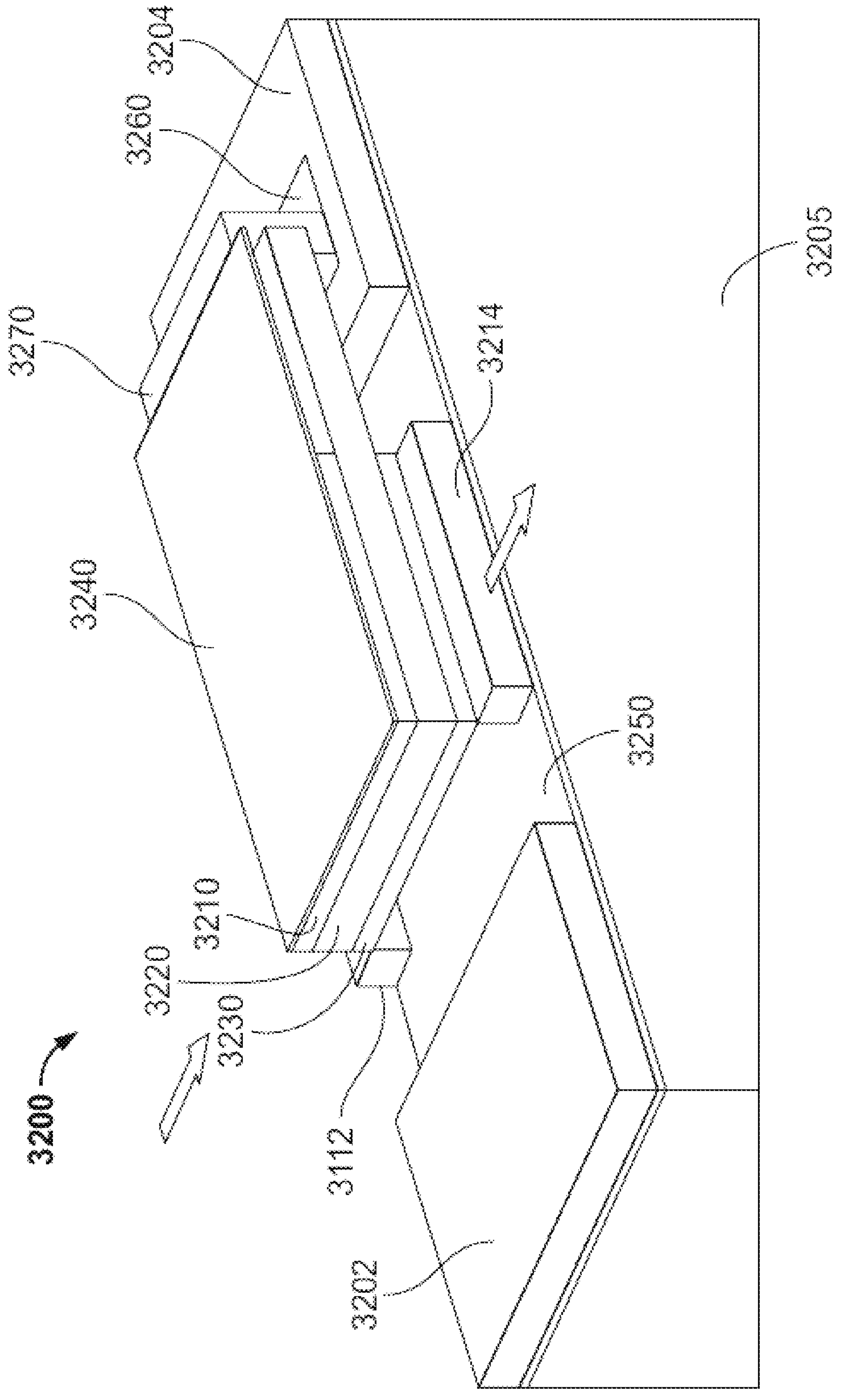
FIG. 32B is a perspective view of the switch of FIG. 32A.
Figure 32C:
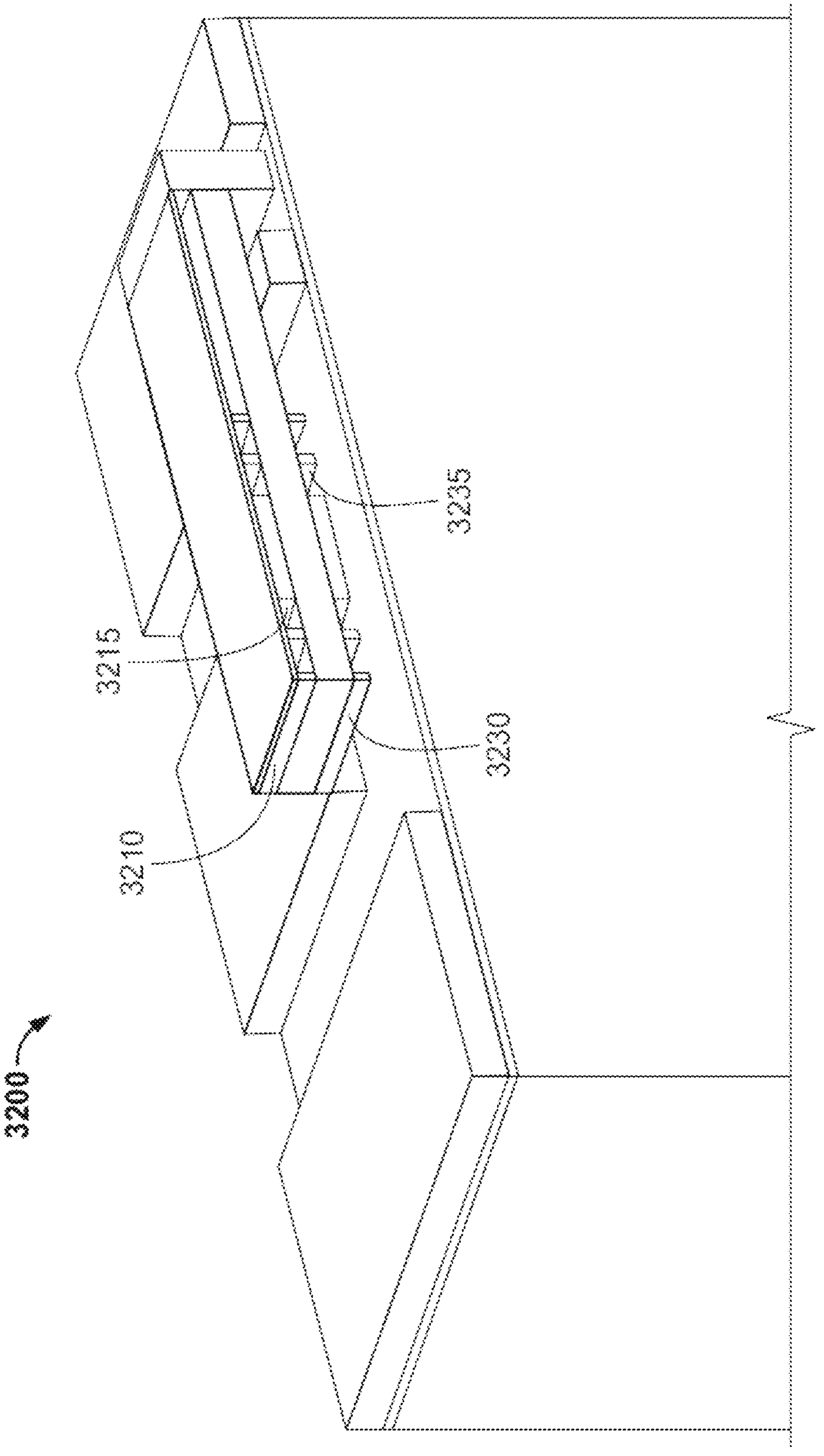
FIG. 32C is a cross-sectional view of the perspective view of FIG. 32B.
Figure 32D:
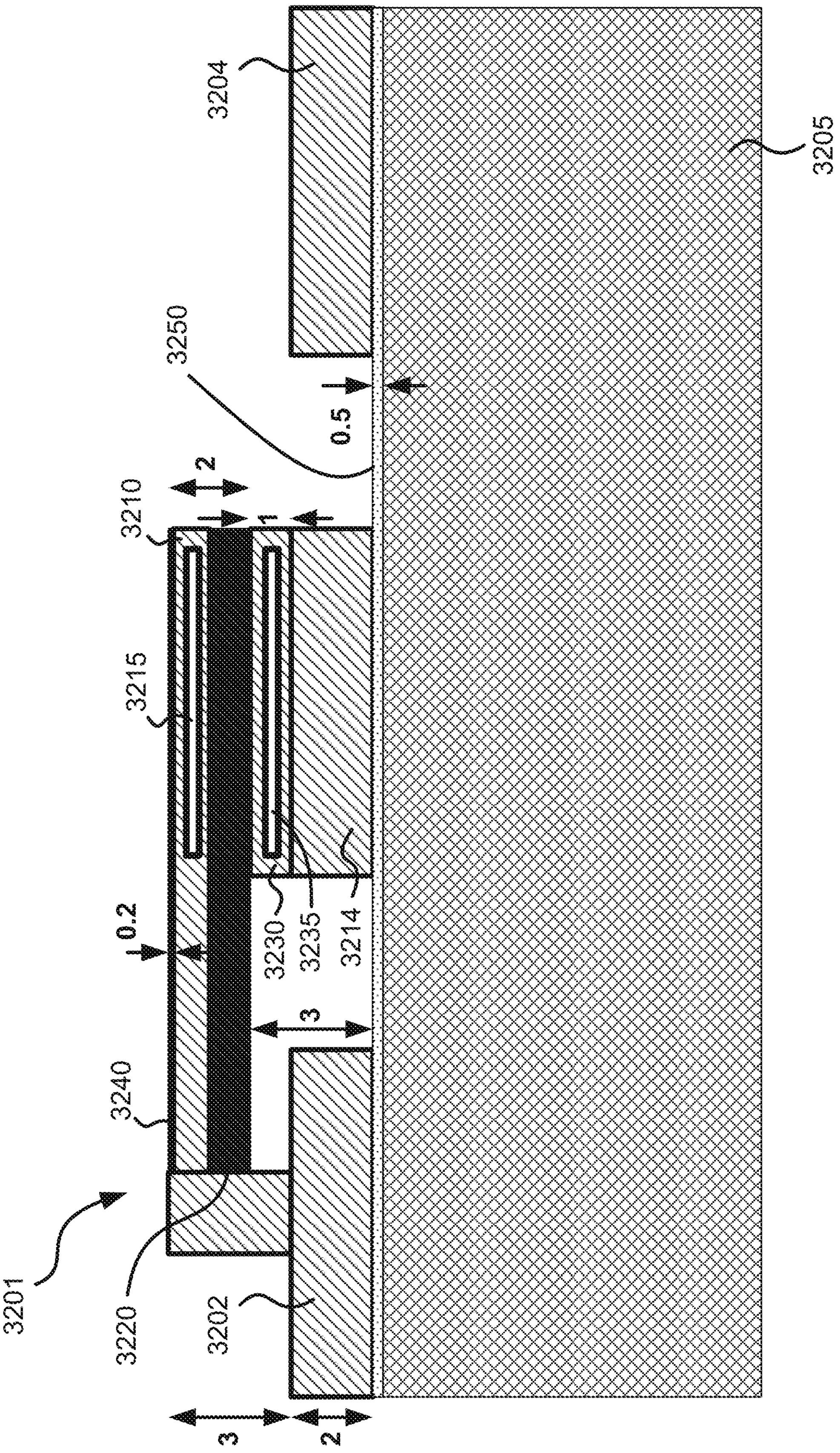
FIG. 32D is a side view of the switch of FIG. 32A in a down state.
Figure 32E:
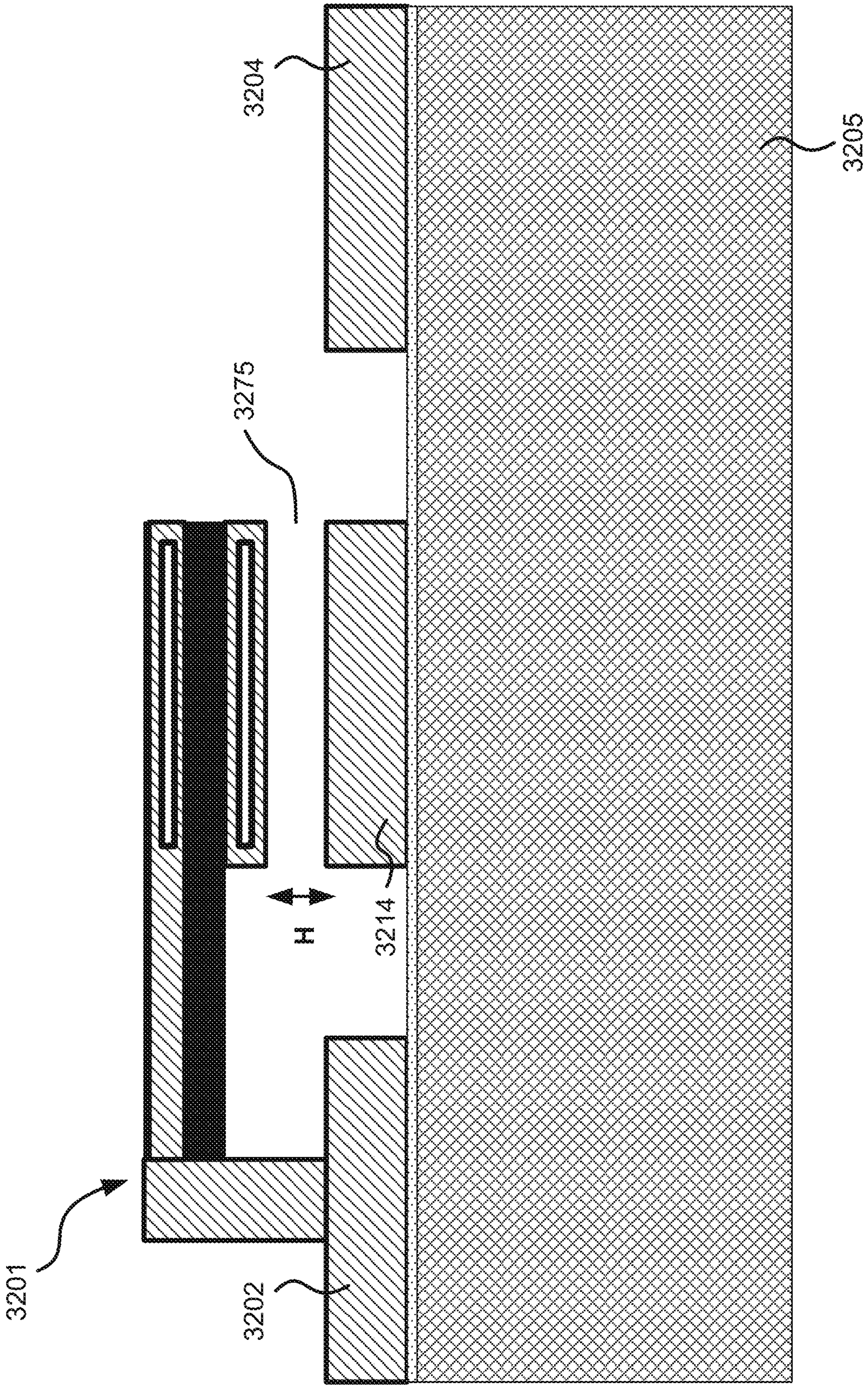
FIG. 32E is a side view of the switch of FIG. 32A in an up state.

FIGS. 32A-E are illustrations of an example RF MEMS switch 3200 incorporating metamaterial cells in order to provide a repulsive Casimir force between contacts of the switch. FIG. 32A is a top-down view of the switch, FIG. 32B is a perspective view of the switch, FIG. 32C is a bisected cross-sectional perspective view of the switch, FIG. 32D is a side view of the switch in a closed position, and FIG. 32E is a side view of the switch in an open position.

The switch is formed in a coplanar waveguide 3201 positioned having two ground planes 3202 and 3204 formed above a substrate 3205. The ground planes are separated by a channel and a signal line 3210 is formed lengthwise in the channel. The signal line 3210 includes each of an input port 3212 through which a signal is received (arrow in) and an output port through which the signal is transmitted (arrow out).

The switch includes a cantilevered beam that moves in and out of the plane of the coplanar waveguide in order to move in and out of contact with the signal line 3210. The beam includes multiple layers. In the example of FIG. 32, from top to bottom, the layers include: a top layer 3420 of dielectric material, a first metal layer 3210, a dielectric layer 3220, and a second metal layer 3230. Each of the first and second metal layers 3210, 3220 may include a metamaterial device 3215, 3235 encased within, as shown in the cross-sectional view of FIG. 32C. The top layer 3210 and first mater layer 3220 may be adapted to extend across the entire length of the beam, whereas the length of the sandwiched dielectric layer 3220 and second metal layer 3230 may be limited to the area above the signal line 3210. Alternatively, the dielectric layer 3220 may extend the entire length of the beam while only the second metal layer 3230 may be limited to the area above the signal line 3210.

The ground planes 3202, 3204 and signal line ports 3212, 3214 may be separated from the substrate 3205 by a thin layer of dielectric 3250, such as SiN or $SiO_2$.

Operation of the switch may be controlled by moving an anchor 3270 to which the beam is attached in and out of the plane of the coplanar waveguide 3201. In this case, the ground line 3202 may include a hole 3260 though which a post or anchor 3270 of the beam is positioned. Moving the post 3270 up and down can result in the contacts of the switch separating or contacting one another, respectively. FIG. 32D shows the switch closed, with the contacts contacting one another. FIG. 32E shows the switch open, with the dielectric and metal layers of the beam elevated above the signal line ports 3214, thereby forming a gap 3275 of a given height H.

In the example of FIGS. 32A-E, the section of the coplanar waveguide shown may be about 100 μm, and the beam may have a width of about 75 μm. The anchor 3270 to which the beam is attached may have a length (in the direction of the beam length) of about 11.25 μm and a width of about 75 μm. The opening 3260 into which the beam is anchored may have a greater length and width, such as about 80 μm by 30 μm. The overall length of the waveguide (in the direction of the beam length) may be about 330 μm, whereby the ground planes and the signal lines may each have a width (also in the direction of the beam length) of about 75 μm, with 38 μm channels in between. The beam may have a length of about 140 μm (not including the length of the anchor 3270).

The overall height of the beam when in the closed position may be about 5 μm, relative to the dielectric surface on which the ground planes and signal line are formed. Each of the ground planes and signal line may be 2 μm thick. The beam may then contribute an additional 3 μm to the height of the switch, whereby each of the metal layers 3210, 3230 is about 1 μm thick and the dielectric layer 3220 sandwiched in between may also be about 1 μm. The top layer 3440 may add about an additional 0.2 μm to the height of the switch. The height of the switch may increase by H when open, as shown in FIG. 32E.

Figure 33:
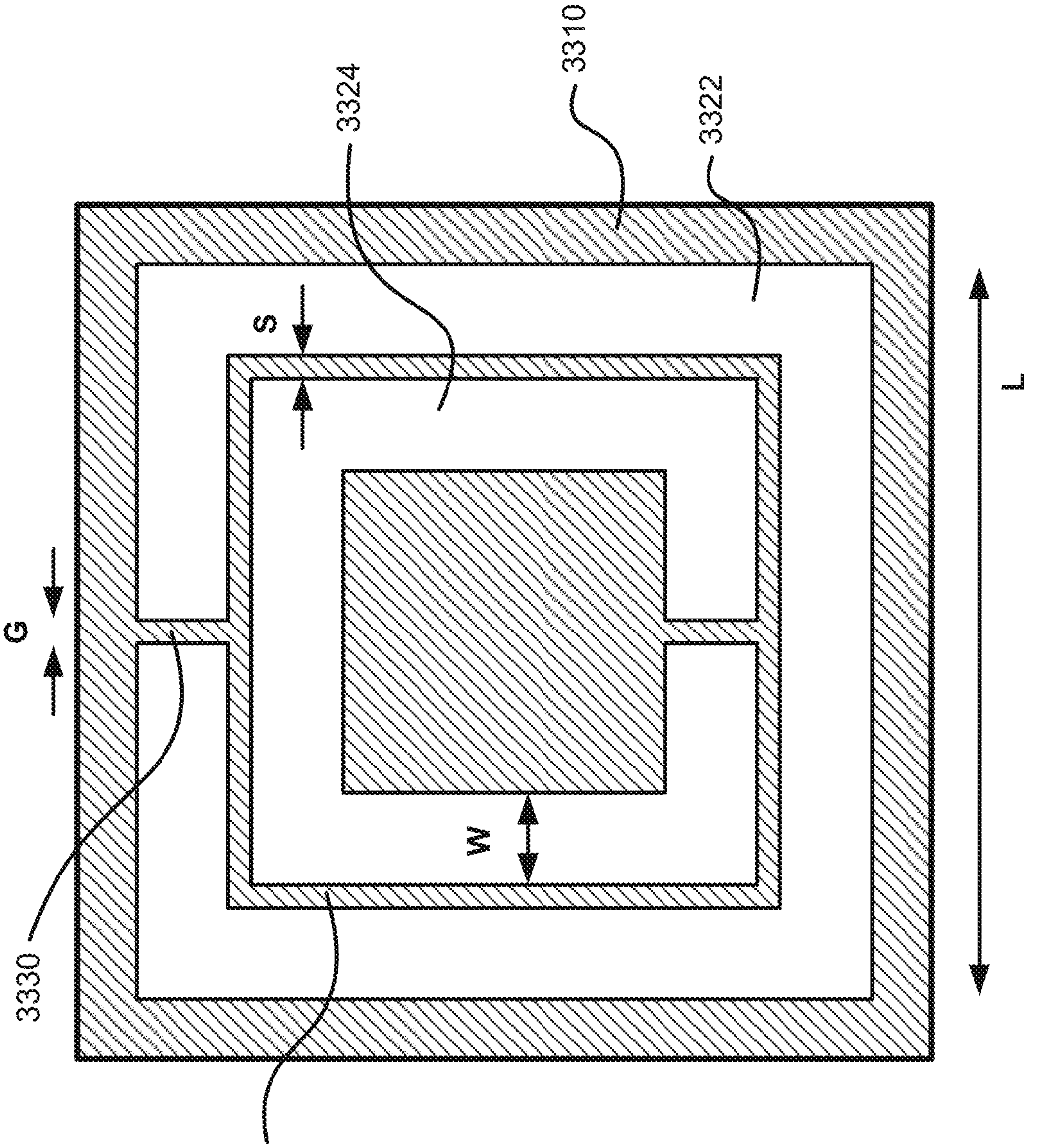
FIG. 33 is a plan view of a metamaterial structure in accordance with an aspect of the disclosure.

The metamaterial unit cells included in the second metal layer 3230, and optionally in the first metal layer 3210 as well, may have the shape of a split ring resonator. The split rings may be square-shaped. FIG. 33 illustrates an example metal layer 3310 having each of a first split ring 3322 having width L, and a second split ring 3324, formed in the layer, whereby forming the rings may involve cutting out the rings from the layer. Each of the rings may be concentric, and may be aligned so that the splits 3330 in the respective rings are positioned on opposing sides of the layer 3310. Each of the rings may have a uniform width W, and the splits 3330 may have a uniform width G. The rings may further be separated from one another by a uniform separation 3332 having width S.

Figure 34:
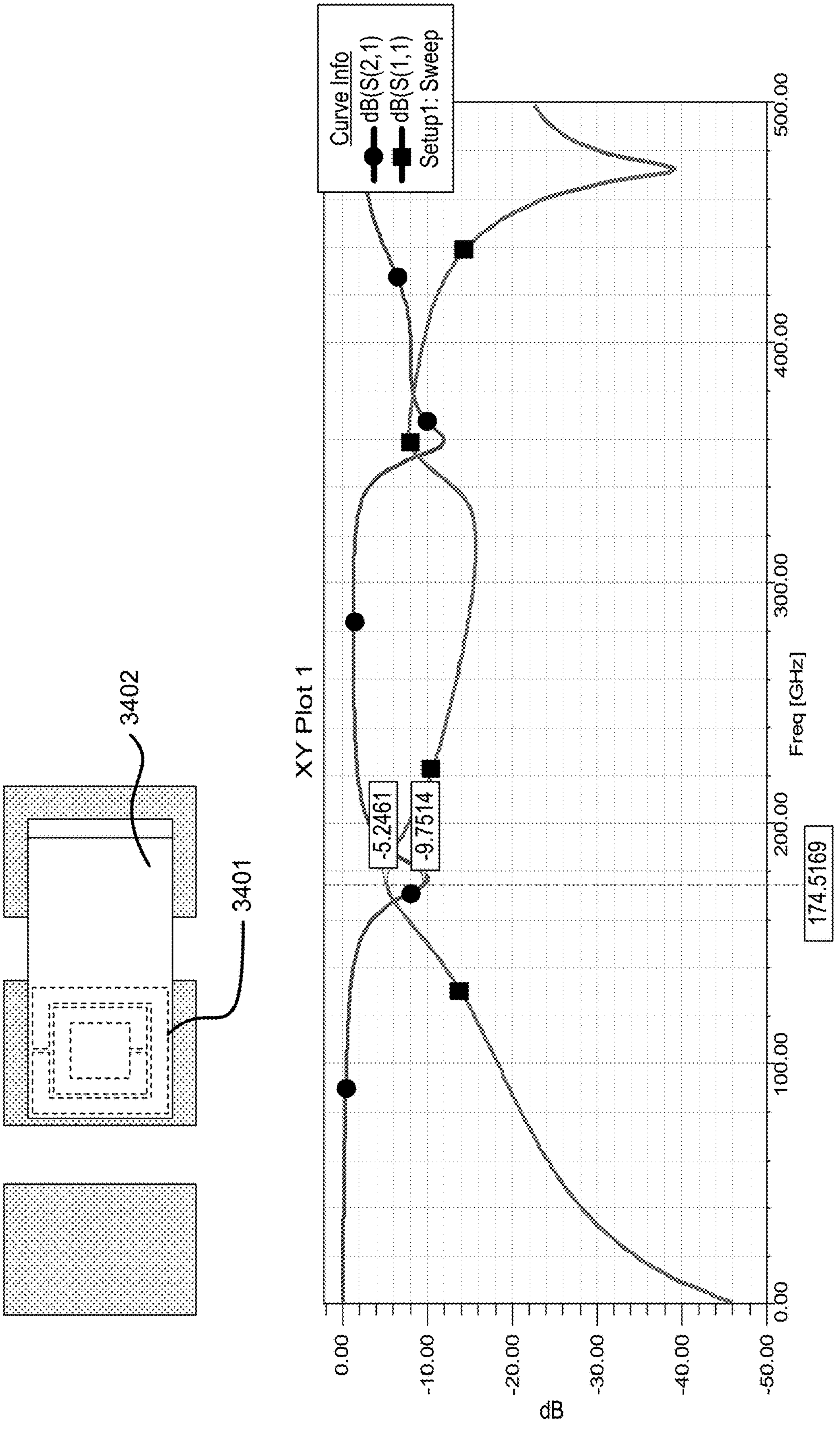
FIGS. 34-36 are graphical representations of transmission and reflection characteristics over a range of frequencies for example RF MEMS resistive switches having different metamaterial structures in accordance with an aspect of the disclosure.
Figure 35:
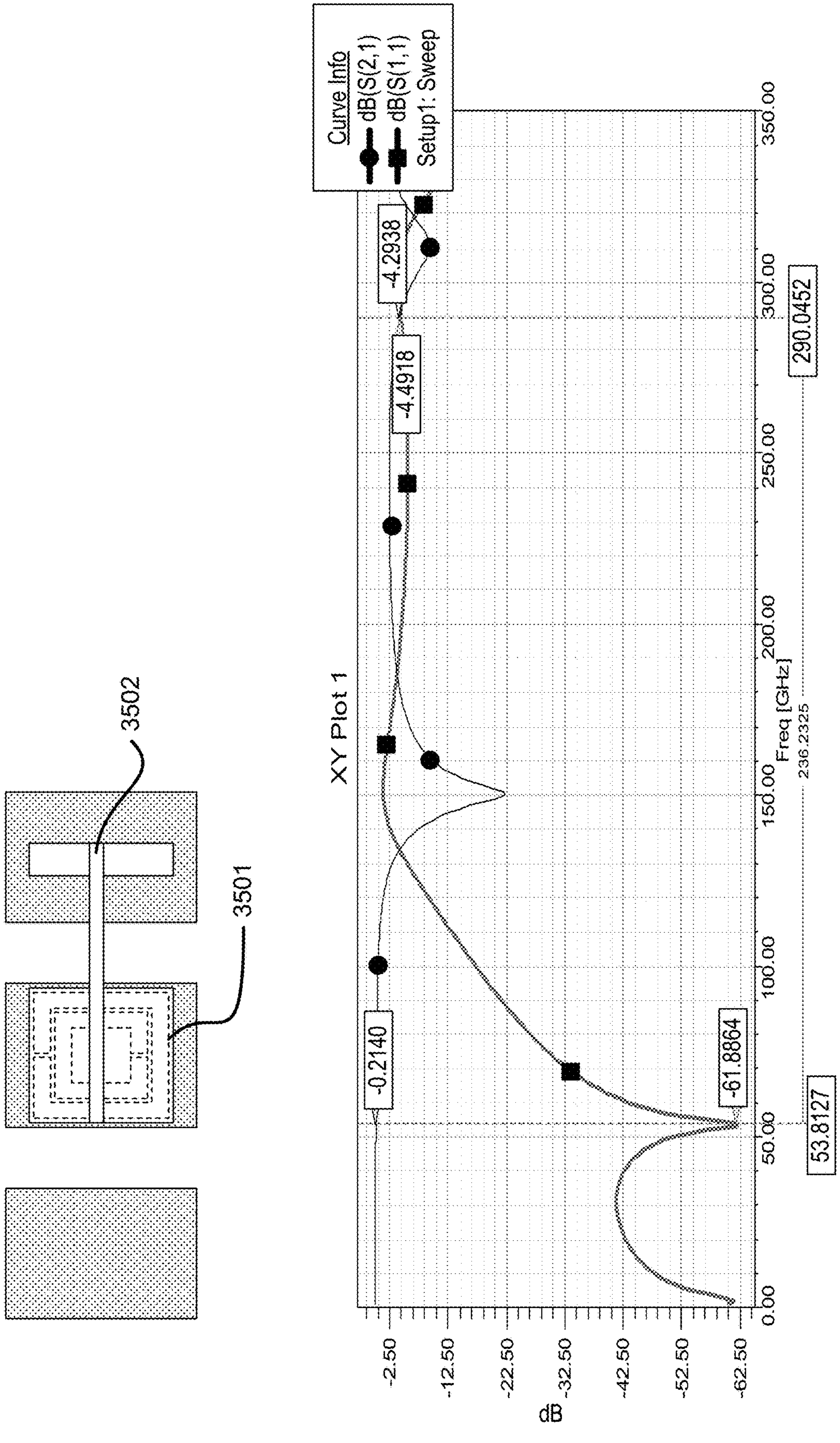
Figure 36:
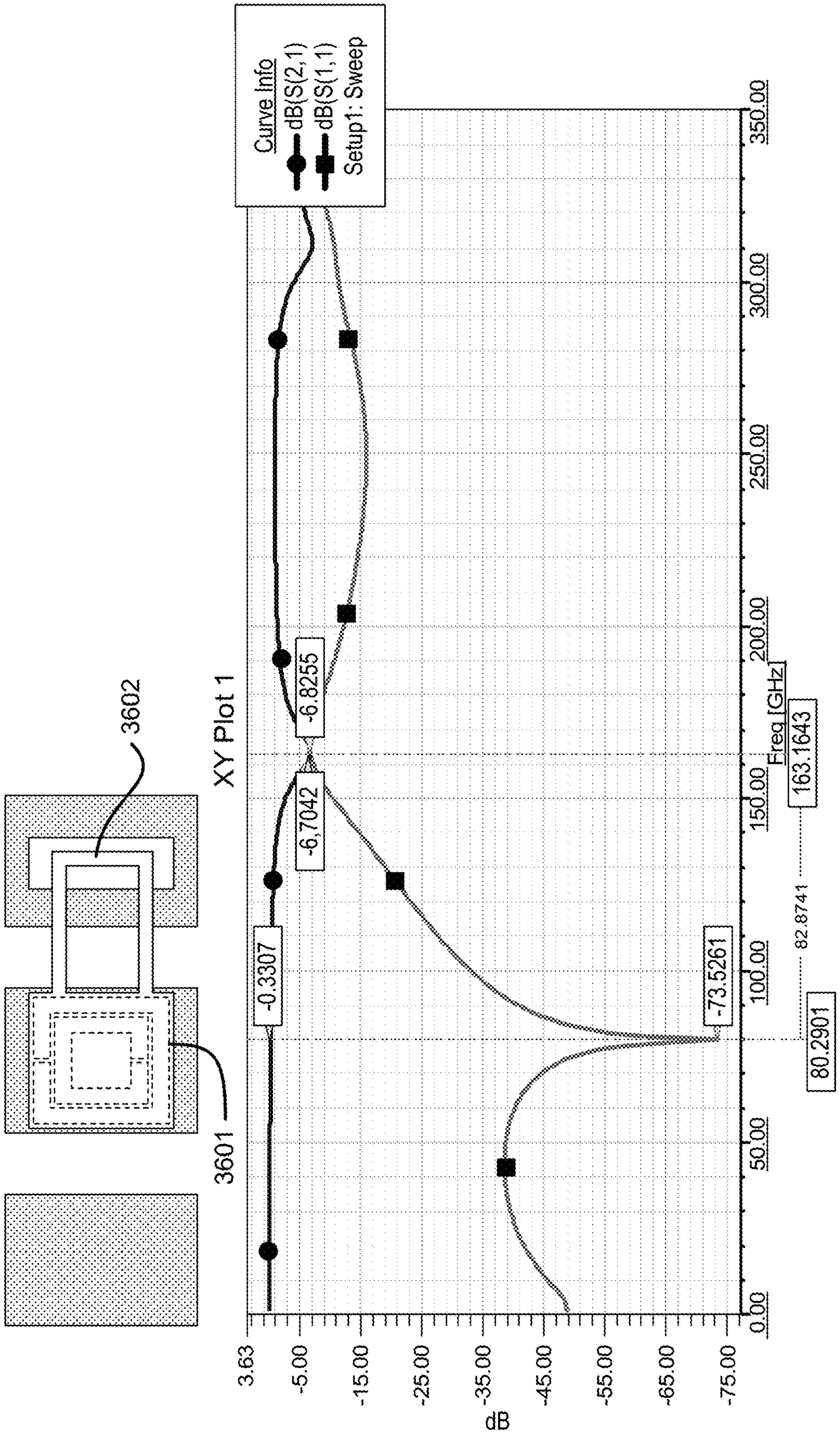

Different unit cell structures may provide different metamaterial characteristics at the relevant band of frequencies for the RF MEMS switch (e.g., between 60 to 130 GHz). Each of FIGS. 34-36 provides simulated test results for transmission and reflection characteristics for a respective unit cell structure. In the particular examples provided herein, the simulated test results were collected using Matlab code, although other programs could be used to run simulations in other cases.

The metamaterial structure 3401 of FIG. 34 is included in a metal layer having a width equal to the width of the beam 3402. In this example, the unit cell is of transmission type at low frequencies, at about 300 GHz and again at about 470 GHz. The unit cell is of reflection type, with attenuation of the transmission exceeding that of the reflection, at about 150 GHz, and again at about 300 GHz. Thus, the structure of FIG. 34 is shown to exhibit metamaterial properties.

The metamaterial structure 3501 of FIG. 35 is included in a metal layer having a length equal to the width of the signal line, and further attached to a beam 3502 having a width much smaller than the width of the metal layer. In this example, the unit cell is shown to have transmission properties at about 54 GHz and reflection properties at about 150 GHz. Therefore, the structure of FIG. 35 is also shown to exhibit metamaterial properties.

The metamaterial structure 3601 of FIG. 36 is included in a metal layer having a length equal to the width of the signal line, and further attached to a U-shaped beam 3602 having two branches each having width much smaller than the width of the metal layer. In this example, the unit cell is shown to have transmission properties at about 80 GHz and reflection properties at about 163 GHz. Therefore, the structure of FIG. 36 is also shown to exhibit metamaterial properties, and these properties can be exhibited over a relatively narrow bandwidth of about 83 GHz.

Figure 37:
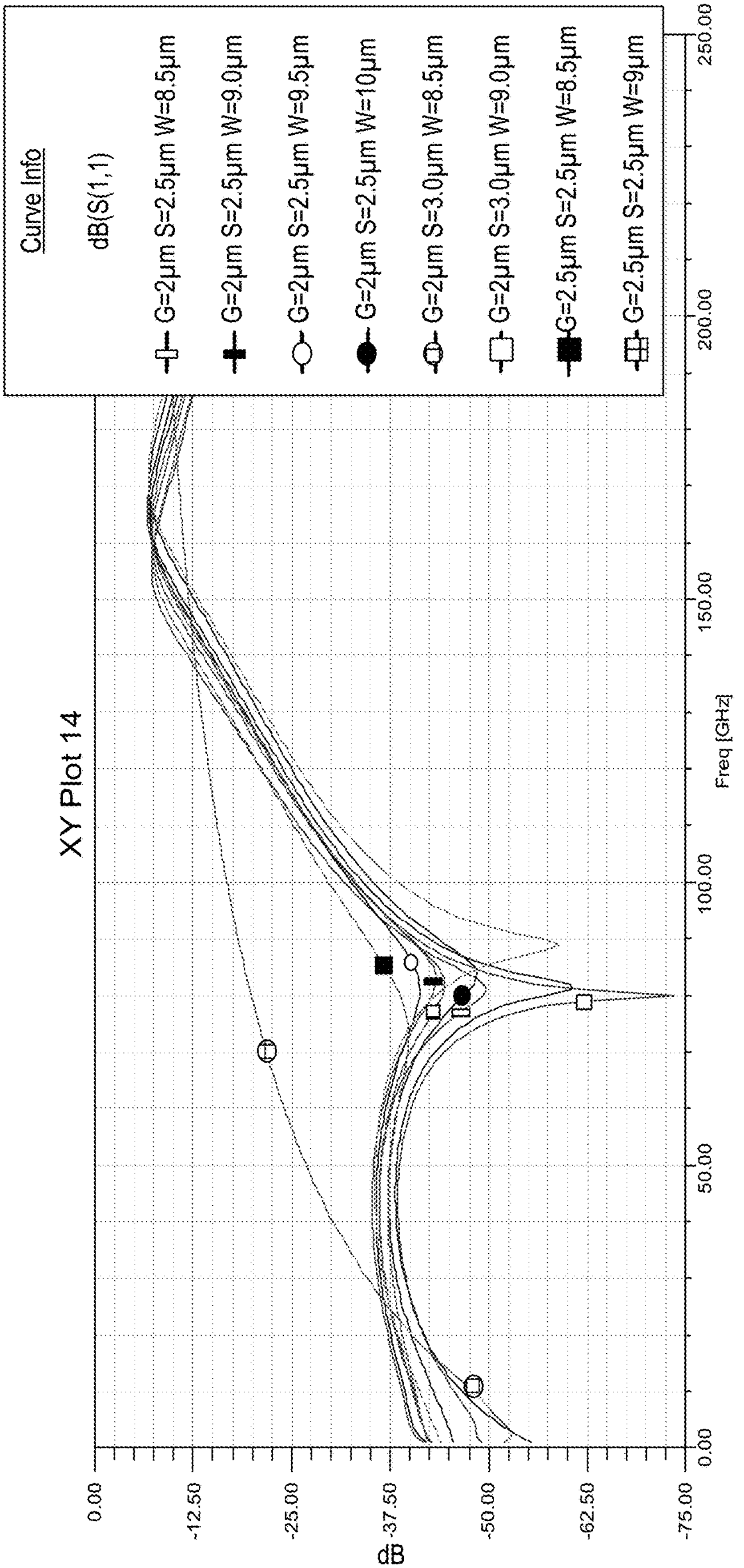
FIG. 37 is a graphical representation of reflection characteristics over a range of frequencies for example RF MEMS resistive switches having different metamaterial structure parameters in accordance with an aspect of the disclosure.

Additionally, the parameters of the metamaterial cell structures may be varied to produce different transmission and reflection characteristics. For example, FIG. 37 provides a graph plotting reflection characteristics for a metamaterial cell having different parameters G, S and W (as defined in connection with FIG. 33 above). In the particular example of FIG. 37, it can be seen that the frequency at which reflection is most greatly attenuated varied from about 80 GHz to about 90 GHz depending on G, S and W. For instance, where G is 2 μm, S is 3 μm, and W is 9 μm, insertion loss drops to about −74 dB at 80 GHz. By comparison, other parameters of G, S, and W yield a reflection of about −60 dB at about 90 GHz.

Figure 38:
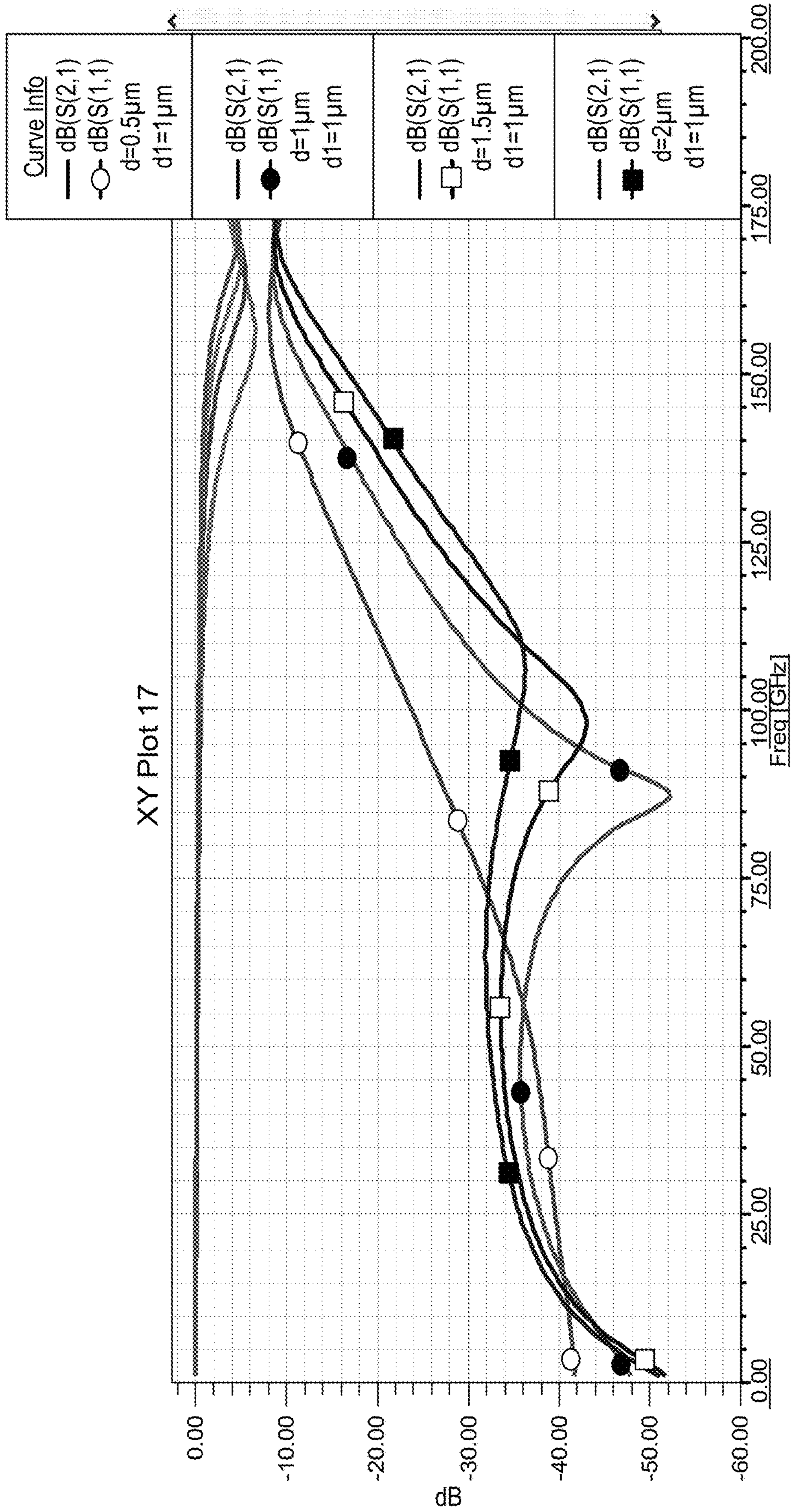
FIG. 38 is a graphical representation of transmission and reflection characteristics over a range of frequencies for example RF MEMS resistive switches having different metal plate contact thicknesses in accordance with an aspect of disclosure.
Figure 39:
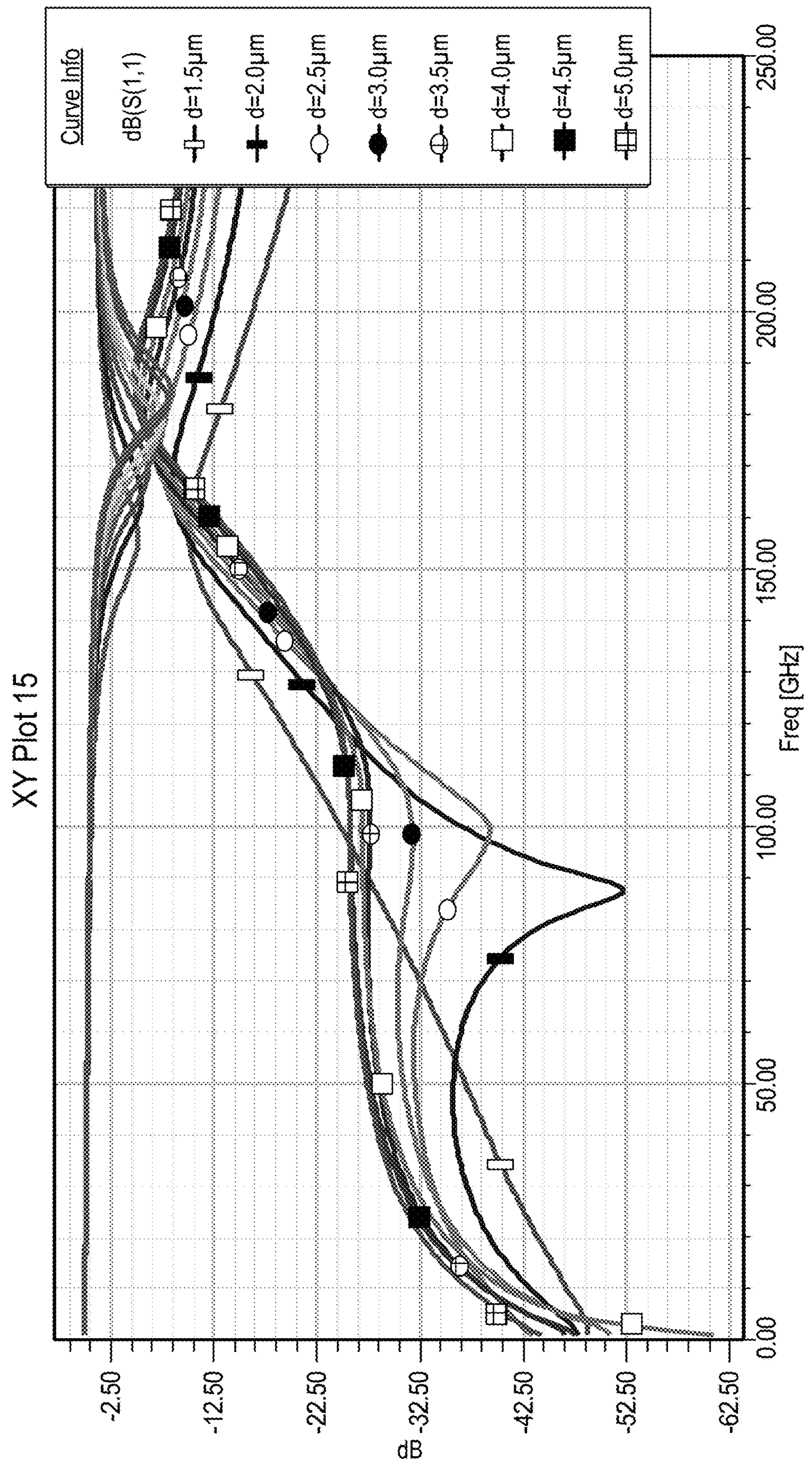
FIG. 39 is a graphical representation of transmission and reflection characteristics over a range of frequencies for example RF MEMS resistive switches having different dielectric layer thicknesses in accordance with an aspect of the disclosure.
Figure 40:
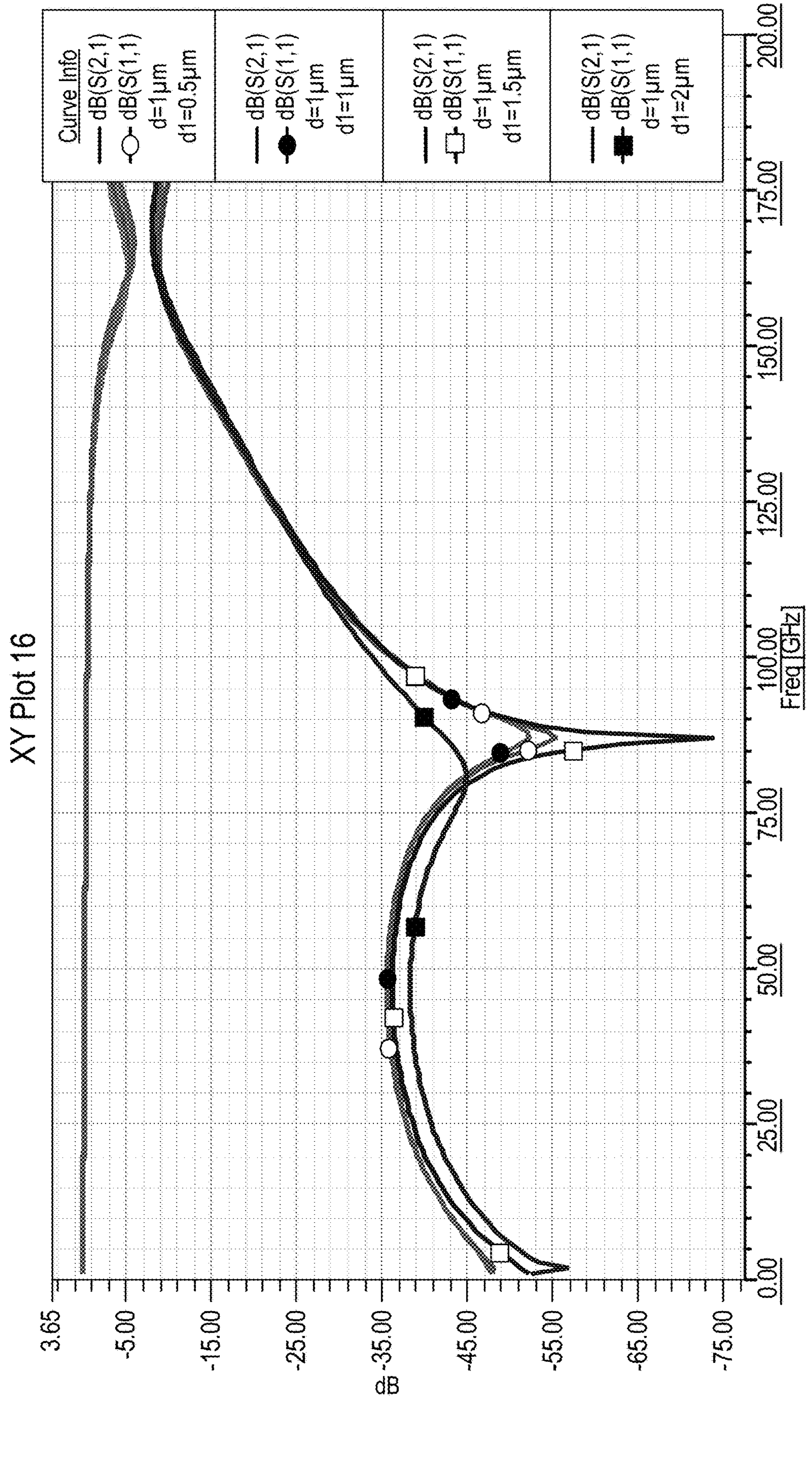
FIG. 40 is a graphical representation of transmission and reflection characteristics over a range of frequencies for example RF MEMS resistive switches having different metal plate thicknesses in accordance with an aspect of the disclosure.

In addition to the use of different metamaterial cell structures and cell structure parameters, the metal layers of the MEMS switch may also be formed with different parameters and dimensions as compared to those parameters and dimensions described above. FIG. 38 is a plot of both transmission and reflection properties of a switch for which the thickness of the second metal layer "d" (e.g., 3230 of FIGS. 32A-E) varies between 0.5 μm through 2 μm. FIG. 39 is a plot of transmission and reflection properties of a switch for which the thickness of the sandwiched dielectric layer (e.g., 3220 of FIGS. 32A-E) varies between 1.5 μm through 5 μm. FIG. 40 is a plot of transmission and reflection properties of a switch for which the thickness of the first metal layer "d1" (e.g., 3210 of FIGS. 32A-E) varies between 0.5 μm through 2 μm. The transmission properties of the various MEMS switches are largely similar in each of these conditions, although the frequency at which the transmission attenuates varies between about 160 GHz and about 180 GHz, and the reflection properties of the switch vary mainly between 60 GHz and 150 GHz.

Figure 41:
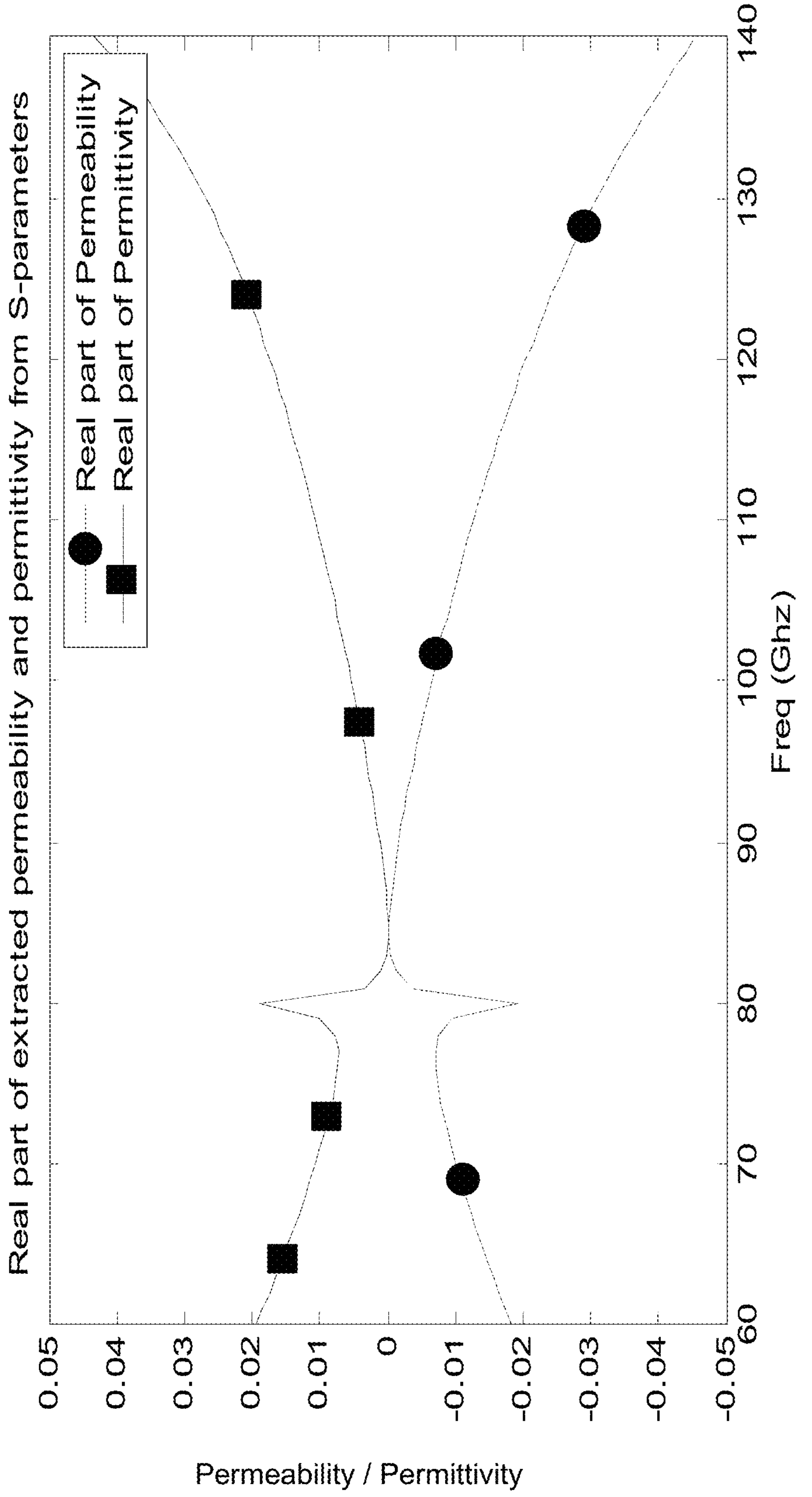
FIG. 41 is a graphical representation of extracted permittivity and permeability parameters over a range of frequencies of an example RF MEMS resistive switch in accordance with an aspect of the disclosure.

Using the transmission and reflection data described above, permeability and permittivity of the metamaterial cells can be extracted using parameter extraction procedures known in the art. The parameter extraction is shown in FIG. 41. As can be seen from FIG. 41, the metamaterial structure exhibits near zero permittivity as well as permeability at a band of frequencies centered around 80 GHz. Therefore, it is clear from FIG. 41 that these structures would produce a repulsive Casimir force around the band of frequencies ranging from about 60 GHz to about 130 GHz.

Figure 42:
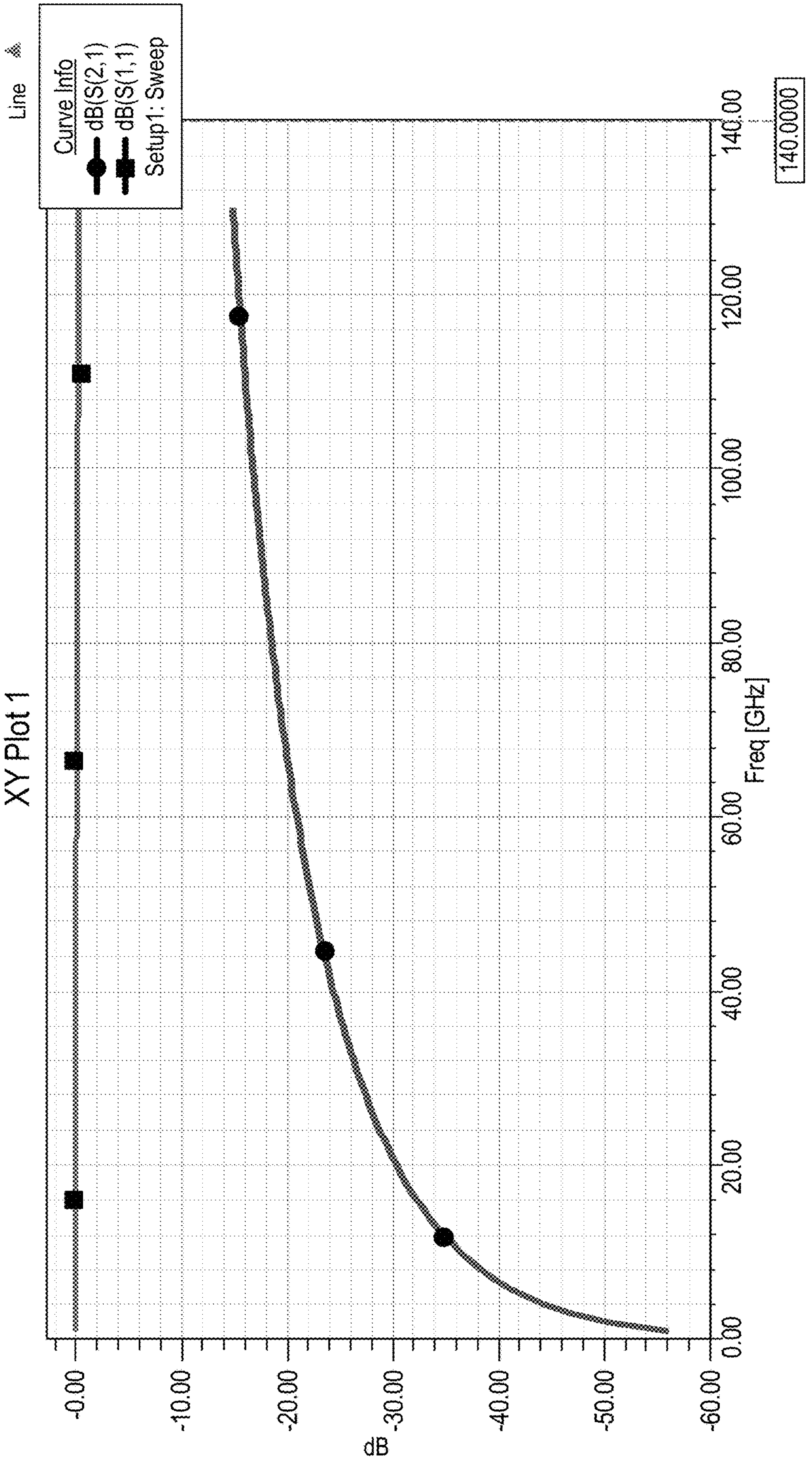
FIG. 42 is a graphical representation of transmission and reflection characteristics over a range of frequencies for an example RF MEMS switch in the OFF state, in accordance with an aspect of the disclosure.
Figure 43:
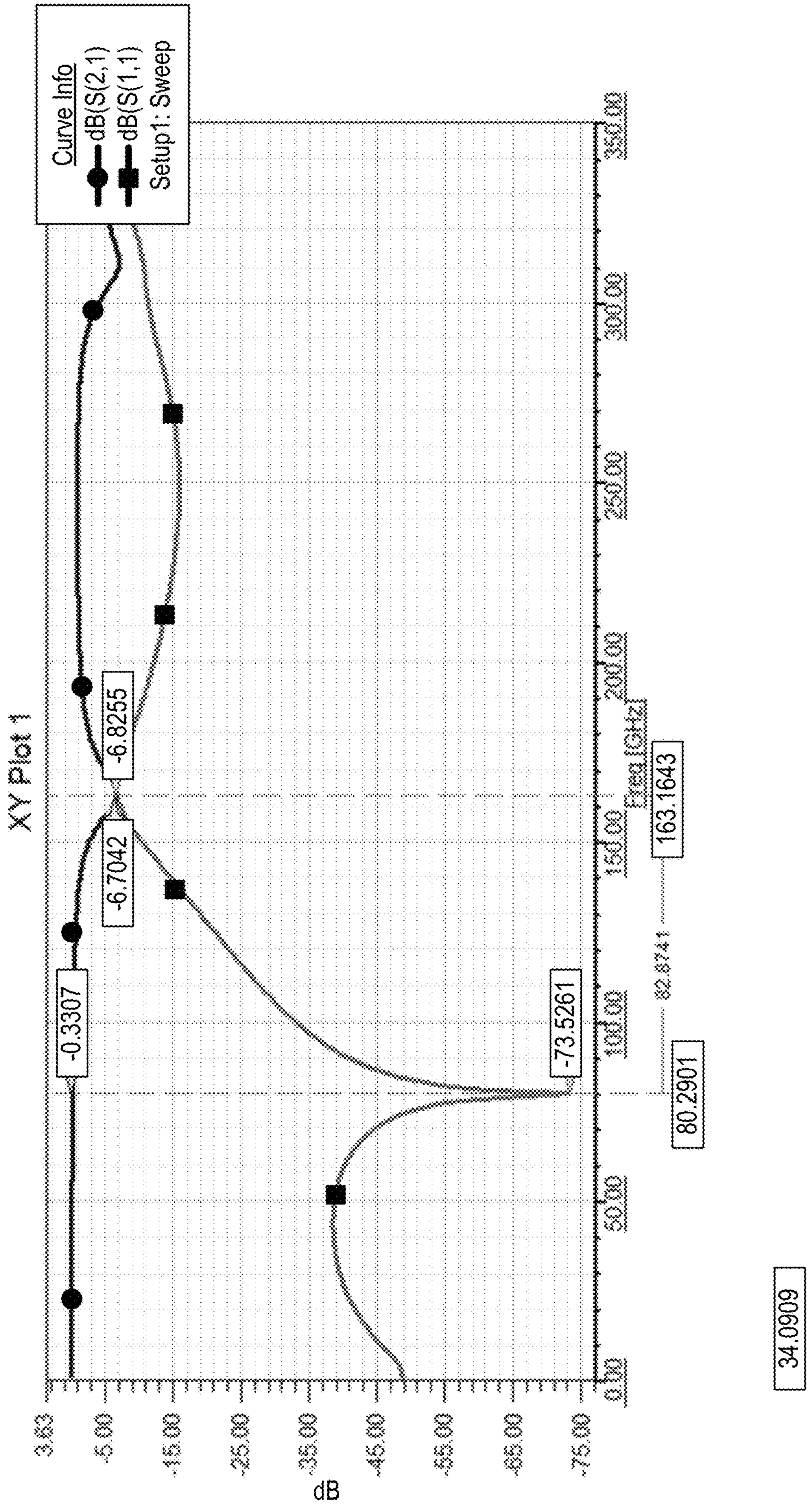
FIG. 43 is a graphical representation of transmission and reflection characteristics over a range of frequencies for an example RF MEMS switch in the ON state, in accordance with an aspect of the disclosure.

FIGS. 42 and 43 further demonstrate the overall response of the RF MEMS switch in each of its ON and OFF states, respectively. In FIG. 42, when the switch is OFF, and thus not passing the transmitted signal between input and output ports, the reflection characteristics are shown to be just slightly less than 0 dB even at frequencies of up to 130 GHz, and the transmission characteristics are between about −20 dB and −15 dB between operating frequencies of about 60 GHz to about 130 GHz. In FIG. 43, when the switch is ON, and thus passing the transmitted signal between input and output ports, the reflection characteristics are as low as about −73.5 dB at 80 GHz with the transmission characteristics as high as −0.33 dB while the reflection and transmission characteristics at 163 GHz are both about −6.75 dB.

The examples of FIGS. 32 through 43 demonstrate the possibility of incorporating metamaterials into a high frequency resistive MEMS switch in order to reduce the effects of stiction. However, it will also be appreciated that the above principles can be similarly applied to capacitive MEMS switches. As with the resistive switch, a sandwich of metal and dielectric layers may be used to achieve the desired permittivity interface, such as having a gold layer with infinite permittivity, a dielectric layer with positive but low permittivity, and a metamaterial layer with a permittivity in the range of about zero or less. Unlike the example switches above, in the capacitive switch, the metamaterial layer may be provided as part of the signal line contact instead of as part of the beam contact.

Figure 44:
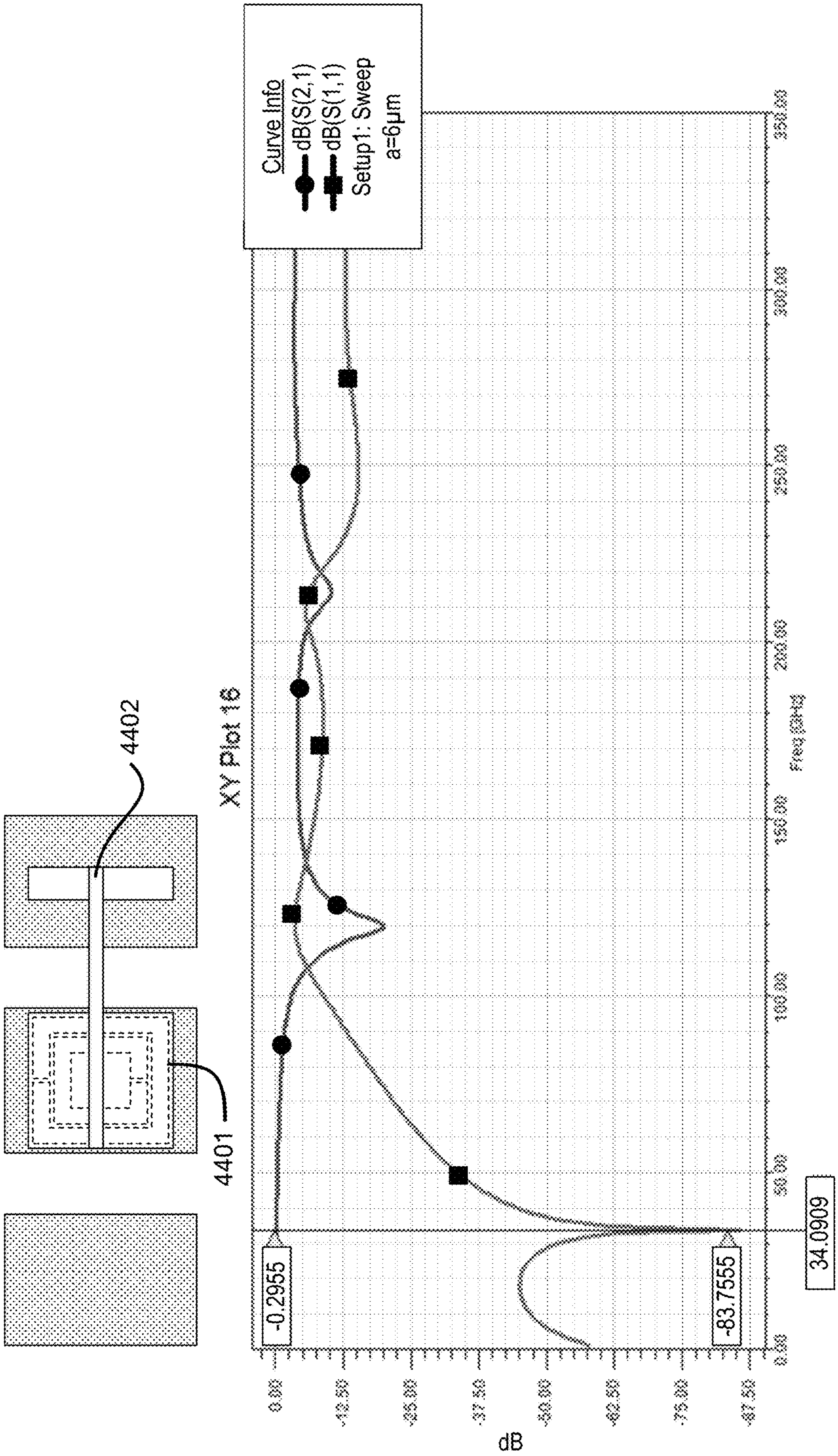
FIGS. 44-46 are graphical representations of transmission and reflection characteristics over a range of frequencies for example RF MEMS capacitive switches having different metamaterial structures in accordance with aspects of the disclosure.
Figure 45:
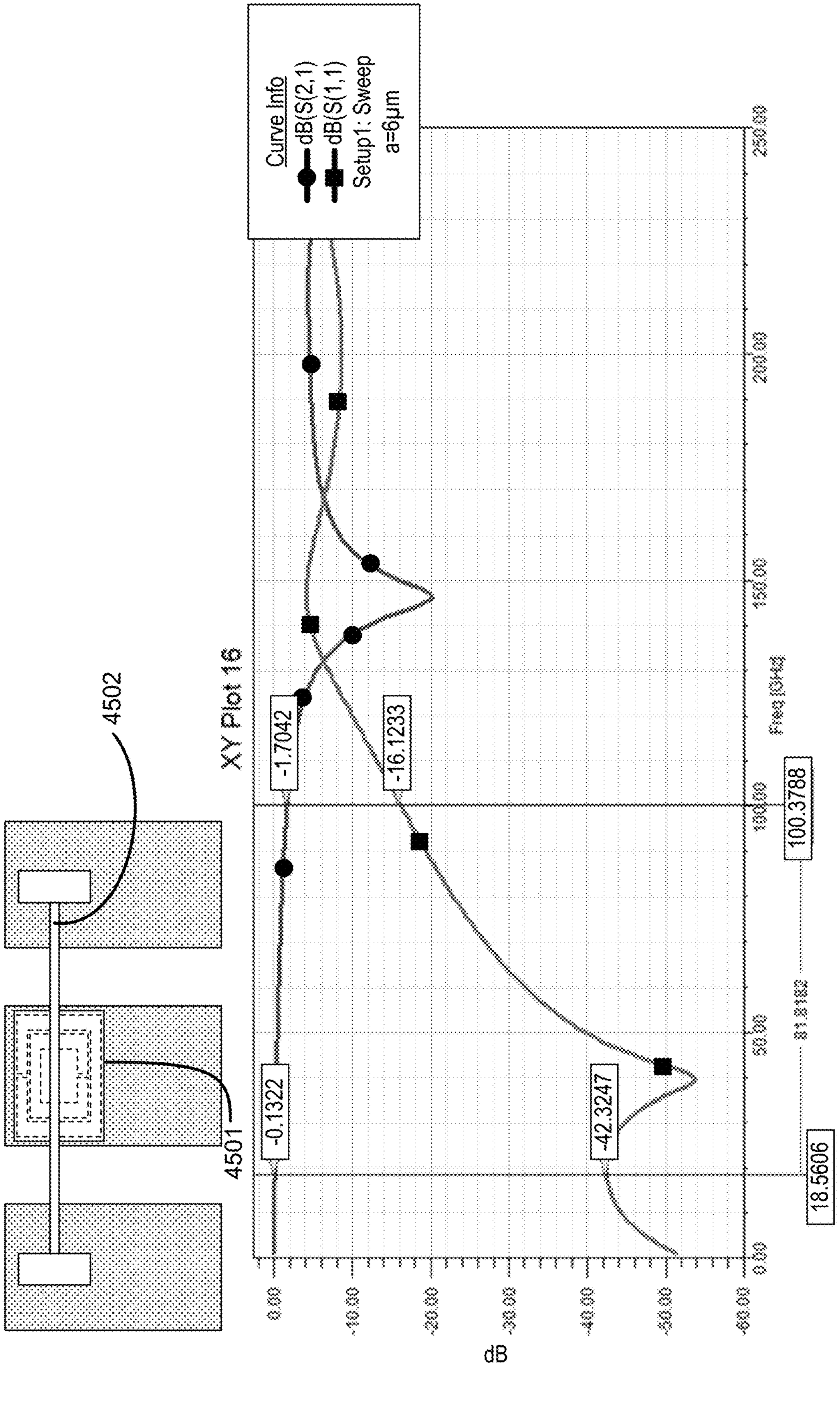
Figure 46:
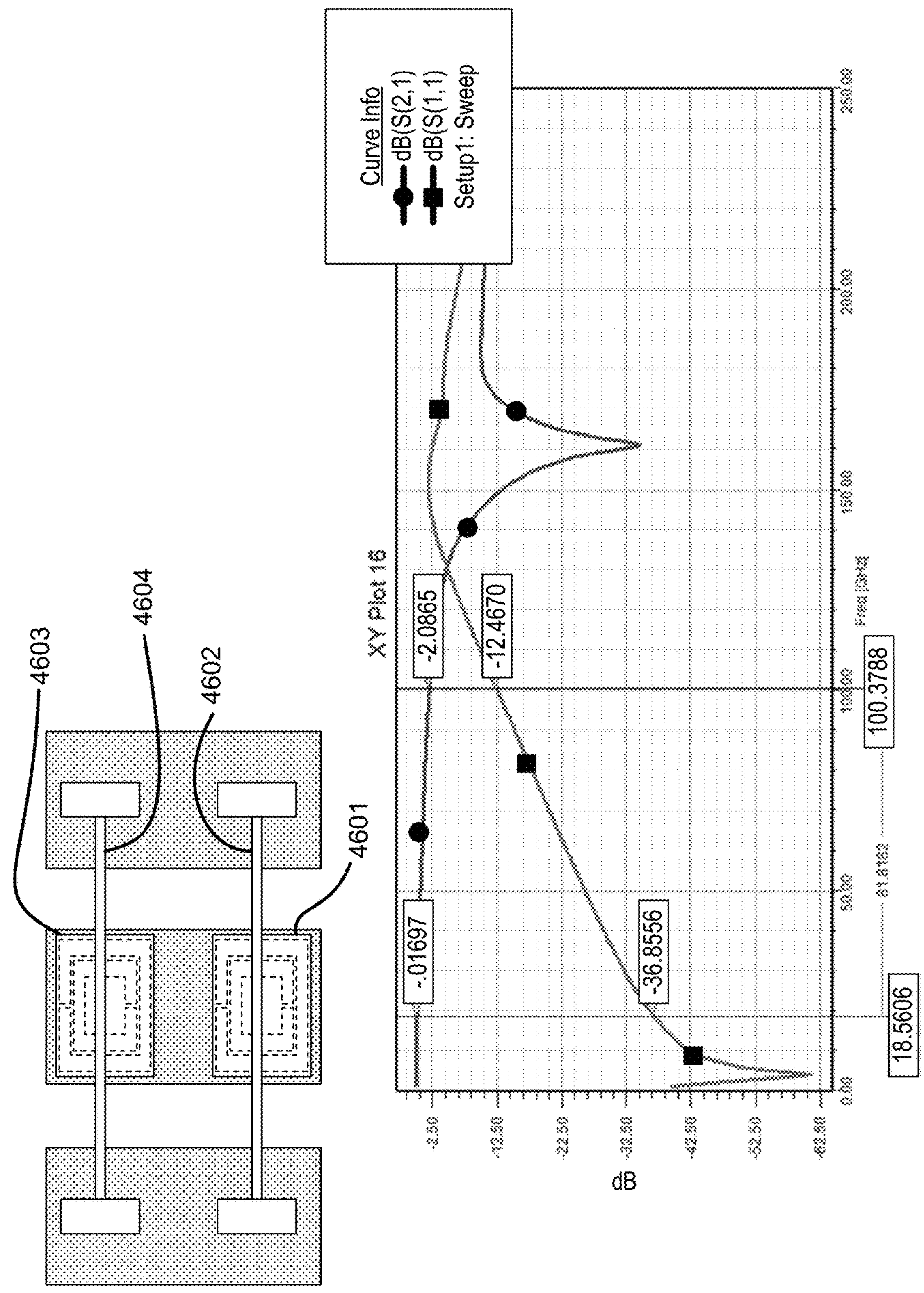

Different unit cell structures may provide different metamaterial characteristics at the relevant band of frequencies for the RF MEMS switch (e.g., between 60 to 130 GHz). Each of FIGS. 44-46 provides simulated test results for transmission and reflection characteristics for a respective unit cell structure. In the particular examples provided herein, the simulated test results were collected using Matlab code, although other programs could be used to run simulations in other cases.

The metamaterial structure 4401 of FIG. 44 is included in a metal layer (e.g., of a signal line contact) and interfaces beam 4402. In this example, the beam is thinner than the metamaterial structure, and is supported by a single support extending from one of the ground planes adjacent the signal line. The unit cell is of transmission type at about 34 GHz (having reflection characteristics of −88.75 dB and transmission characteristics of −0.29 dB). The unit cell is of reflection type at about 120 GHz. Thus, the structure of FIG. 44 is shown to exhibit metamaterial properties.

The metamaterial structure 4501 of FIG. 45 is included in a metal layer (e.g., of a signal line contact) and interfaces beam 4502. In this example, the beam is thinner than the metamaterial structure, and is doubly supported by posts on either side of the signal line. The unit cell is of transmission type at about 40 GHz (having reflection characteristics of −54 dB and transmission characteristics of −0.5 dB). The unit cell is of reflection type at about 140 GHz. Thus, the structure of FIG. 45 is shown to exhibit metamaterial properties.

FIG. 46 includes two metamaterial structures 4601 and 4603 positioned at opposing input and output sides of the signal line. Each metamaterial structure 4601, 4603 is included in a metal layer (e.g., of the signal line contact). Further, a respective doubly-supported beam 4602, 4604 is positioned above each of the metamaterial structures 4601, 4602. As in the example of FIG. 45, the beams are thinner than the metamaterial structures. The unit cell is of transmission type at about 8 GHz (having reflection characteristics of −60 dB and transmission characteristics of −0.01 dB). The unit cell is of reflection type at about 160 GHz. Thus, the structure of FIG. 45 is shown to exhibit metamaterial properties.

Figure 47A:
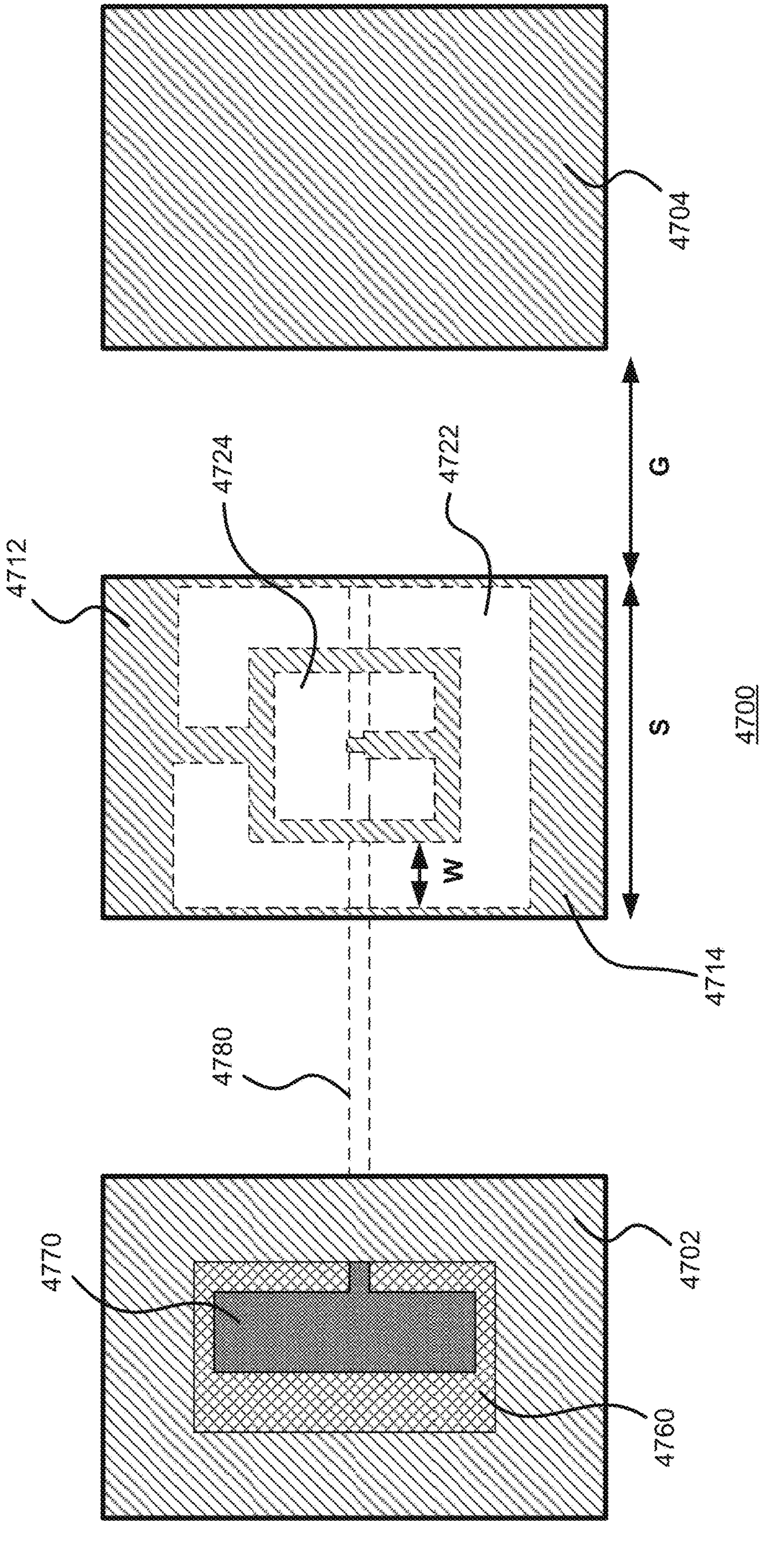
FIG. 47A is a top down view of an example RF MEMS capacitive switch having a metamaterial structure in accordance with an aspect of the disclosure.
Figure 47B:
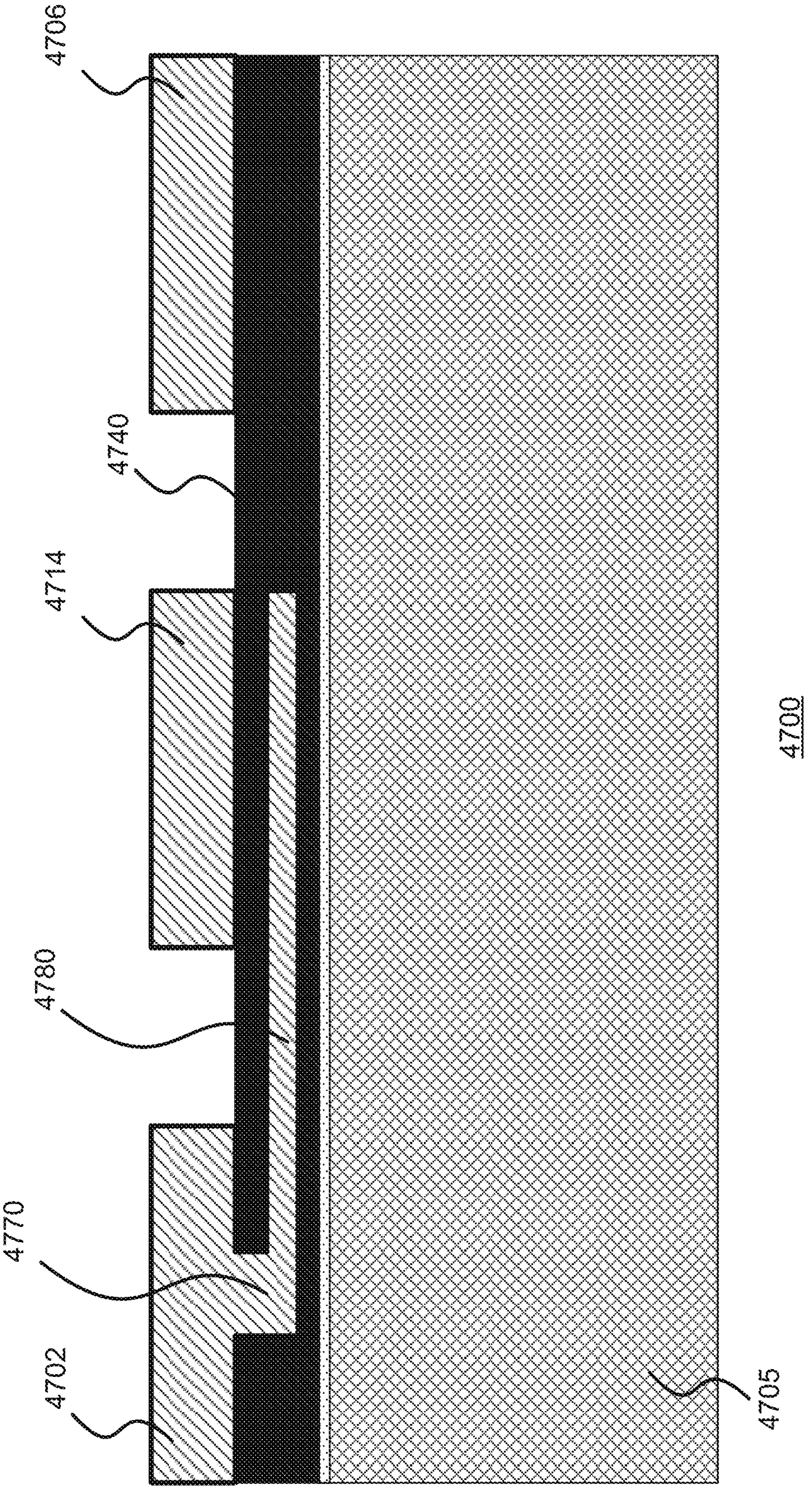
FIG. 47B is a side view of the switch of FIG. 47A.
Figure 47C:
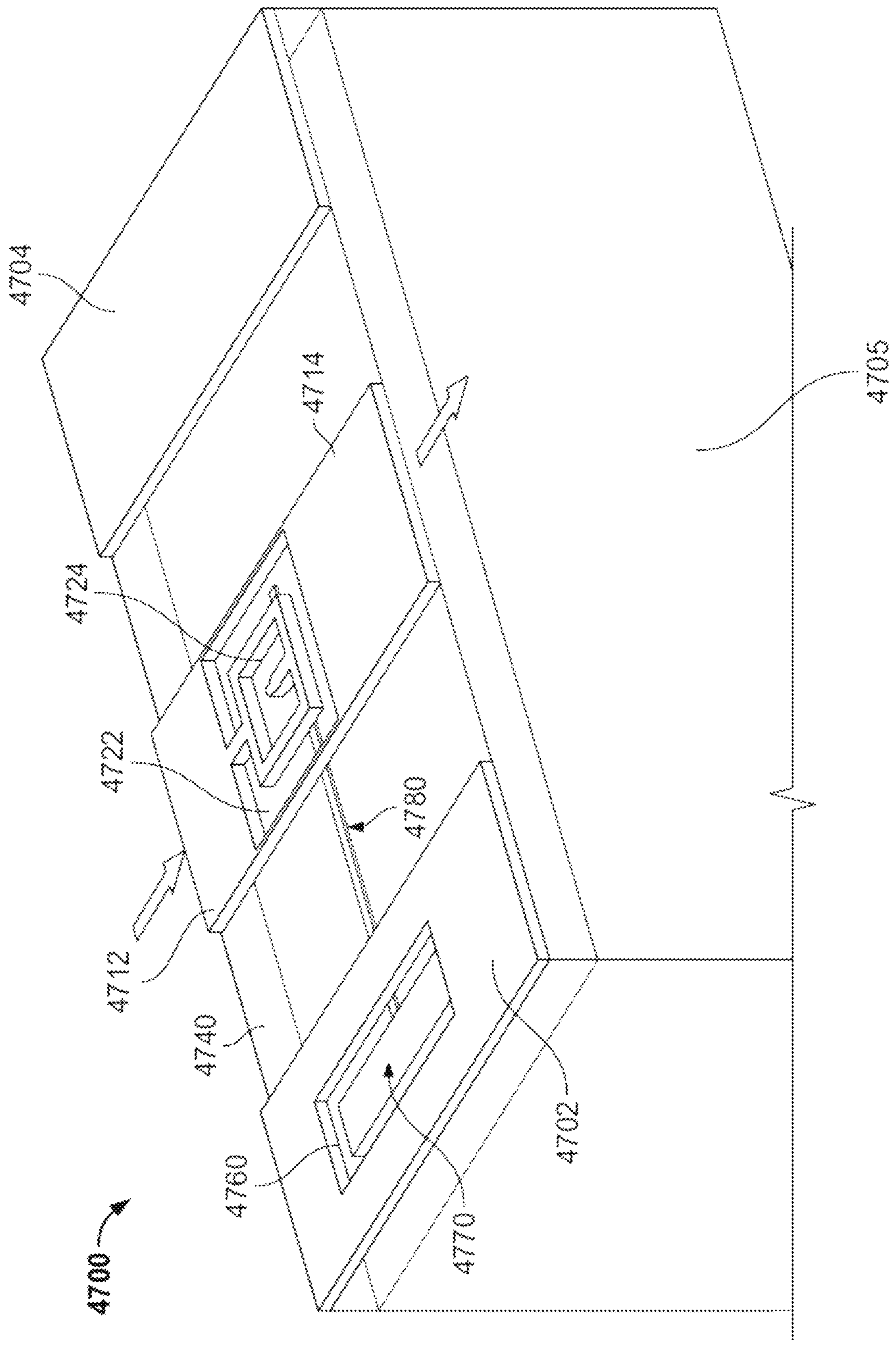
FIG. 47C is a perspective view of the switch of FIG. 47A.

Another example switch 4700 is shown in FIGS. 47A-C. FIG. 47 is a top-down view of the switch. FIG. 47B is a side view of the switch. FIG. 47C is a perspective view of the switch.

The switch includes a structure formed over a signal line having an input side 4712 and an output side 4714. A metamaterial structure having an outer split ring 4722 and inner split ring 4724 is formed in the signal line contact between the input side 4712 and output side 4714, through which a signal is received (arrow in) and an output port through which the signal is transmitted (arrow out).

As with the previously described split ring structures, the structure of FIG. 47A-C has a width W, a split width of G, and the space between the rings has a width S. The signal line has a width L, and the channel separating the signal line from the respective ground planes has a width C.

Each of the ground planes 4702, 4704 and the signal line are formed from a conductive material such as gold, and are formed on top of a dielectric material 4740 such as silicon nitride ($Si_3N_4$), which itself is formed on top of a substrate 4705. One of the ground planes 4702 includes a post 4770 extending downward from the ground plane 4702 into the dielectric material 4740, and a beam 4780 extending from the post 4770 in the direction of the signal line 4714. The edge of the beam 4780 is aligned with the opposing edge of the signal line 4712, 4714, such that the end of beam 4780 is positioned underneath the metamaterial structures 4722, 4724, of the signal line 4712, 4714. In FIGS. 47A and 47C, the post 4770 can be seen through an opening 4760 in the ground plane 4702.

In the example of FIGS. 47A-C, the ground planes and the signal line may each have a width (in the direction of the beam 4780 length) of about 73 μm and the beam may have a length of about 168 μm. The metamaterial structure formed on the signal line contact may have a ring width W of about 15 μm, a split width G of about 8 μm, and a spacing between rings S of about 5 μm.

Figure 48:
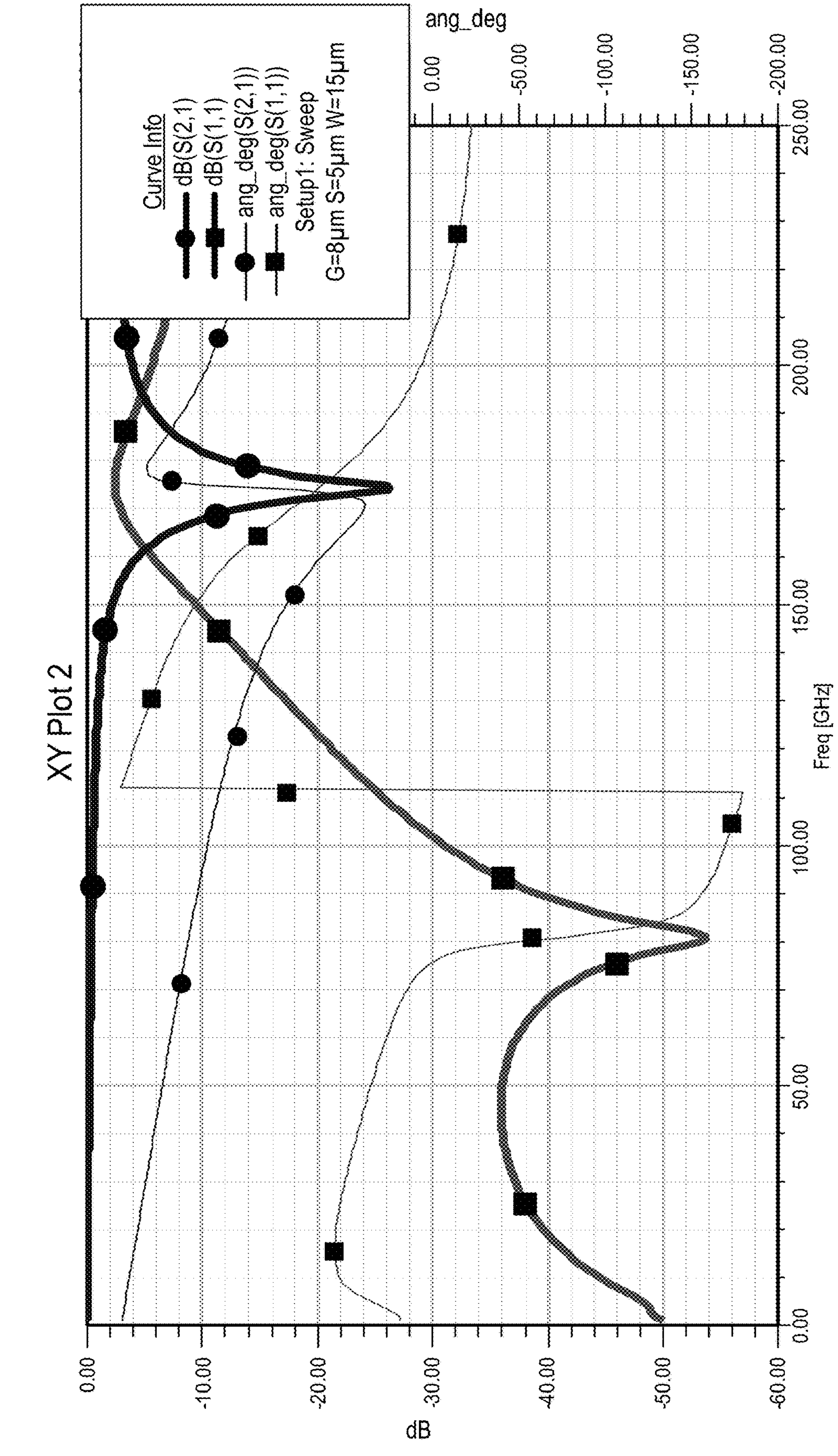
FIG. 48 is a graphical representation of transmission and reflection characteristics over a range of frequencies for the switch of FIGS. 47A-C.

Transmission and reflection characteristics of the switch 4700 over a range of frequencies are shown in FIG. 48. As can be seen from FIG. 48, the metamaterial is most reflective at about 175 GHz and most transmissive at about 80 GHz.

Figure 49:
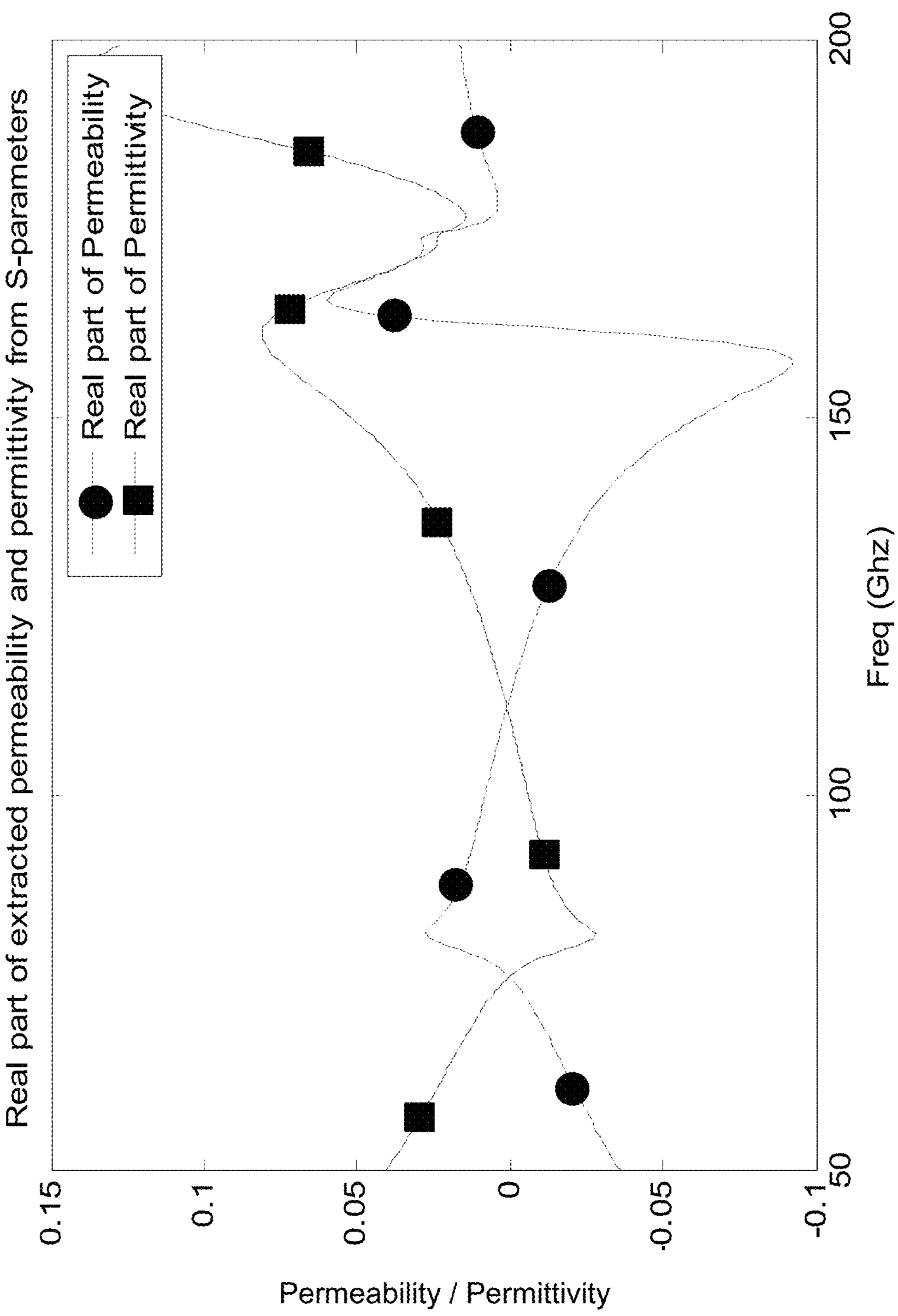
FIG. 49 is a graphical representation of extracted permittivity and permeability parameters over a range of frequencies of the switch of FIGS. 47A-C.

Based on these results, a material parameter extraction can be performed in order to determine the permittivity and permeability of the metamaterial structure. The extraction is shown over a range of frequencies in FIG. 49. As seen in FIG. 49, the metamaterial structure exhibits near zero permittivity and permeability between about 50 GHz and 150 GHz. This indicates that the structure of FIG. 48 is suitable for reducing Casimir forces (or even generating repulsive Casimir forces) in the desired frequency band of the present disclosure.

Figure 50:
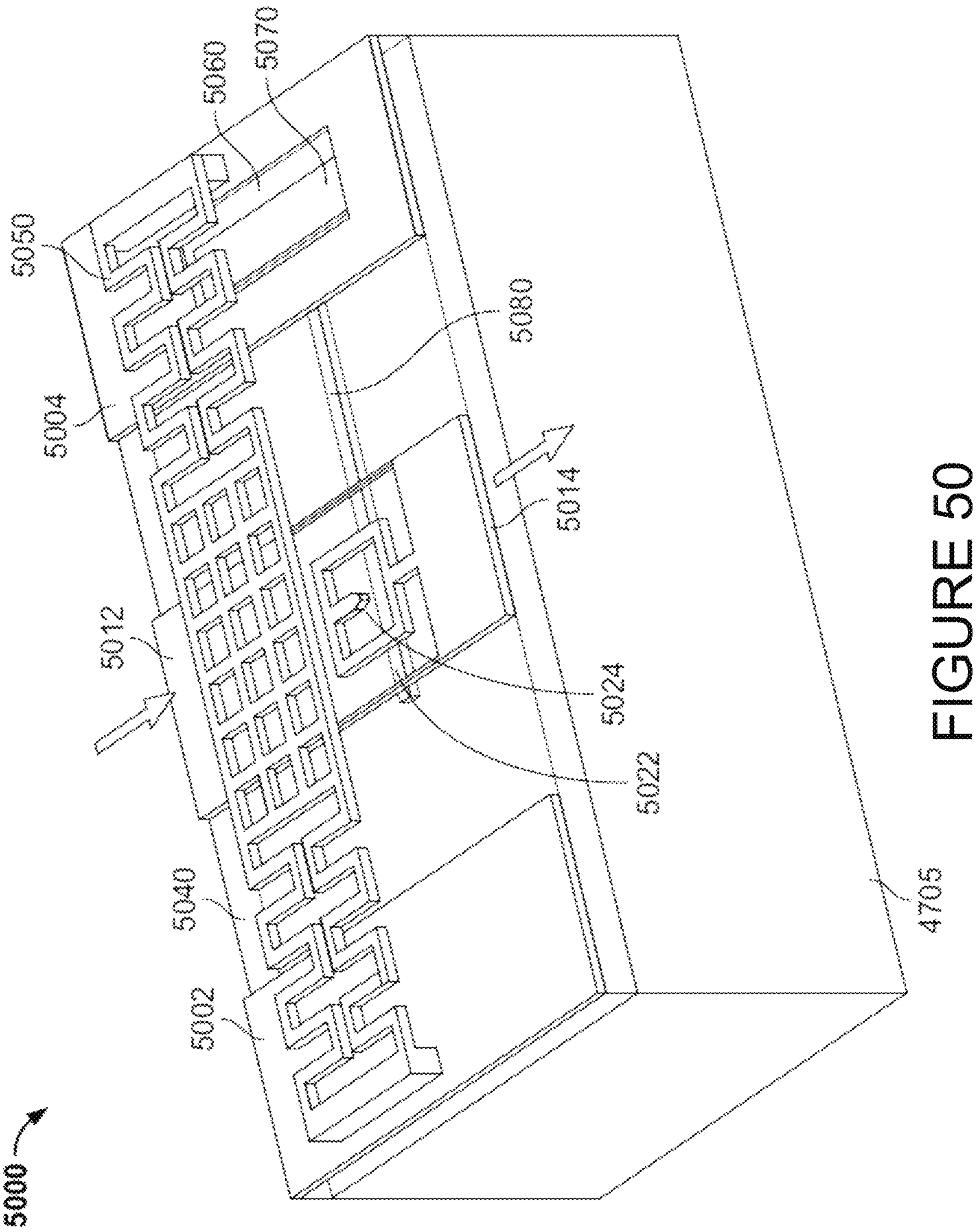
FIG. 50 is a perspective view of an example RF MEMS capacitive switch having a capacitive shunt and a metamaterial structure in accordance with an aspect of the disclosure.

FIG. 50 shows a perspective view of a capacitive shunt RF MEMS switch 5000 utilizing a metamaterial signal line contact in order to reduce stiction in the switch. Much of the features of switch 5000 may be compared to those of switch 4700 in FIGS. 47A-C (ground planes 5002 and 5004 and substrate 5005 compare to planes 4702 and 4704 and substrate 4705; signal line input and outputs 5012 and 5014 compare to 4712 and 4714; split ring metamaterial structure 5022 and 5024 compares to structure 4722 and 4724; dielectric layers 4740 and 5040 are comparable; openings 4760 and 5060 are comparable; posts 4770 and 5070 are comparable; and beams 4780 and 5080 are comparable). The switch 5000 further includes a deflectable beam 5050. The beam 5050 may be comparable to the rectangular beam 510 described in connection with FIG. 5 (e.g., may be made from gold, may have a perforated grid structure, may extend in a serpentine pattern). The deflectable beam 5050 is supported by a pair of posts formed on top of the ground planes 5002 and 5004, respectively, and is configured to deflect downward towards the signal line when actuated by a bias voltage.

In operation, the bias voltage causes a midpoint of the beam 5050 to deflect downward until it comes in contact with the signal line contact, thereby causing the signal line to turn off (or in other cases to turn on). When the bias voltage is removed, the midpoint of the beam 5050 deflects back upward. Because the midpoint of the beam is aligned with the metamaterial structure 5022, 5024 of the signal line contact, the Casimir effect at the interface between the beam and the signal line contact is diminished or even repulsive, thereby reducing the liability of stiction between the beam 5050 and the signal line.

Although not shown in FIG. 50, the signal line contact may further include a later of dielectric material above the metal layer including the metamaterial structure. The dielectric layer may be made of SiN, and may function as an isolation layer in order to achieve the desired permittivity gradient, as discussed above in connection with FIG. 31. Stated another way, the beam 5050 may have an infinite permittivity, the isolation layer may have a positive but smaller permittivity, and the metal layer including the metamaterial structure in the signal line contact may have a near zero, zero or even negative permittivity, thereby satisfying the $\varepsilon_1<\varepsilon_2<\varepsilon_3$ condition (or vice versa).

Figure 51:
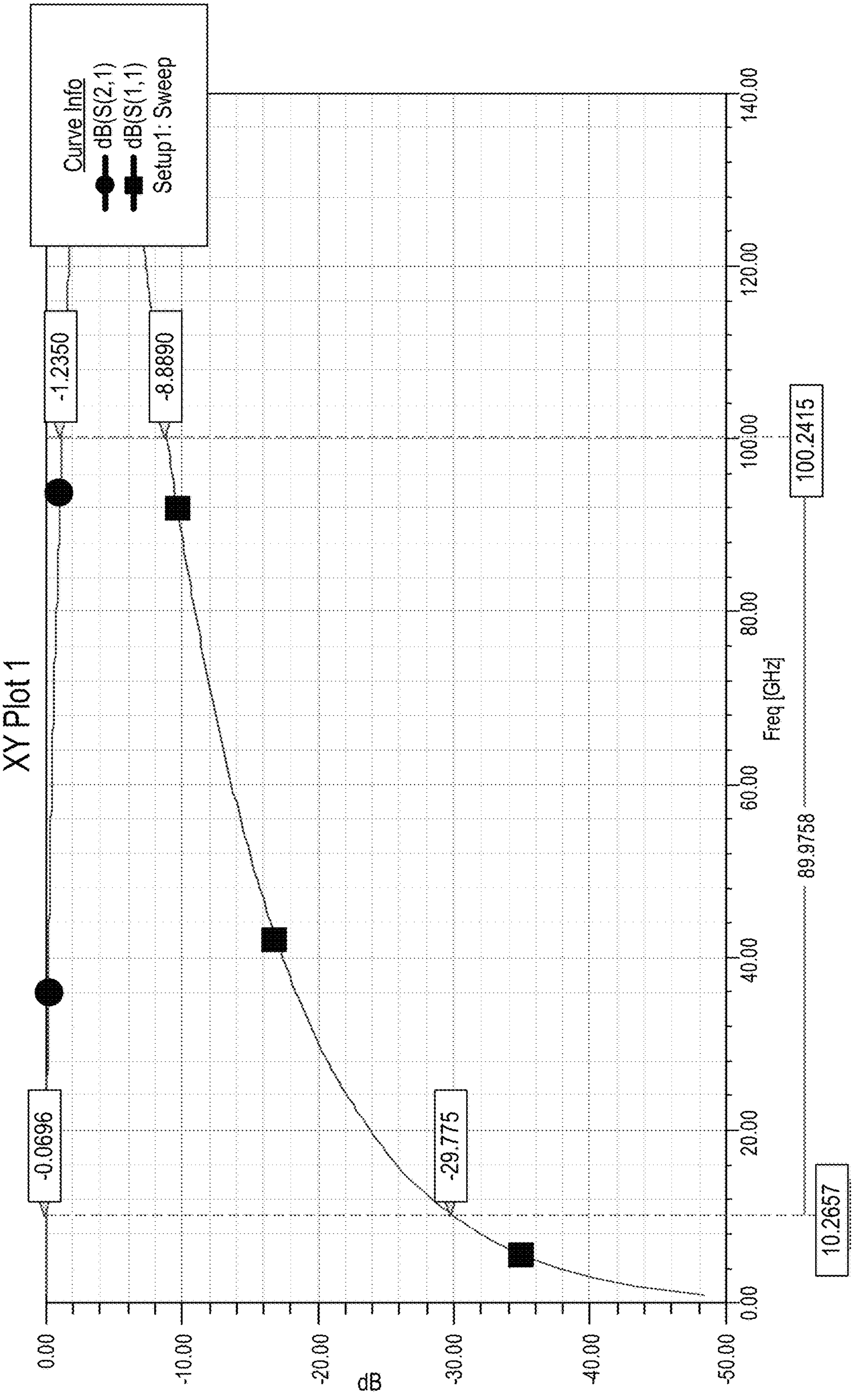
FIG. 51 is a graphical representation of transmission and reflection characteristics over a range of frequencies for the switch of FIG. 50 in a transmission (ON) state.
Figure 52:
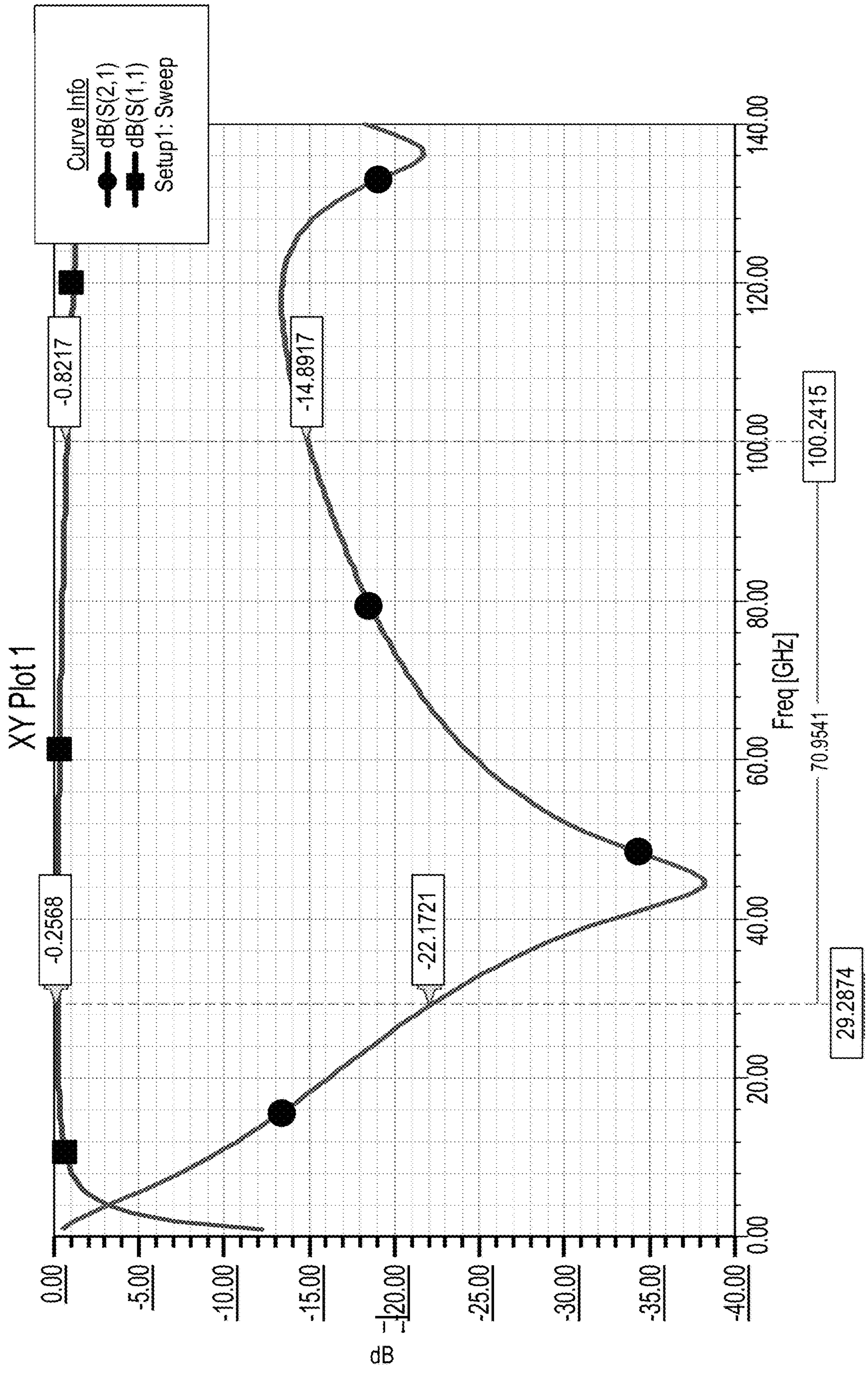
FIG. 52 is a graphical representation of transmission and reflection characteristics over a range of frequencies for the switch of FIG. 50 in a reflection (OFF) state.

Performance of the switch 500 is shown in FIGS. 51 and 52, which are plots of both reflection and transmission characteristics of the switch across a range of high RF frequencies. FIG. 51 demonstrates operation of the switch in the ON state (transmitting signals) and FIG. 52 demonstrates operation of the switch in the OFF state (cutting off transmission of signals)

In FIG. 51, most notably, at 10.3 GHz, return loss is as high as −29.8 dB while insertion loss is as low as about −0.07 dB. Even at 100.2 GHz, return loss is as high as −8.9 dB while insertion loss is only about −1.23 dB. This demonstrates good operation of the switch in the ON state across a wide range of high frequencies, from 10 GHz to 100 GHz.

In FIG. 52, the switch is off, thus changing to being reflective instead of transmissive. At 29.3 GHz, insertion loss is as high as about −22.2 dB while return loss is as low as about −0.26 dB. Even at 100.2 GHz, insertion loss is as high as −14.9 dB while return loss is only about −0.82 dB. This demonstrates good operation of the switch in its OFF state across nearly the same wide range of high frequencies, from about 20 GHz to 100 GHz.

Altogether, good insertion loss and return loss characteristics of the RF MEMS Switch in the ON and OFF states are achieved over 30-100 GHz frequency band. This makes the presently described switch a good candidate for high frequency switching operations over a wide bandwidth of frequencies. Accordingly, the switches described in the present disclosure can improve operation and performance of applications requiring high frequencies (e.g., 10 GHz or greater) over a wide bandwidth. Such technologies may include, but are not limited to, 5G communications, switching networks, phase shifters (e.g., in electronically scanned phase array antennas) and Internet of Things (IoT) applications.

In the present disclosure, the metamaterial structures described are split rings. However, those skilled in the art should recognize that other metamaterial structures may be used, provided that those structures provide similar permittivity and permeability characteristics within the desired range of frequencies. For instance, a topology inspired Möbius transformation MTM (metamaterial) structures (meaning a structure that forms a continuous closed path that maps onto itself, or stated another way, the structure may have a topology in which a closed path extends two or more revolutions around an axis (e.g., at or close to the center of the structure) before the closed path is completed) may be considered advantageous for generating repulsive Casimir forces.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectromechanical switch comprising:

a signal line comprising each of an input port and an output port, the signal line formed on a substrate between a first ground plane and a second ground plane formed on the substrate;

a primary deflectable beam having a first end, a second end, and a deflectable middle portion between the first and second ends, the first end supported by a first post formed over the first ground plane, the second end supported by a second post formed over the second ground plane, and the middle portion of the primary deflectable beam positioned over at least a portion of the input port and at least a portion of the output port, whereby the deflectable middle portion contacts each of the input port and output port when deflected downward;

one or more defected ground structures formed in each of the first ground plane and the second ground plane; and for each defected ground structure, a corresponding secondary deflectable beam positioned over the defected ground structure.

2. The microelectromechanical switch of claim 1, further comprising:

a first actuator coupled to the primary deflectable beam and configured to apply a first bias voltage to the primary deflectable beam, whereby the first bias voltage causes the primary deflectable beam to deflect downward toward the signal line; and a second actuator coupled to each of the one or more secondary deflectable beams and configured to apply a second bias voltage to each of the secondary deflectable beams, whereby the second bias voltage causes each secondary deflectable beam to deflect downward toward its corresponding defected ground structure.

3. The microelectromechanical switch of claim 1, wherein each of defected ground structures includes a plurality of slots etched into the ground plane and forming a spiral.

4. The microelectromechanical switch of claim 1, wherein each ground plane includes a first defected ground structure and a second defected ground structure, wherein the length and width of the second defected ground structure are shorter than the length and width of the first defected ground structure.

5. The microelectromechanical switch of claim 1, wherein the input and output ports are formed along a first axis of the switch, the primary deflectable beam extends from the first post to the second post along a second axis perpendicular to the first axis, and the secondary deflectable beams extend in a direction parallel to the first axis.

6. The microelectromechanical switch of claim 1, wherein each of the secondary deflectable beams has a first end supported by a first secondary post and a second end supported by a second secondary post, whereby a bottom surface of each secondary deflectable beam is suspended over the ground plane and corresponding defected ground structure by its first and second secondary posts.

7. The microelectromechanical switch of claim 6, wherein an upper surface of the primary deflectable beam is less than 4 microns higher than the surface of the signal line, and wherein an upper surface of each secondary deflectable beam is less than 2.5 microns higher than the surface of the ground plane.

8. The microelectromechanical switch of claim 1, wherein the middle portion of the primary deflectable beam comprises a plurality of perforations forming a lattice structure, the perforations tending to increase the flexibility of primary deflectable beam, and wherein each corner of the middle portion extends outward toward the first or second end in a serpentine pattern, the extended corners of one side of the middle portion meeting at the first end, and the extended corners of the other side of the of the middle portion meeting at the second end.

9. The microelectromechanical switch of claim 8, wherein the primary deflectable beam is less than 150 μm long and is sufficiently flexible to deflect 1 μm or more downward in response to application of a bias voltage of 17 volts or less.

10. The microelectromechanical switch of claim 1, wherein the each secondary deflectable beam comprises a plurality of perforations forming a lattice structure, the perforations tending to increase the flexibility of secondary deflectable beam.

11. The microelectromechanical switch of claim 1, wherein the switch achieves insertion loss of less than −2 dB and isolation of greater than −20 dB between 75 GHz and 130 GHz.

12. The microelectromechanical switch of claim 11, wherein actuation of the primary deflectable beam and non-actuation of the secondary deflectable beams results in isolation between the input and output ports of about −24 dB or better between 75 GHz and 130 GHz, and wherein actuation of the secondary deflectable beams and non-actuation of the primary deflectable beam results in insertion loss of −1.5 dB or better between 75 GHz and 130 GHz.

13. A microelectromechanical switch comprising:

a signal line comprising each of an input port and an output port, the signal line formed on a substrate between a first ground plane and a second ground plane formed on the substrate;

a beam positioned above the signal line, whereby the beam is configured to move in an out-of plane direction relative to the signal line and ground planes, the beam including an upper contact configured to contact the signal line; and a metamaterial structure included in one of the upper contact and the signal line.

14. The microelectromechanical switch of claim 13, wherein the metamaterial structure comprises concentric split rings.

15. The microelectromechanical switch of claim 13, wherein the metamaterial structure has an effective permittivity of 0.05 or less over a bandwidth of at least 50 GHz.

16. The microelectromechanical switch of claim 13, wherein the metamaterial structure exhibits each of a primarily-reflective property and a primarily-transmissive property within a bandwidth of less than 100 GHz.

17. The microelectromechanical switch of claim 13, wherein the switch is a resistive switch, and wherein the metamaterial structure is included in the upper contact.

18. The microelectromechanical switch of claim 17, wherein an upper surface of the input and output ports of the signal line is conductive, and wherein the beam comprises a bottom conductive layer configured to contact each of the input and output ports when the beam is actuated, wherein the metamaterial structure is embedded in the bottom conductive layer.

19. The microelectromechanical switch of claim 18, wherein the beam further comprises a dielectric layer formed above the bottom conductive layer, and a top conductive layer formed above the dielectric layer, wherein the bottom conductive layer has a permittivity less than that of the dielectric layer, and wherein the top conductive layer has a permittivity greater than that of the dielectric layer.

20. The microelectromechanical switch of claim 19, wherein each of the top and bottom conductive layers is made of gold, and wherein the dielectric layer is made of one of silicon nitride or silicon mononitride.

21. The microelectromechanical switch of claim 20, further comprising a second metamaterial structure embedded in the top conductive layer.

22. The microelectromechanical switch of claim 19, further comprising a top dielectric layer over the top conductive layer, the top dielectric layer having a common composition as the dielectric layer between the top and bottom conductive layers.

23. The microelectromechanical switch of claim 22, wherein each of the top dielectric layer, the top conductive layer, and the dielectric layer has a length equal to a length of the beam, and wherein the bottom conductive layer has a length equal to a width of the signal line.

24. The microelectromechanical switch of claim 16, wherein the switch has an isolation of greater than about −15 dB between 80 GHz and 100 GHz when the switch is off, and an insertion loss of less than about −1 dB between 80 GHz and 100 GHz when the switch is on.

25. The microelectromechanical switch of claim 13, wherein the switch is a capacitive shunt switch, and wherein the metamaterial structure is included in the signal line.

26. The microelectromechanical switch of claim 25, further comprising a deflectable beam having a first end, a second end, and a deflectable middle portion between the first and second ends, the first end supported by a first post formed over the first ground plane, the second end supported by a second post formed over the second ground plane, and the middle portion of the deflectable beam positioned over the metamaterial structure in the signal line, whereby the deflectable middle portion contacts the signal line when deflected downward.

27. The microelectromechanical switch of claim 26, further comprising a conductive strip extending from the first ground plane towards the signal line, wherein the conductive strip extends to the opposing end of the signal line such that it is positioned at least partially on top of the metamaterial structure.

28. The microelectromechanical switch of claim 27, wherein the first conductive strip extends from the first ground plane to the second ground plane.

29. The microelectromechanical switch of claim 26, wherein the signal line includes a first metamaterial structure adjacent to the input port and a second metamaterial structure adjacent to the output port, the switch further comprising:

a first conductive strip extending from the first ground plane towards the second ground plane and positioned at least partially on top of the first metamaterial structure; and a second conductive strip extending from the first ground plane towards the second ground plane and positioned at least partially on top of the second metamaterial structure.

30. The microelectromechanical switch of claim 26, further comprising:

a bottom dielectric layer formed on the substrate, wherein each of the ground planes and signal line are formed on the bottom dielectric layer;

a conductive post extending downward from one of the ground planes into the bottom dielectric layer; and a conductive beam extending outward from the conductive post towards the signal line, wherein the conductive beam extends to the opposing end of the signal line such that it is positioned at least partially underneath the metamaterial structure.

31. The microelectromechanical switch of claim 30, wherein the switch has an isolation of greater than about −15 dB between 30 GHz and 100 GHz when the switch is off, and an insertion loss of less than about −1 dB between 30 GHz and 100 GHz when the switch is on.

32. The microelectromechanical switch of claim 13, wherein the metamaterial structure generates a repulsive Casimir force for separating the beam and signal line.

* * * * *